US012579935B2

(12) United States Patent
Zhao et al.

(10) Patent No.:   US 12,579,935 B2
(45) Date of Patent:       Mar. 17, 2026

(54) PIXEL CIRCUIT HAVING A NODE CONTROL SUB-CIRCUIT, DRIVING METHOD THEREFOR, DISPLAY SUBSTRATE, AND DISPLAY APPARATUS

(71) Applicants:Chengdu BOE Optoelectronics Technology Co., Ltd., Chengdu (CN); BOE Technology Group Co., Ltd., Beijing (CN)

(72) Inventors: Pan Zhao, Beijing (CN); Haigang Qing, Beijing (CN); Ziyang Yu, Beijing (CN); Zhiliang Jiang, Beijing (CN); Miao Wang, Beijing (CN); Ming Hu, Beijing (CN); Tiaomei Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/691,051

(22) PCT Filed: Sep. 29, 2022

(86) PCT No.: PCT/CN2022/122558
§ 371 (c)(1),
(2) Date: Mar. 12, 2024

(87) PCT Pub. No.: WO2024/065388
PCT Pub. Date: Apr. 4, 2024

(65) Prior Publication Data
US 2025/0148975 A1      May 8, 2025

(51) Int. Cl.
*G09G 3/3266*          (2016.01)
*G09G 3/3233*          (2016.01)
(Continued)

(52) U.S. Cl.
CPC ......... *G09G 3/3233* (2013.01); *G09G 3/3266* (2013.01); *G09G 3/035* (2020.08);
(Continued)

(58) Field of Classification Search
CPC .... G09G 3/3233; G09G 3/3266; G09G 3/035; G09G 3/2074; G09G 2300/0408;
(Continued)

(56) References Cited

U.S. PATENT DOCUMENTS 8,587,578 B2    11/2013   Choi
2007/0200814 A1    8/2007   Kwon
(Continued)

FOREIGN PATENT DOCUMENTS

CN            101021659 A      8/2007
CN            103280183 A      9/2013
(Continued)

OTHER PUBLICATIONS

International Search Report for PCT/CN2022/122558 Mailed Jun. 10, 2023.

*Primary Examiner* — Adam J Snyder
(74) *Attorney, Agent, or Firm* — Ling Wu; Stephen Yang; Ling and Yang Intellectual Property

(57) ABSTRACT

A pixel circuit, a driving method therefor, a display substrate and a display apparatus, the pixel circuit includes a node control sub-circuit, a storage sub-circuit, a driving sub-circuit and a light emitting control sub-circuit; the storage sub-circuit is electrically connected to a second node and a first power supply line respectively, and is configured to charge the second node when a first scanning signal line is an effective level signal.

20 Claims, 18 Drawing Sheets

(51) Int. Cl.

| | |
|---|---|
| *G09G 3/00* | (2006.01) |
| *G09G 3/20* | (2006.01) |
| *G09G 3/32* | (2016.01) |
| *G09G 3/34* | (2006.01) |
| *H10K 59/131* | (2023.01) |

(52) U.S. Cl.
CPC ............. *G09G 3/2074* (2013.01); *G09G 3/32* (2013.01); *G09G 3/34* (2013.01); *G09G 2300/0408* (2013.01); *G09G 2300/0426* (2013.01); *G09G 2300/0452* (2013.01); *G09G 2300/0819* (2013.01); *G09G 2300/0852* (2013.01); *G09G 2300/0861* (2013.01); *G09G 2310/0251* (2013.01); *G09G 2310/0286* (2013.01); *G09G 2320/0209* (2013.01); *G09G 2320/0233* (2013.01); *G09G 2320/0252* (2013.01); *G09G 2330/023* (2013.01); *G09G 2340/0435* (2013.01); *H10K 59/131* (2023.02)

(58) Field of Classification Search
CPC ... G09G 2300/0426; G09G 2300/0452; G09G 2300/0819; G09G 2300/0852; G09G 2300/0861; G09G 2310/0251; G09G 2310/0286; G09G 2320/0209; G09G 2320/0233; G09G 2320/0252; G09G 2330/023; G09G 2340/0435; G09G 3/32; G09G 3/34; H10K 59/131
See application file for complete search history.

(56) References Cited

U.S. PATENT DOCUMENTS

| | | | | |
|---|---|---|---|---|
| 2009/0201231 A1* | 8/2009 | Takahara | ............. | G09G 3/3233 |
| | | | | 345/76 |
| 2017/0077207 A1* | 3/2017 | Kim | ...................... | G09G 3/3233 |
| 2019/0088200 A1* | 3/2019 | Woo | ...................... | G09G 3/3266 |
| 2021/0398482 A1* | 12/2021 | Wang | ................... | G09G 3/3233 |
| 2023/0222974 A1* | 7/2023 | Qiu | ....................... | G09G 3/3233 |
| | | | | 345/204 |
| 2023/0274690 A1* | 8/2023 | Jeong | ....................... | G09G 3/32 |
| | | | | 345/204 |

FOREIGN PATENT DOCUMENTS

| | | | | | |
|---|---|---|---|---|---|
| CN | 106981269 A | | 7/2017 | | |
| CN | 111933678 A | | 11/2020 | | |
| CN | 112086071 A | * | 12/2020 | .......... | G09G 3/3233 |
| CN | 112908267 A | | 6/2021 | | |
| CN | 112987420 A | | 6/2021 | | |
| CN | 113192460 A | | 7/2021 | | |
| CN | 113436583 A | * | 9/2021 | | |

* cited by examiner

PIXEL CIRCUIT HAVING A NODE CONTROL SUB-CIRCUIT, DRIVING METHOD THEREFOR, DISPLAY SUBSTRATE, AND DISPLAY APPARATUS

CROSS-REFERENCE TO RELATED APPLICATION

The present application is a U.S. National Phase Entry of International Application PCT/CN2022/122558 having an international filing date of Sep. 29, 2022, and entitled "Pixel Circuit, Driving Method Therefor, Display Substrate, and Display Apparatus", the contents of which are hereby incorporated herein by reference in their entireties.

TECHNICAL FIELD

The present disclosure relates to but is not limited to the field of display technologies, in particular to a pixel circuit and a method for driving the pixel circuit, a display substrate and a display apparatus.

BACKGROUND

An Organic Light Emitting Diode (OLED for short) and a Quantum dot Light Emitting Diode (QLED for short) are active light emitting display devices and have advantages such as self-luminescence, wide viewing angle, high contrast ratio, low power consumption, very high response speed, lightness and thinness, flexibility, and low cost. With constant development of display technologies, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described in the present disclosure in detail. The summary is not intended to limit the scope of protection of the claims.

In a first aspect, the present disclosure provides a pixel circuit configured to drive a light emitting device to emit light, including: a node control sub-circuit, a storage sub-circuit, a driving sub-circuit, and a light emitting control sub-circuit;

the node control sub-circuit is electrically connected to a first node, a second node, a third node, a fourth node, a first scanning signal line, a second scanning signal line, a first initial signal line, a second initial signal line, a reset signal line, a data signal line and a first power supply line respectively, and is configured to provide a signal of the first initial signal line or the third node to the first node, provide a signal of the second initial signal line to the fourth node and provide a signal of the data signal line to the second node under control of the reset signal line, the first scanning signal line and the second scanning signal line;

the storage sub-circuit is electrically connected to the second node and the first power supply line respectively, and is configured to charge the second node when the first scanning signal line is an effective level signal;

the driving sub-circuit is connected to the first node, the second node, and the third node respectively, and is configured to provide a drive current to the third node under control of the first node and the second node;

the light emitting control sub-circuit is electrically connected to a light emitting signal line, the first power supply line, the second node, the third node, and the fourth node respectively, and is configured to provide a signal of the first power supply line to the second node and provide a signal of the third node to the fourth node under control of the light emitting signal line; and a first electrode of the light emitting device is connected to the fourth node, and a second electrode of the light emitting device is connected to a second power supply line.

In an exemplary implementation mode, a time period in which a signal of the reset signal line is an effective level signal includes a first time period and a second time period, and the first time period occurs before the second time period; a time period in which a signal of the first scanning signal line is an effective level signal includes a third time period and a fourth time period, and the third time period occurs before the fourth time period; a time period in which a signal of the second scanning signal line is an effective level signal includes a fifth time period and a sixth time period, the fifth time period occurs before the sixth time period, the second time period and the third time period at least partially overlap, and the fourth time period and the fifth time period at least partially overlap; and when the signals of the reset signal line, the first scanning signal line and the second scanning signal line are effective level signals, a signal of the light emitting signal line is an ineffective level signal, and when the signal of the light emitting signal line is an effective level signals, the signals of the reset signal line, the first scanning signal line and the second scanning signal line are ineffective level signals.

In an exemplary implementation mode, the node control sub-circuit includes: a reset sub-circuit, a write sub-circuit and a compensation sub-circuit, and an energy storage sub-circuit;

the reset sub-circuit is electrically connected to the reset signal line, the first initial signal line, the second initial signal line, the first node and the fourth node, respectively, and is configured to provide the signal of the first initial signal line to the first node and provide the signal of the second initial signal line to the fourth node under the control of the reset signal line;

the write sub-circuit is electrically connected to the first scanning signal line, the data signal line, and the second node, respectively, and is configured to provide the signal of the data signal line to the second node under control of the first scanning signal line;

the compensation sub-circuit is electrically connected to the second scanning signal line, the first node and the third node, respectively, and is configured to provide the signal of the third node to the first node under control of the second scanning signal line; and the energy storage sub-circuit is electrically connected to the first node and the first power supply line respectively, and is configured to store a voltage difference of a signal between the first node and the first power supply line.

In an exemplary implementation mode, the reset sub-circuit is further connected to the first scanning signal line and is configured to provide the signal of the first initial signal line to the first node and provide the signal of the second initial signal line to the fourth node under control of the reset signal line and the first scanning signal line.

In an exemplary implementation mode, the reset sub-circuit includes a first transistor and a seventh transistor, the write sub-circuit includes a fourth transistor, the compensation sub-circuit includes: a second transistor, and the energy storage sub-circuit includes: a first capacitor;

a control electrode of the first transistor is electrically connected to the reset signal line, a first electrode of the first transistor is electrically connected to the first initial signal line, and a second electrode of the first transistor is electrically connected to the first node;

a control electrode of the second transistor is electrically connected to the second scanning signal line, a first electrode of the second transistor is electrically connected to the first node, and a second electrode of the second transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the seventh transistor is electrically connected to the reset signal line, a first electrode of the seventh transistor is electrically connected to the second initial signal line, and a second electrode of the seventh transistor is electrically connected to the fourth node; and one end of the first capacitor is electrically connected to the first power supply line, and the other end of the first capacitor is electrically connected to the first node.

In an exemplary implementation mode, the reset sub-circuit includes a first transistor, a seventh transistor, and an eighth transistor, the write sub-circuit includes a fourth transistor, the compensation sub-circuit includes: a second transistor, and the energy storage sub-circuit includes: a first capacitor;

a control electrode of the first transistor is electrically connected to the reset signal line, a first electrode of the first transistor is electrically connected to the first initial signal line, and a second electrode of the first transistor is electrically connected to a first electrode of the eighth transistor;

a control electrode of the second transistor is electrically connected to the second scanning signal line, a first electrode of the second transistor is electrically connected to the first node, and a second electrode of the second transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the seventh transistor is electrically connected to the reset signal line, a first electrode of the seventh transistor is electrically connected to the second initial signal line, and a second electrode of the seventh transistor is electrically connected to the fourth node;

a control electrode of the eighth transistor is electrically connected to the first scanning signal line, and a second electrode of the eighth transistor is electrically connected to the first node; and one end of the first capacitor is electrically connected to the first node, and the other end of the first capacitor is electrically connected to the first power supply line.

In an exemplary implementation mode, the storage sub-circuit includes: a second capacitor;

one end of the second capacitor is electrically connected to the first power supply line, and the other end of the second capacitor is electrically connected to the second node.

In an exemplary implementation mode, the node control sub-circuit includes: a first transistor, a second transistor, a fourth transistor, a seventh transistor, and a first capacitor, and the storage sub-circuit includes: a second capacitor; the driving sub-circuit includes a third transistor, and the light emitting control sub-circuit includes a fifth transistor and a sixth transistor;

a control electrode of the first transistor is electrically connected to the reset signal line, a first electrode of the first transistor is electrically connected to the first initial signal line, and a second electrode of the first transistor is electrically connected to the first node;

a control electrode of the second transistor is electrically connected to the second scanning signal line, a first electrode of the second transistor is electrically connected to the first node, and a second electrode of the second transistor is electrically connected to the third node;

a control electrode of the third transistor is electrically connected to the first node, a first electrode of the third transistor is electrically connected to the second node, and a second electrode of the third transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the fifth transistor is electrically connected to the light emitting signal line, a first electrode of the fifth transistor is electrically connected to the first power supply line, and a second electrode of the fifth transistor is electrically connected to the second node;

a control electrode of the sixth transistor is electrically connected to the light emitting signal line, a first electrode of the sixth transistor is electrically connected to the third node, and a second electrode of the sixth transistor is electrically connected to the fourth node;

a control electrode of the seventh transistor is electrically connected to the reset signal line, a first electrode of the seventh transistor is electrically connected to the second initial signal line, and a second electrode of the seventh transistor is electrically connected to the fourth node;

one end of the first capacitor is electrically connected to the first power supply line, and the other end of the first capacitor is electrically connected to the first node; and one end of the second capacitor is electrically connected to the first power supply line, and the other end of the second capacitor is electrically connected to the second node.

In an exemplary implementation mode, the node control sub-circuit includes: a first transistor, a second transistor, a fourth transistor, a seventh transistor, an eighth transistor, and a first capacitor; the storage sub-circuit includes a second capacitor; the driving sub-circuit includes a third transistor, and the light emitting control sub-circuit includes a fifth transistor and a sixth transistor;

a control electrode of the first transistor is electrically connected to the reset signal line, a first electrode of the first transistor is electrically connected to the first initial signal line, and a second electrode of the first transistor is electrically connected to a first electrode of the eighth transistor;

a control electrode of the second transistor is electrically connected to the second scanning signal line, a first electrode of the second transistor is electrically connected to the first node, and a second electrode of the second transistor is electrically connected to the third node;

a control electrode of the third transistor is electrically connected to the first node, a first electrode of the third transistor is electrically connected to the second node, and a second electrode of the third transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the fifth transistor is electrically connected to the light emitting signal line, a first electrode of the fifth transistor is electrically connected to the first power supply line, and a second electrode of the fifth transistor is electrically connected to the second node;

a control electrode of the sixth transistor is electrically connected to the light emitting signal line, a first electrode of the sixth transistor is electrically connected to the third node, and a second electrode of the sixth transistor is electrically connected to the fourth node;

a control electrode of the seventh transistor is electrically connected to the reset signal line, a first electrode of the seventh transistor is electrically connected to the second initial signal line, and a second electrode of the seventh transistor is electrically connected to the fourth node;

a control electrode of the eighth transistor is electrically connected to the first scanning signal line, and a second electrode of the eighth transistor is electrically connected to the first node;

one end of the first capacitor is electrically connected to the first power supply line, and the other end of the first capacitor is electrically connected to the first node; and one end of the second capacitor is electrically connected to the first power supply line, and the other end of the second capacitor is electrically connected to the second node.

In a second aspect, the present disclosure further provides a display substrate including: a base substrate and a drive circuit layer and a light emitting structure layer sequentially disposed on the base substrate, the drive circuit layer including a pixel circuit above-described, a plurality of first initial signal lines, a plurality of second initial signal lines, a plurality of first scanning signal lines, a plurality of second scanning signal lines, a plurality of reset signal lines, a plurality of first power supply lines, and a plurality of data signal lines, the light emitting structure layer includes a light emitting device.

In an exemplary implementation mode, the drive circuit layer includes: a semiconductor layer, a first insulation layer, a first conductive layer, a second insulation layer, a second conductive layer, a third insulation layer, a third conductive layer, a fourth insulation layer, and a fourth conductive layer that are sequentially stacked on the base substrate, each pixel circuit includes: a plurality of transistors, a first capacitor and a second capacitor, and each of the first capacitor and the second capacitor includes: a first plate and a second plate;

the semiconductor layer at least includes active layers of the plurality of transistors and the first plate of the second capacitor;

the first conductive layer at least includes the reset signal lines, a light emitting signal line, control electrodes of the plurality of transistors, and the first plate of the first capacitor;

the second conductive layer at least includes the second initial signal lines, the second plate of the first capacitor and the second plate of the second capacitor;

the third conductive layer at least includes: the first scanning signal lines and the second scanning signal lines; and the fourth conductive layer at least includes the first initial signal lines, the first power supply lines and the data signal lines.

In an exemplary implementation mode, the pixel circuit includes a first transistor to a seventh transistor, and the active layer of each transistor may include a first region, a second region, and a channel region between the first region and the second region; and a length of a first region of an active layer of the third transistor in a first direction is greater than a length of a second region of the active layer of the third transistor in the first direction, and the first region of the active layer of the third transistor is also used as the first plate of the second capacitor.

In an exemplary implementation mode, for a same pixel circuit, the second plate of the first capacitor is connected to the second plate of the second capacitor, and a second plate of a second capacitor of a pixel circuit of an N-th column is connected to a second plate of a first capacitor of a pixel circuit of an (N+1)-th column located in a same row; and a length of the second plate of the first capacitor in a second direction is smaller than a length of the second plate of the second capacitor in the second direction, and the first direction intersects with the second direction.

In an exemplary implementation mode, the second plate of the second capacitor includes: a capacitor main body portion extending in the second direction, and a first connection block and a second connection block extending in the first direction; the first connection block and the second connection block are respectively connected to the capacitor main body portion, the first connection block and the second connection block are arranged in parallel and are on a side of the capacitor main body portion away from the second plate of the first capacitor;

an orthographic projection of the capacitor main body portion on the base substrate at least partially overlaps with an orthographic projection of the first plate of the second capacitor on the base substrate, an orthographic projection of the first connection block on the base substrate partially overlaps with an orthographic projection of an active layer of the second transistor between control electrodes of the second transistor on the base substrate, and an orthographic projection of the second connection block on the base substrate partially overlaps with an orthographic projection of an active layer of the third transistor on the base substrate; and

for a same pixel circuit, the second plate of the first capacitor is connected to the capacitor main body portion, and a second connection block of the pixel circuit of the N-th column is connected to the second plate of the first capacitor of the pixel circuit of the (N+1)-th column in the same row.

In an exemplary implementation mode, a length of the first power supply lines in the first direction is greater than a length of the data signal lines in the first direction and greater than a length of the first initial signal lines in the first direction, and the length of the first initial signal lines in the first direction is greater than the length of the data signal lines in the first direction.

In an exemplary implementation mode, the drive circuit layer includes: a shield layer, a first insulation layer, a semiconductor layer, a second insulation layer, a first conductive layer, a third insulation layer, a second conductive layer, a fourth insulation layer, a third conductive layer, a fifth insulation layer, and a fourth conductive layer, each pixel circuit includes: a plurality of transistors, a first capacitor including a first plate and a second plate, and a second capacitor including a first plate, a second plate, and a third plate;

the shield layer at least includes the first plate of the second capacitor, the shield layer is configured to transmit a high-voltage power supply signal;

the semiconductor layer at least includes active layers of the plurality of transistors, the second plate of the second capacitor, the first initial signal lines and the second initial signal lines;

the first conductive layer at least includes a light emitting signal line, control electrodes of the plurality of transistors and the first plate of the first capacitor;

the second conductive layer at least includes the second plate of the first capacitor and the third plate of the second capacitor;

the third conductive layer at least includes two reset signal lines, the first scanning signal lines and the second scanning signal lines;

the fourth conductive layer may include the first power supply lines and the data signal lines.

In an exemplary implementation mode, the plurality of transistors include: a first transistor to an eighth transistor, and the shield layer further includes: a first shield structure, a second shield structure, a first shield connection structure, a second shield connection structure, a third shield connection structure, and a fourth shield connection structure, and the first plate of the second capacitor is also used as the second shield structure;

the first shield connection structure and the second shield structure are respectively on opposite sides of the first shield structure and are connected to the first shield structure, the second shield connection structure is on a side of the second shield structure away from the first shield structure and is connected to the second shield structure. The third shield connection structure and the fourth shield connection structure are respectively on the other two opposite sides of the first shield structure, and the third shield connection structure is connected to the second shield structure and the fourth shield connection structure is connected to the first shield structure;

an orthographic projection of the first shield structure on the base substrate at least partially overlaps with an orthographic projection of a channel region of an active layer of the third transistor on the base substrate, an orthographic projection of the second shield structure on the base substrate at least partially overlaps with an orthographic projection of the second plate of the second capacitor on the base substrate, an orthographic projection of the third shield connection structure on the base substrate at least partially overlaps with an orthographic projection of an active layer of the first transistor on the base substrate, and an orthographic projection of the fourth shield connection structure on the base substrate at least partially overlaps with an orthographic projection of an active layer of the seventh transistor on the base substrate.

In an exemplary implementation mode, a second shield structure of a sub-pixel of an N-th column is on a side of a first shield structure of the sub-pixel of the N-th column close to a first shield structure of a sub-pixel of an (N+1)-th column in a same row, a first shield connection structure of the sub-pixel of the N-th column is on a side of the first shield structure of the sub-pixel of the N-th column close to a first shield structure of a sub-pixel of an (N−1)-th column in the same row and is connected to a fourth shield connection structure of the sub-pixel of the (N−1)-th column, and a second shield connection structure of the sub-pixel of the N-th column is connected to a first shield connection structure of the sub-pixel of the (N+1)-th column in the same row; a third shield connection structure of a sub-pixel of an M-th row is on a side of the first shield structure of the sub-pixel of the M-th row close to a first shield structure of a sub-pixel of an (M−1)-th row in a same column and is connected to the fourth shield connection structure of the sub-pixel of the (M−1)-th row, a fourth shield connection structure of the sub-pixel of the M-th row is on a side of the first shield structure of the sub-pixel of the M-th row close to a first shield structure of a sub-pixel of an (M+1)-th row in the same column and is connected to a fifth shield connection structure of the sub-pixel of the (M+1)-th row.

In an exemplary implementation mode, for a same sub-pixel, the second plate of the first capacitor and the third plate of the second capacitor are connected to each other;

for sub-pixels of a same row, a third plate of a second capacitor of a sub-pixel of an N-th column is located at a second plate of a first capacitor of the sub-pixel of the N-th column close to a second plate of a first capacitor of a sub-pixel of an (N+1)-th column, and is connected to the second plate of the first capacitor of the sub-pixel of the (N+1)-th column; and a length of the second plate of the first capacitor in the second direction is smaller than a length of the third plate of the second capacitor in the second direction.

In a fourth aspect, the present disclosure further provides a display apparatus, including: the display substrate above-described.

In an exemplary implementation mode, further including: a gate driving circuit including: K+2 cascaded shift registers, K is a total number of rows of the pixel circuits;

a first stage shift register is connected to a reset signal line connected to a first row of pixel circuits, a second stage shift register is respectively connected to a first scanning signal line connected to the first row of pixel circuits and a reset signal line connected to a second row of pixel circuits, an i-th stage shift register is respectively connected to a second scanning signal line connected to an (i−2)-th row of pixel circuits, a first scanning signal line connected to an (i−1)-th row of pixel circuits and a reset signal line connected to an i-th row of pixel circuits, a (K+1)-th stage shift register is respectively connected to a second scanning signal line connected to a (K−1)-th row of pixel circuits and a first scanning signal line connected to a K-th row of pixel circuits, a (K+2)-th stage shift register is respectively connected to a second scanning signal line connected to the K-th row of pixel circuits, i=3, 4, . . . , K.

In a fourth aspect, the present disclosure further provides a method for driving a pixel circuit configured to drive the pixel circuit above-described, the method including:

the node control sub-circuit provides the signal of the first initial signal line or the third node to the first node, provides the signal of the second initial signal line to the fourth node, and provides the signal of the data signal line to the second node under control of the reset signal line, the first scanning signal line and the second scanning signal line;

the storage sub-circuit charges the second node when a signal of the first scanning signal line is an effective level signal;

the driving sub-circuit provides the drive current to the third node under control of the first node and the second node; and the light emitting control sub-circuit provides the signal of the first power supply line to the second node and the signal of the third node to the fourth node under control of the light emitting signal line.

Other aspects of the present disclosure may be comprehended after the drawings and the detailed descriptions are read and understood.

BRIEF DESCRIPTION OF DRAWINGS

Accompany drawings are used to provide further understanding of technical solution of the present disclosure, and form a part of the description. The accompany drawings and embodiments of the present disclosure are adopted to explain the technical solution of the present disclosure, and do not form limitations on the technical solution of the present disclosure.

10

Figure 7:
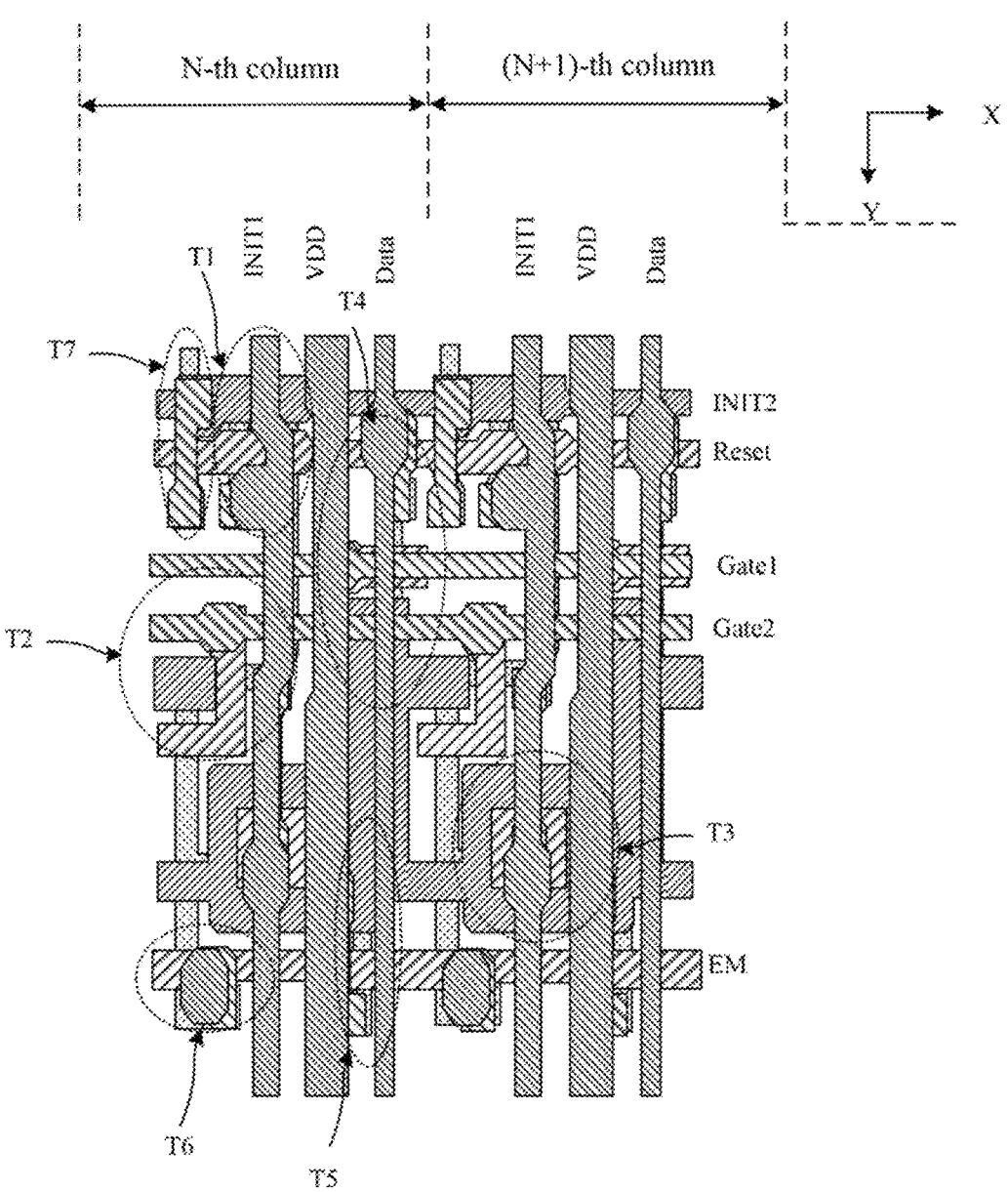
FIG. 7 is a first schematic structural diagram of a display substrate according to an embodiment of the present disclosure.
Figure 13:
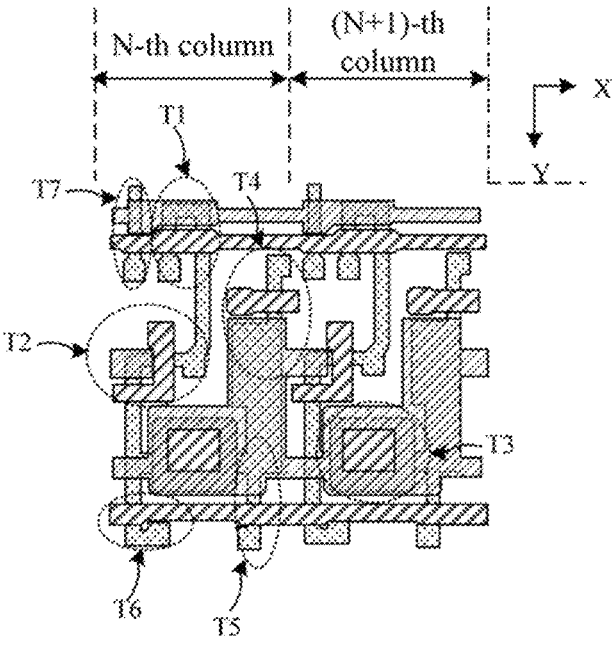

FIG. 13 is a schematic diagram of the display substrate provided in FIG. 7 after the pattern of the second conductive layer is formed.

Figure 14:
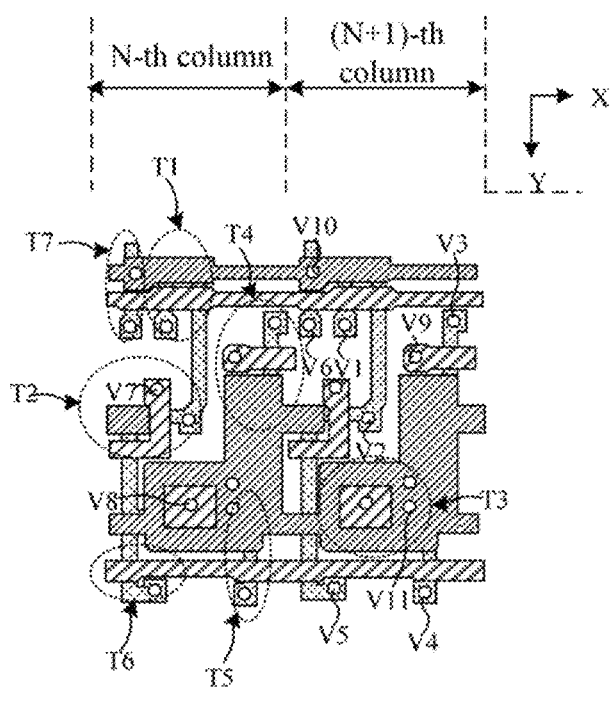

FIG. 14 is a schematic diagram of the display substrate provided in FIG. 7 after a third insulation layer is formed.

Figure 15:
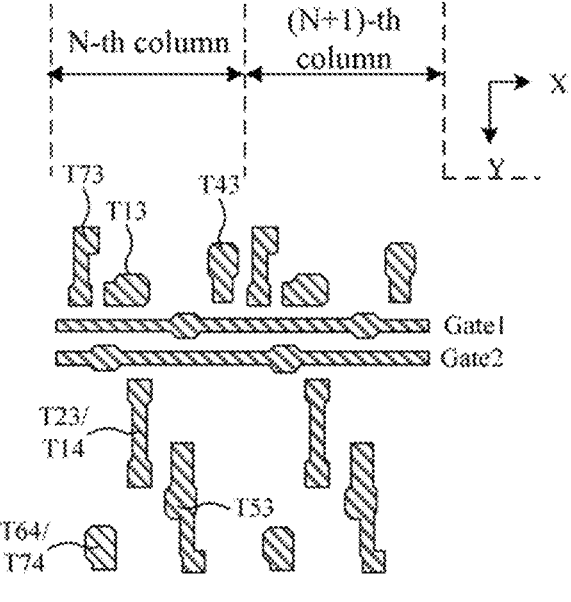

FIG. 15 is a schematic diagram of a pattern of a third conductive layer of the display substrate provided in FIG. 7.

Figure 16:
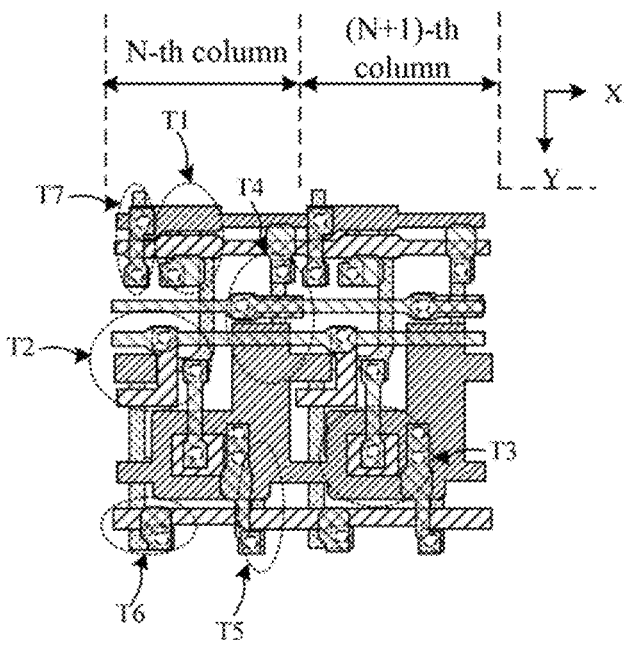

FIG. 16 is a schematic diagram of the display substrate provided in FIG. 7 after the pattern of the third conductive layer is formed.

Figure 17:
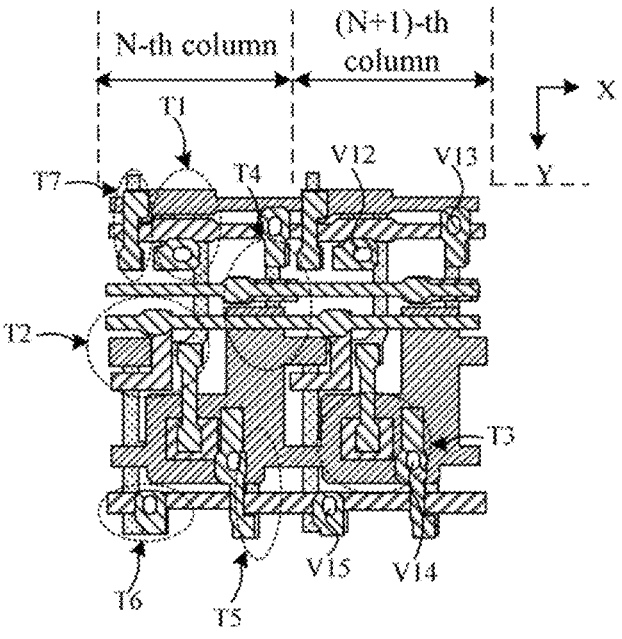

FIG. 17 is a schematic diagram of the display substrate provided in FIG. 7 after a pattern of a fourth insulation layer is formed.

Figure 18:
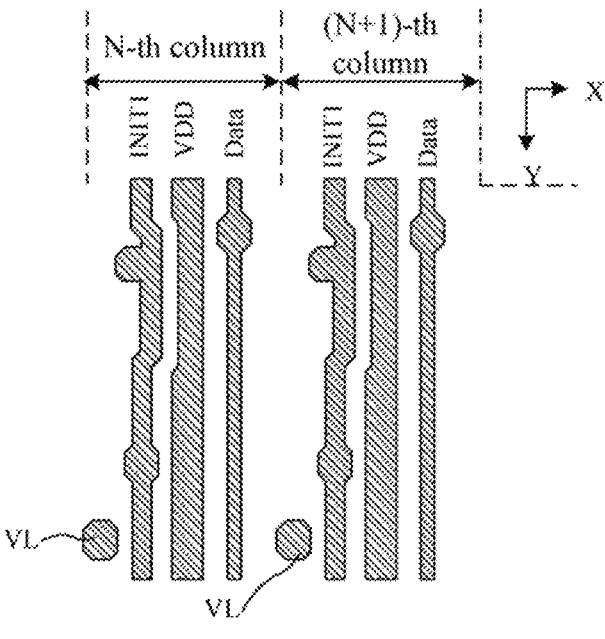

FIG. 18 is a schematic diagram of a pattern of a fourth conductive layer of the display substrate provided in FIG. 7.

Figure 19:
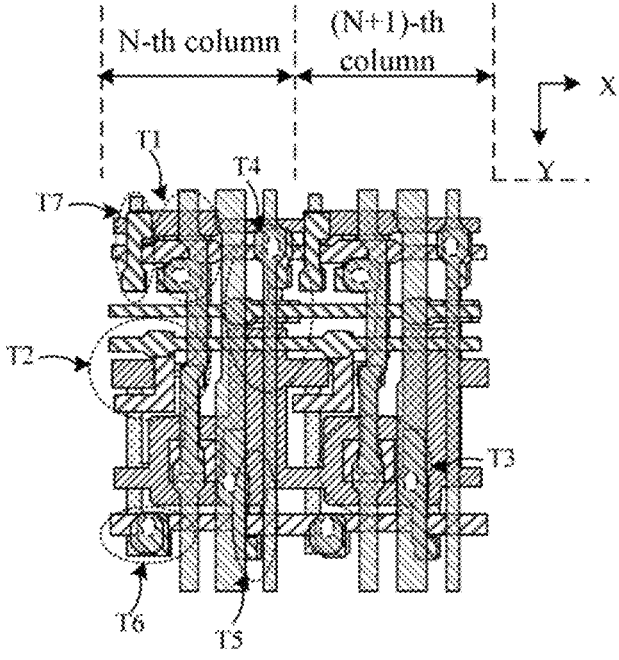

FIG. 19 is a schematic diagram of the display substrate provided in FIG. 7 after the pattern of the fourth conductive layer is formed.

Figures 8, 9:
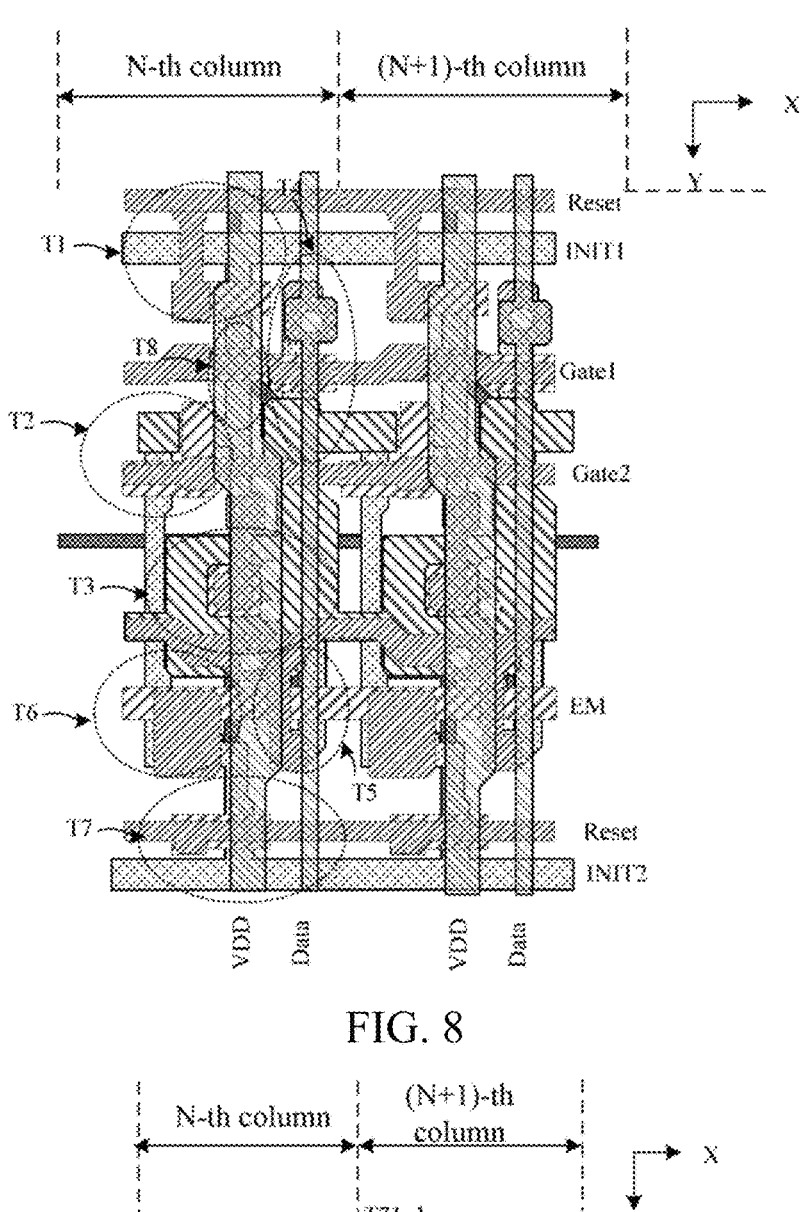
FIG. 8 is a second schematic structural diagram of a display substrate according to an embodiment of the present disclosure.
FIG. 9 is a schematic diagram of the display substrate provided in FIG. 7 after a pattern of a semiconductor layer is formed.
Figure 20:
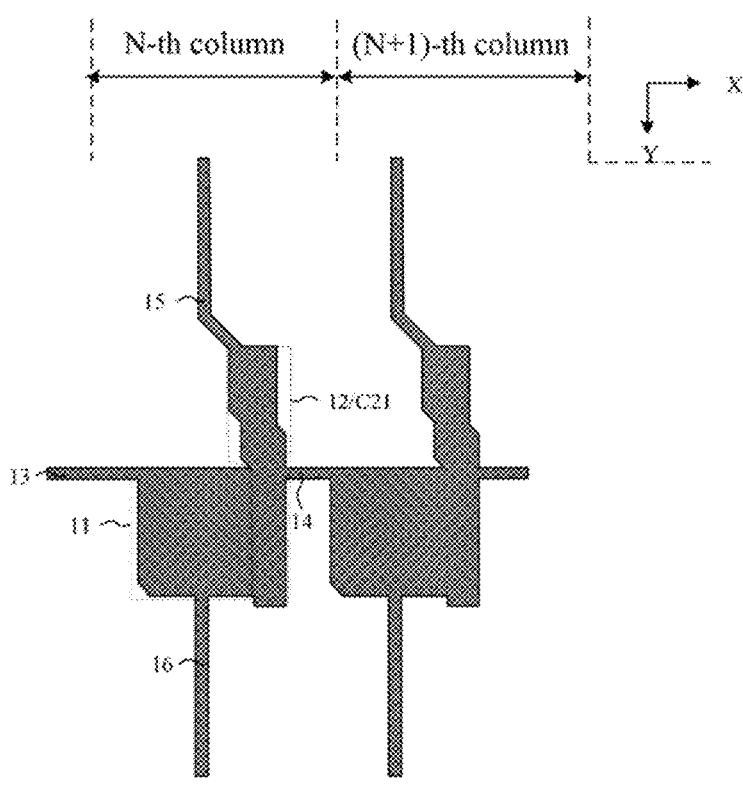

FIG. 20 is a schematic diagram of the display substrate provided in FIG. 8 after a pattern of a shield layer is formed.

Figure 21:
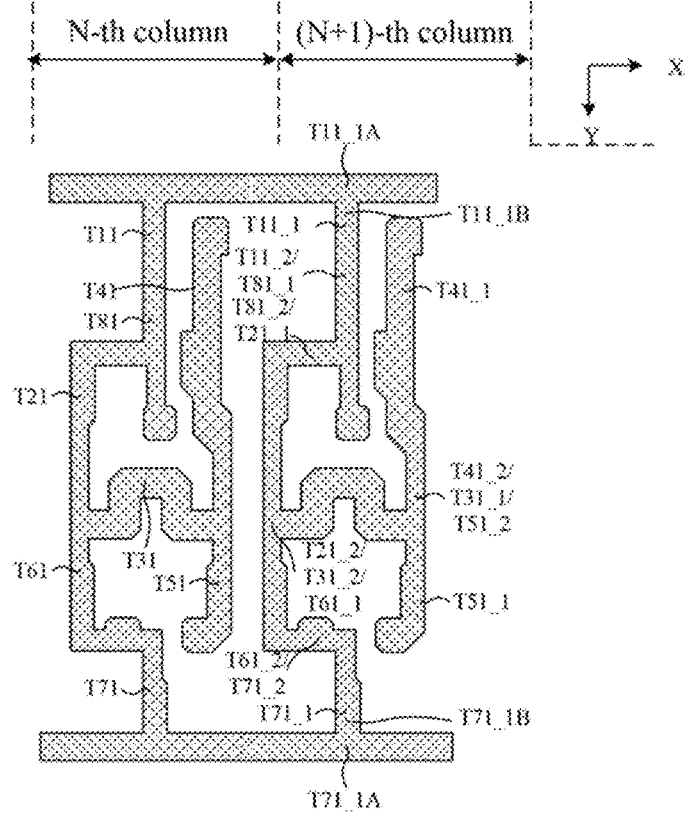

FIG. 21 is a schematic diagram of a pattern of a semiconductor layer of the display substrate provided in FIG. 8.

Figure 22:
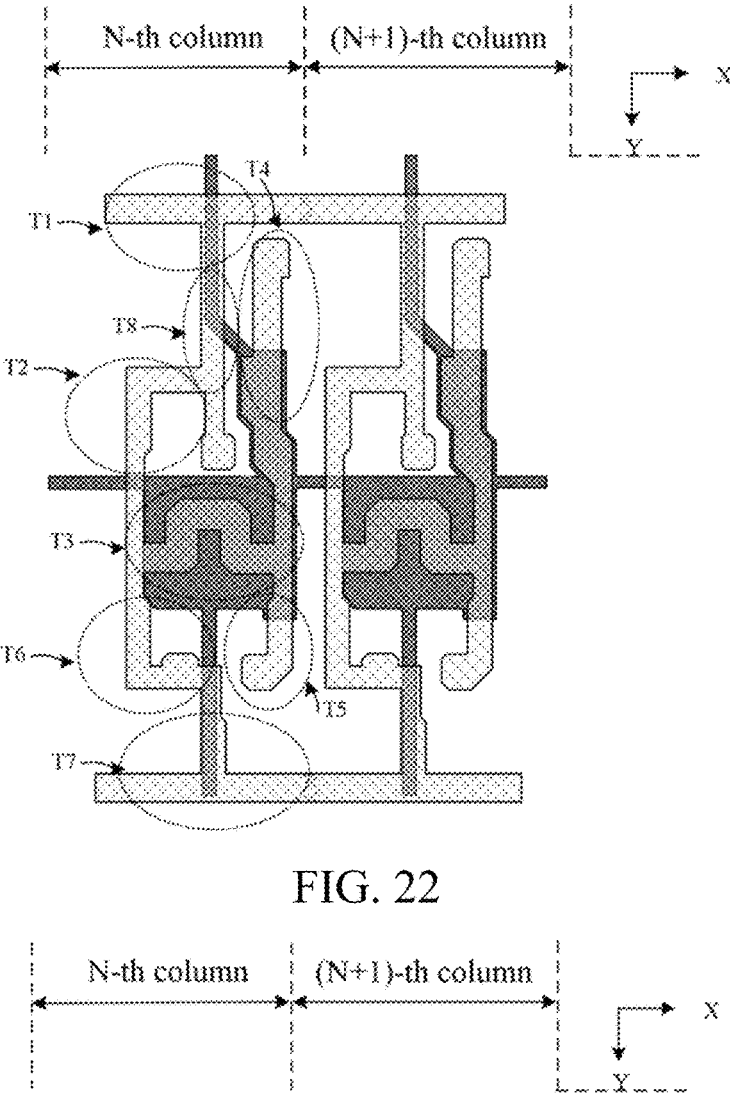

FIG. 22 is a schematic diagram of the display substrate provided in FIG. 8 after the pattern of the semiconductor layer is formed.

Figure 23:
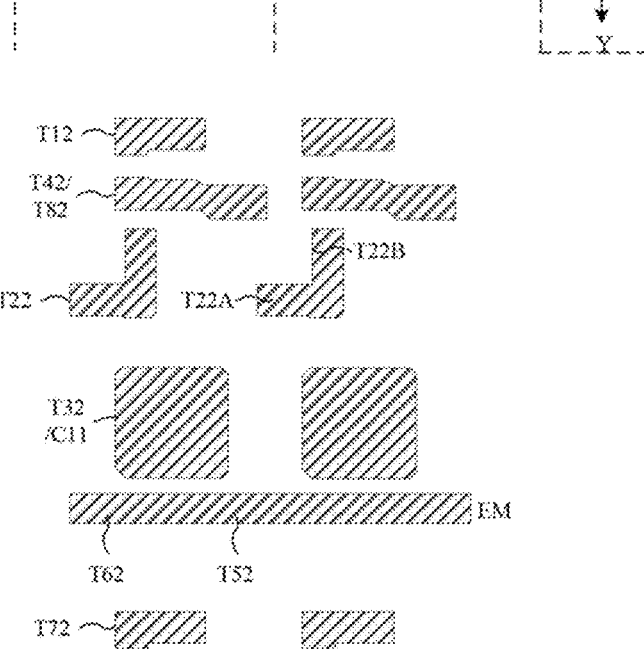

FIG. 23 is a schematic diagram of a pattern of a first conductive layer of the display substrate provided in FIG. 8.

Figure 24:
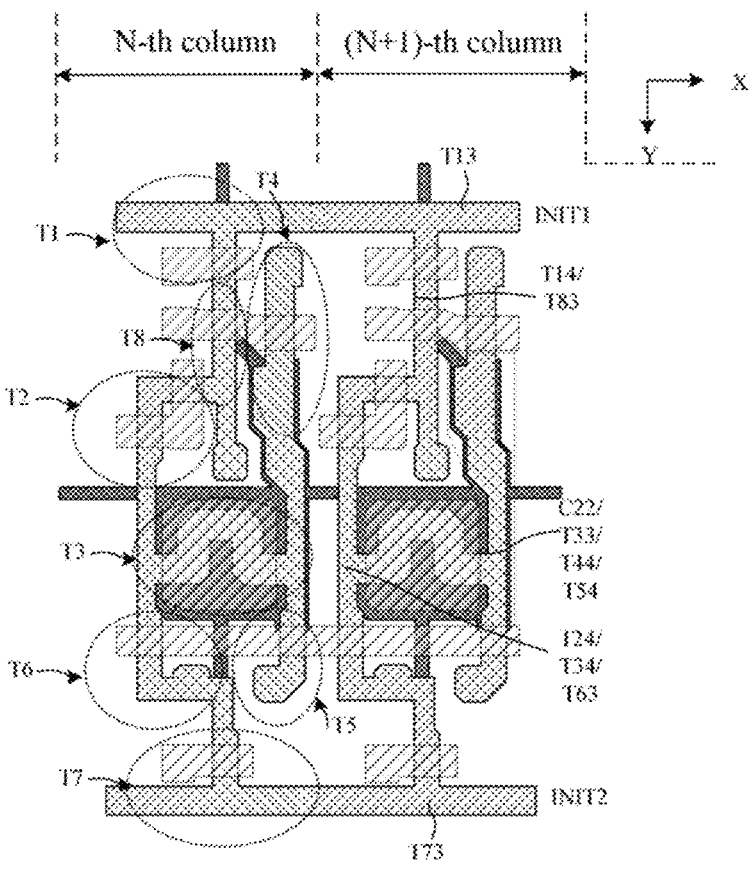
Figure 24:
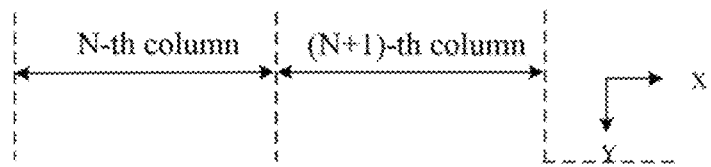

FIG. 24 is a schematic diagram of the display substrate provided in FIG. 8 after the pattern of the first conductive layer is formed.

Figure 25:
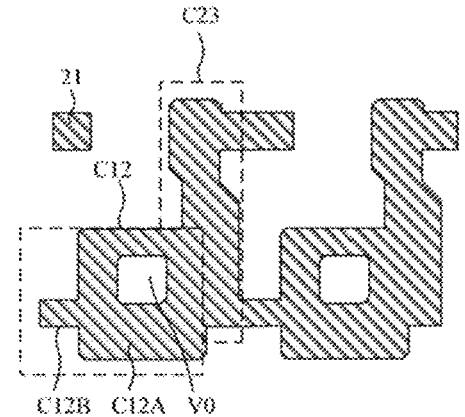

FIG. 25 is a schematic diagram of a pattern of a second conductive layer of the display substrate provided in FIG. 8.

Figure 26:
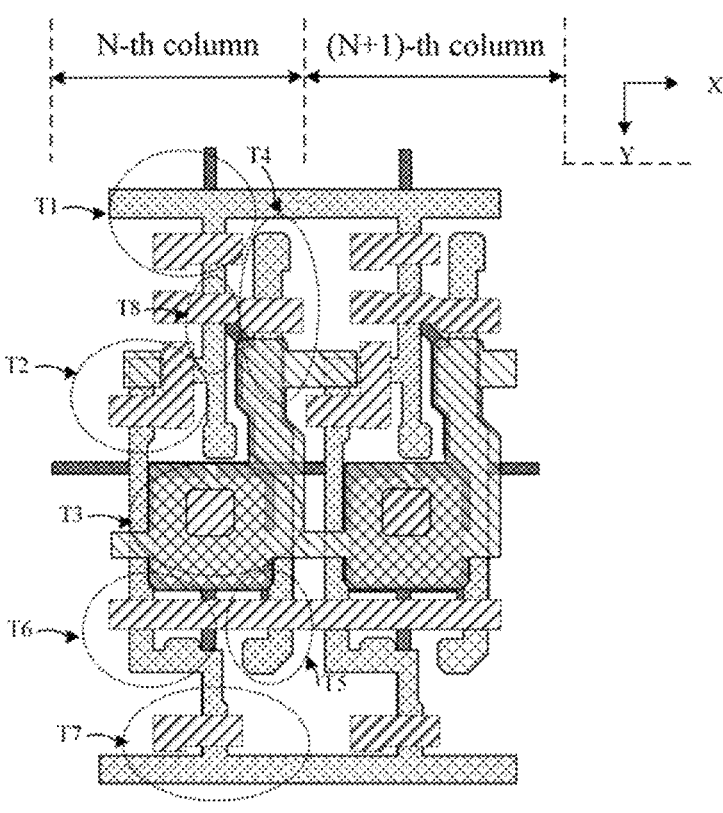

FIG. 26 is a schematic diagram of the display substrate provided in FIG. 8 after the pattern of the second conductive layer is formed.

Figure 27:
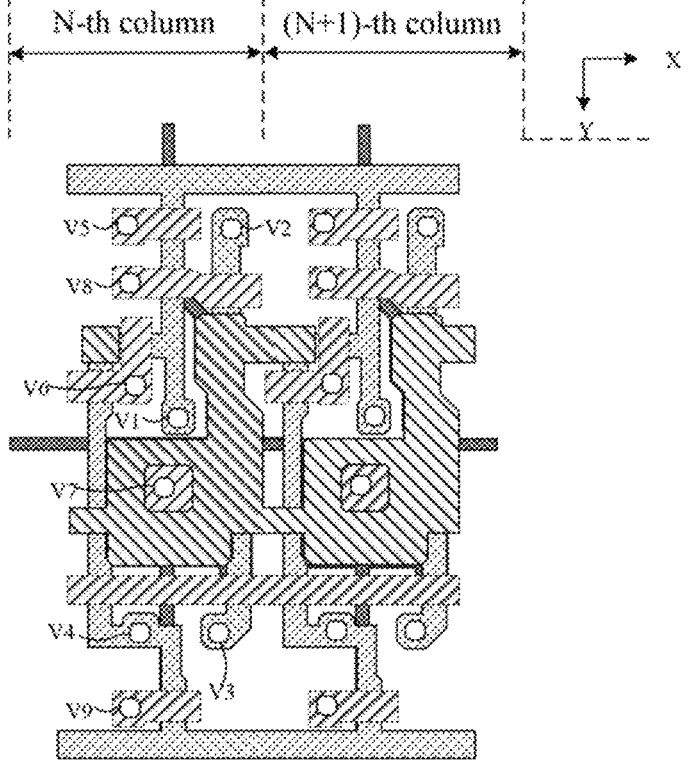

FIG. 27 is a schematic diagram of the display substrate provided in FIG. 8 after a pattern of a fourth insulation layer is formed.

Figure 28:
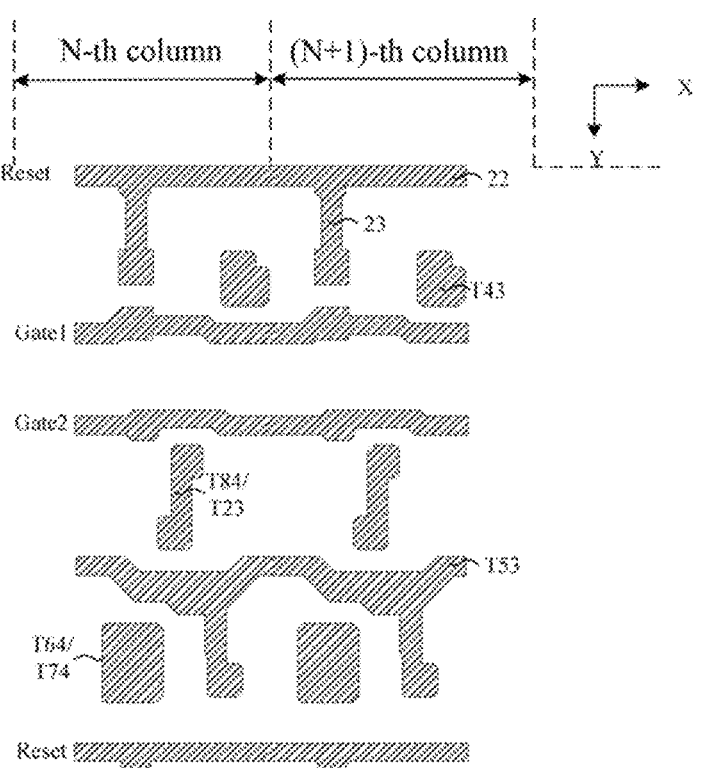

FIG. 28 is a schematic diagram of a pattern of a third conductive layer of the display substrate provided in FIG. 8.

Figure 29:
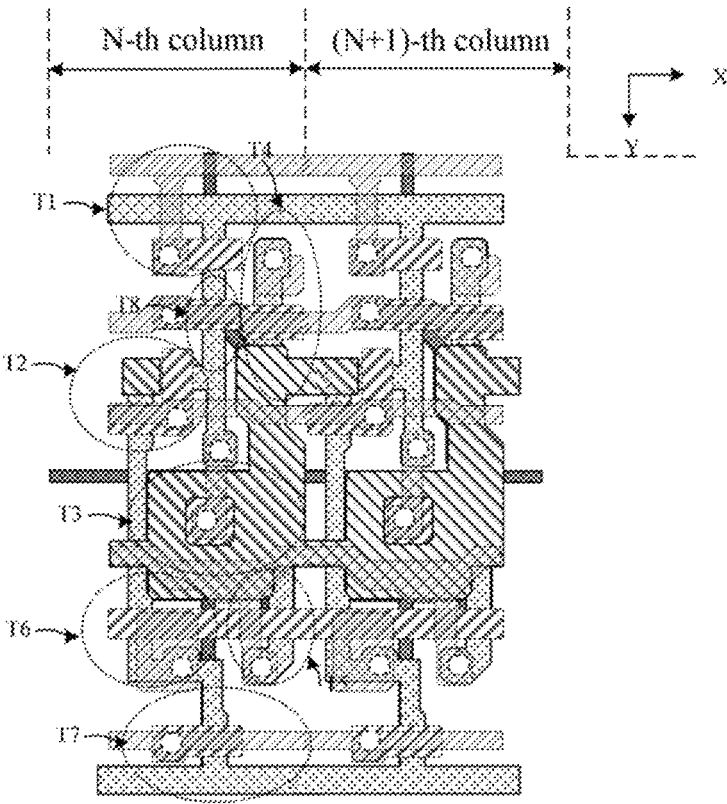

FIG. 29 is a schematic diagram of the display substrate provided in FIG. 8 after the pattern of the third conductive layer is formed.

Figure 30:
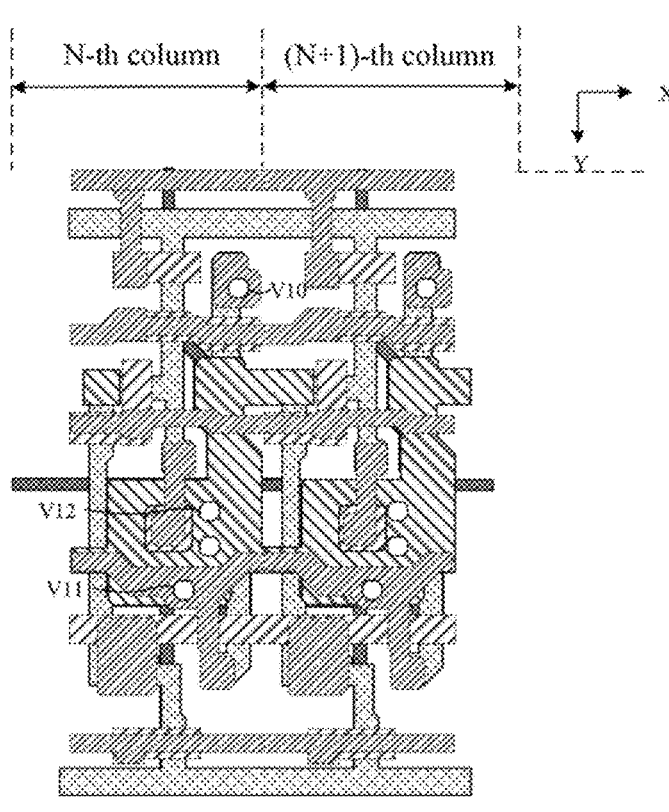

FIG. 30 is a schematic diagram of the display substrate provided in FIG. 8 after a pattern of a fifth insulation layer is formed.

Figure 31:
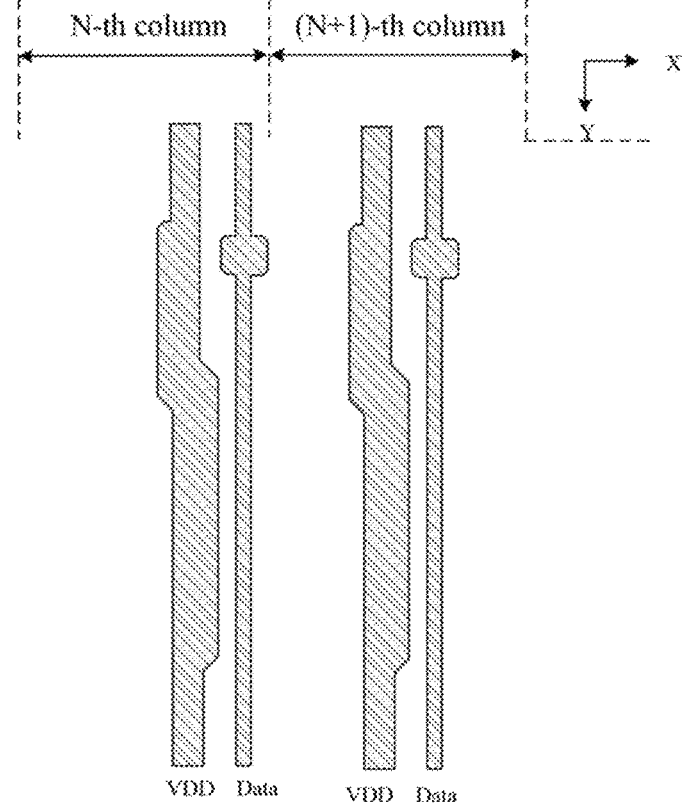

FIG. 31 is a schematic diagram of a pattern of a fourth conductive layer of the display substrate provided in FIG. 8.

Figure 32:
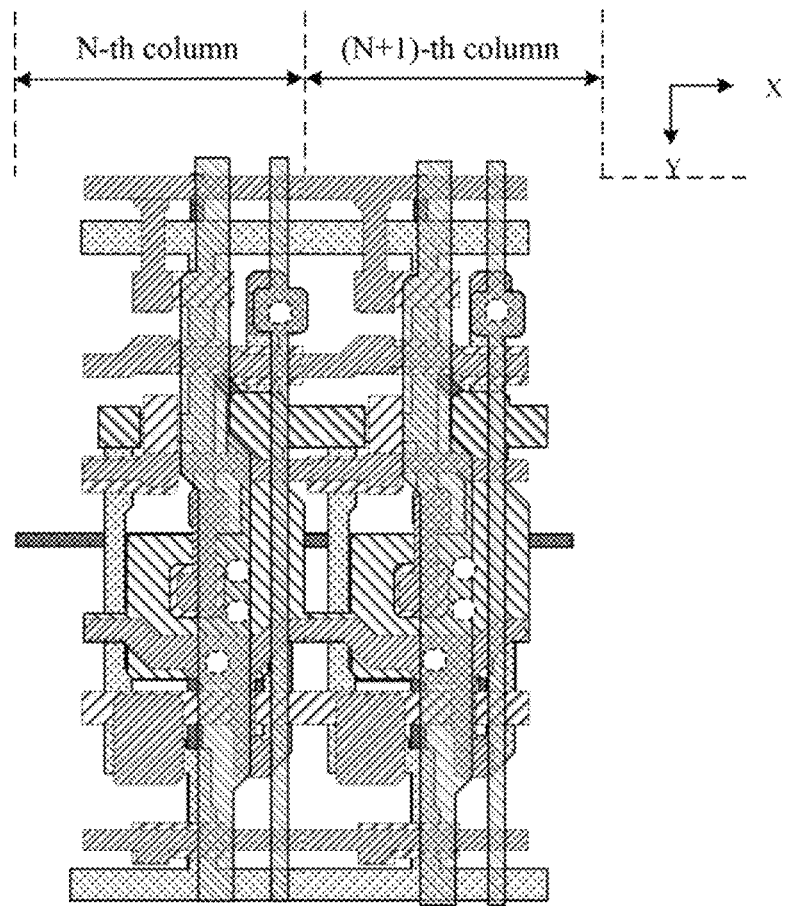

FIG. 32 is a schematic diagram of the display substrate provided in FIG. 8 after the pattern of the fourth conductive layer is formed.

Figure 33:
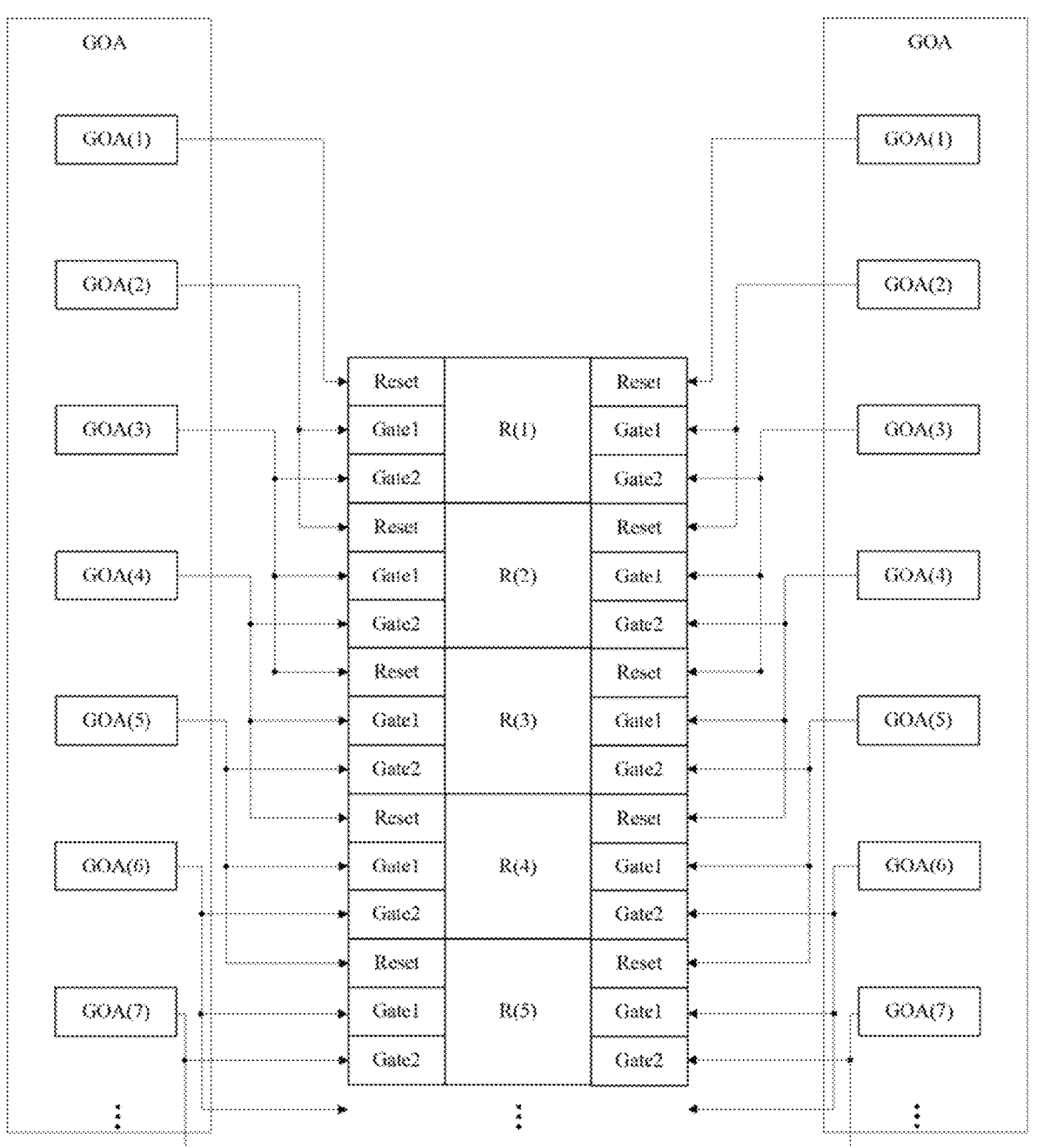

FIG. 33 is a schematic connection diagram of a gate driving circuit.

DETAILED DESCRIPTION

To make the objectives, technical solutions, and advantages of the present disclosure clearer, the embodiments of the present disclosure will be described in detail below in with reference to the accompany drawings. It is to be noted that the implementation modes may be implemented in various forms. Those of ordinary skills in the art can easily understand such a fact that implementation modes and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflicts. In order to keep following description of the embodiments of the present disclosure clear and concise, detailed description of part of known functions and known components are omitted in the present disclosure. The drawings in the embodiments of the present disclosure relate only to the structures involved in the embodiments of the present disclosure, and other structures may be described with reference to conventional designs.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one implementation mode of the present disclosure is not limited to shapes, numerical values, or the like shown in the drawings.

Ordinal numerals "first", "second", "third", etc., in the specification are set not to form limits in numbers but only to avoid confusion between composition elements.

In the specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limitations on the present disclosure. The positional relationships between the composition elements may be changed as appropriate according to a direction according to which each composition element is described. Therefore, appropriate replacements based on situations are allowed, which is not limited to the expressions in the specification.

In the specification, unless otherwise specified and defined, terms "mounting", "mutual connection", and "connection" should be understood in a broad sense. For example, a connection may be fixed connection, or detachable connection, or integral connection; it may be mechanical connection or electrical connection; it may be direct connection, or indirect connection through an intermediate, or internal communication between two elements. Those of ordinary skills in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In cases that transistors with opposite polarities are used, or a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes connection of composition elements through an element with a certain electrical action. An "element with a certain electrical action" is not particularly limited as long as electric signals between the connected composition elements may be sent and received. Examples of the "element with the certain electrical action" not only include an electrode and a line, but also include a switch element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive thin film" sometimes. Similarly, an "insulation thin film" may be replaced with an "insulation layer" sometimes.

In the specification, "disposed in a same layer" refers to a structure formed by patterning two (or more than two) structures through a same patterning process, and their materials may be the same or different. For example, materials of precursors for forming multiple structures disposed in a same layer are the same, and final materials may be the same or different.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the present disclosure, "about" refers to that a boundary is not defined so strictly and numerical values within a range of process and measurement errors are allowed.

With the gradual maturation of OLED technology, related products have been widely used in products launched by major mobile phone manufacturers, and are still expanding their application fields. In order to meet needs of specialized users, there is a demand for high refresh rates in display products, and high refresh rates can lead to insufficient charging time in pixel circuits, which in turn causes a poor display effect.

Figure 1:
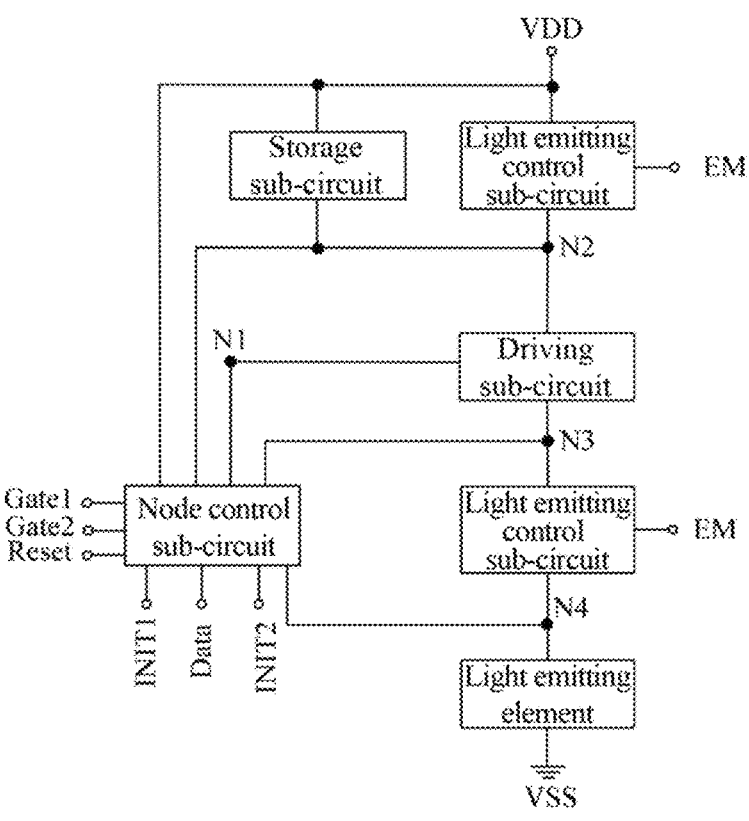
FIG. 1 is a schematic diagram of a structure of a pixel circuit according to an embodiment of the present disclosure.

FIG. 1 is a schematic diagram of a structure of a pixel circuit according to an embodiment of the present disclosure. As shown in FIG. 1, a pixel circuit according to an embodiment of the present disclosure is configured to drive a light emitting device to emit light, and includes a node control sub-circuit, a storage sub-circuit, a driving sub-circuit, and a light emitting control sub-circuit.

As shown in FIG. 1, the node control sub-circuit is electrically connected to a first node N1, a second node N2, a third node N3, a fourth node N4, a first scanning signal line Gate1, a second scanning signal line Gate2, a first initial signal line INIT1, a second initial signal line INIT2, a reset signal line Reset, a data signal line Data and a first power supply line VDD respectively, and is configured to provide a signal of the first initial signal line INIT1 or the third node N3 to the first node N1, provide a signal of the second initial signal line INIT2 to the fourth node N4, and provide a signal of the data signal line Data to the second node N2 under control of the reset signal line Reset, the first scanning signal line Gate1 and the second scanning signal line Gate2. The storage sub-circuit is electrically connected to the second node N2 and the first power supply line VDD respectively, and is configured to charge the second node N2 when a signal of the first scanning signal line Gate1 is an effective level signal. The driving sub-circuit is electrically connected to the first node N1, the second node N2, and the third node N3 respectively, and is configured to provide a drive current to the third node N3 under control of the first node N1 and the second node N2. The light emitting control sub-circuit is electrically connected to the light emitting signal line EM, the first power supply line VDD, the second node N2, the third node N3, and the fourth node N4 respectively, and is configured to provide a signal of the first power supply line VDD to the second node N2 and provide a signal of the third node N3 to the fourth node N4 under control of the light emitting signal line EM. A first electrode of the light emitting device is connected to the fourth node N4, and a second electrode of the light emitting device is connected to a second power supply line VSS.

In an exemplary embodiment, the first power supply line VDD continuously provides a high-voltage power supply signal and the second power supply line VSS continuously provides a low-voltage power supply signal.

In an exemplary embodiment, initial signals of the first initial signal line INIT1 and the second initial signal line INIT2 may be the same or may be different. When the initial signals of the first initial signal line INIT1 and the second initial signal line INIT2 are the same, the first initial signal line INIT1 and the second initial signal line INIT2 may be the same signal line or may be different signal lines, which are not limited in present disclosure.

In an exemplary embodiment, the light emitting device is electrically connected to the fourth node N4 and the second power supply line VSS, respectively.

In an exemplary embodiment, the light emitting device may be an Organic light emitting Diode (OLED), including a first electrode (anode), an organic light emitting layer, and a second electrode (cathode) that are stacked. Exemplarily, an anode of the organic light emitting diode is electrically connected to the fourth node N4, and a cathode of the organic light emitting diode is electrically connected to the second power supply line VSS.

In an exemplary embodiment, the organic emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) that are stacked. In an exemplary implementation mode, hole injection layers of all sub-pixels may be connected together to be a common layer, electron injection layers of all the sub-pixels may be connected together to be a common layer, hole transport layers of all the sub-pixels may be connected together to be a common layer, electron transport layers of all the sub-pixels may be connected together to be a common layer, hole block layers of all the sub-pixels may be connected together to be a common layer, emitting layers of adjacent sub-pixels may be overlapped slightly or may be isolated from each other, and electron block layers of adjacent sub-pixels may be overlapped slightly or may be isolated from each other.

An embodiment of the present disclosure provides a pixel circuit. In the present disclosure, by providing a storage sub-circuit, the second node N2 is charged when the first scanning signal line Gate1 is an effective level signal, and the second node N2 can be discharged when a signal of the first scanning signal line Gate1 is an effective level signal, so that charging time of the first node N1 is prolonged under the condition of ensuring the high refresh rate of the display product, and a display effect of the display product is improved.

In an exemplary implementation mode, a time period in which a signal of the reset signal line Reset is an effective level signal includes a first time period and a second time period, and the first time period occurs before the second time period. A time period in which a signal of the first scanning signal line Gate1 is an effective level signal includes a third time period and a fourth time period, and the third time period occurs before the fourth time period. A time period in which a signal of the second scanning signal line Gate2 is an effective level signal includes a fifth time period and a sixth time period, and the fifth time period occurs before the sixth time period, the second time period and the third time period at least partially overlap, and the fourth time period and the fifth time period at least partially overlap. Exemplarily, the second and third time periods may be a same time period, and the fourth and fifth time periods may be a same time period.

In an exemplary implementation mode, when the signals of the reset signal line Reset, the first scanning signal line Gate1 and the second scanning signal line Gate2 are effective level signals, a signal of the light emitting signal line EM is an ineffective level signal, and when the signal of the light emitting signal line EM is an effective level signal, the signals of the reset signal line Reset, the first scanning signal line Gate1 and the second scanning signal line Gate2 are ineffective level signals.

Figure 2:
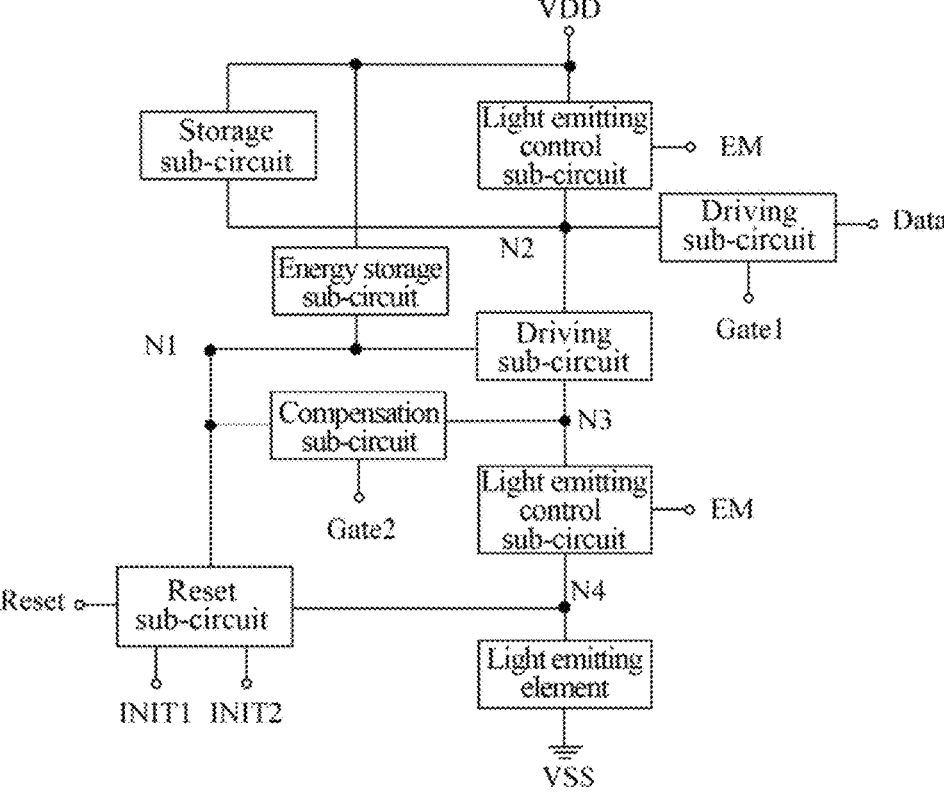
FIG. 2 is a schematic diagram of a structure of a node control sub-circuit.

FIG. 2 is a schematic diagram of a structure of a node control sub-circuit. As shown in FIG. 2, in an exemplary implementation mode, the node control sub-circuit may include a reset sub-circuit, a write sub-circuit, a compensation sub-circuit and an energy storage sub-circuit.

As shown in FIG. 2, the reset sub-circuit is electrically connected to the reset signal line Reset, the first initial signal line INIT1, the second initial signal line INIT2, the first node N1, and the fourth node N4 respectively, and is configured to provide a signal of the first initial signal line INIT1 to the first node N1 and provide a signal of the second initial signal line INIT2 to the fourth node N4 under control of the reset signal line Reset. The write sub-circuit is electrically connected to the first scanning signal line Gate1, the data signal line Data and the second node N2 respectively, and is configured to provide a signal of the data signal line Data to the second node N2 under control of the first scanning signal line Gate1. The compensation sub-circuit is electrically connected to the second scanning signal line Gate2, the first power supply line VDD, the first node N1 and the third node N3 respectively, and is configured to provide a signal of the third node N3 to the first node N1 under control of the second scanning signal line Gate2. The energy storage sub-circuit is electrically connected to the first node N1 and the first power supply line VDD respectively, and is configured to store a voltage difference of a signal between the first node N1 and the first power supply line VDD.

Figure 3:
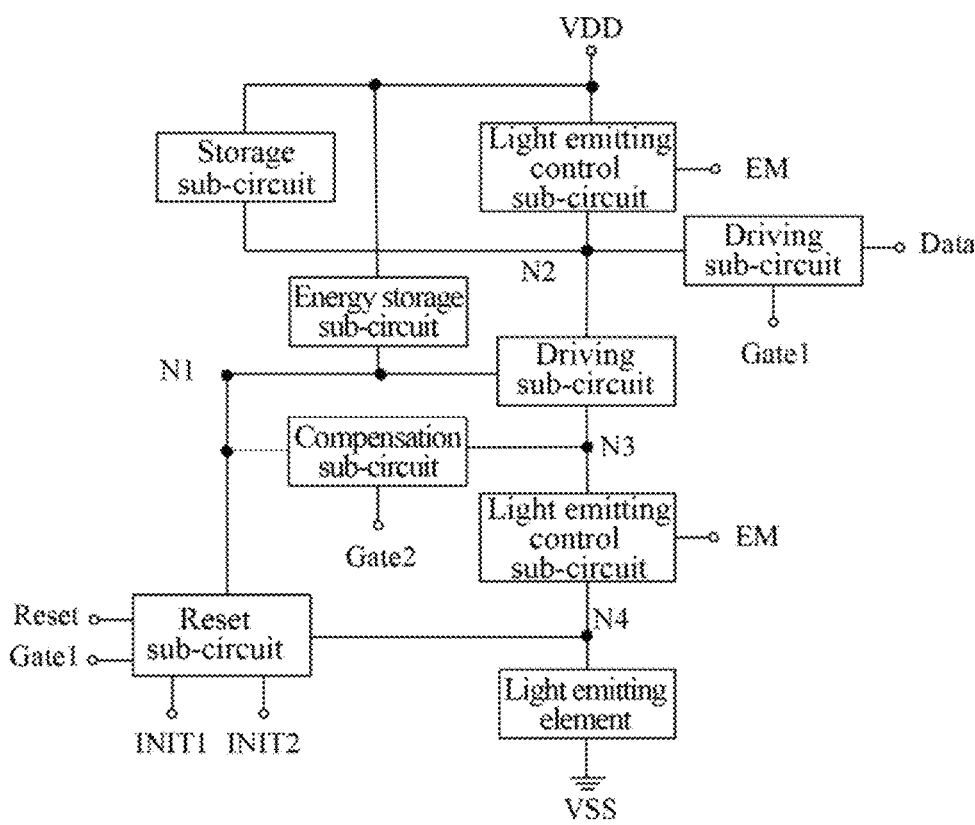
FIG. 3 is a schematic diagram of a structure of another node control sub-circuit.

FIG. 3 is a schematic diagram of a structure of another node control sub-circuit. As shown in FIG. 3, in an exemplary implementation mode, the reset sub-circuit is also connected to the first scanning signal line Gate1 and is configured to provide a signal of the first initial signal line INIT1 to the first node N1 and provide a signal of the second initial signal line INIT2 to the fourth node N4 under control of the reset signal line Reset and the first scanning signal line Gate1.

Figure 4:
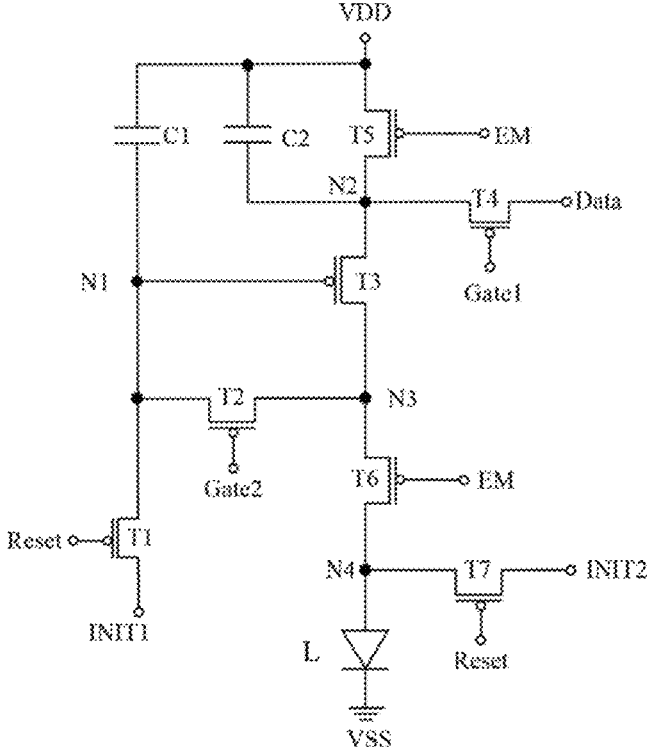
FIG. 4 is an equivalent circuit diagram of a pixel circuit.

FIG. 4 is an equivalent circuit diagram of a pixel circuit. As shown in FIG. 4, in an exemplary implementation mode, the reset sub-circuit may include a first transistor T1 and a seventh transistor T7, the write sub-circuit may include a fourth transistor T4, the compensation sub-circuit may include a second transistor T2, and the energy storage sub-circuit may include a first capacitor C1.

As shown in FIG. 4, a control electrode of the first transistor T1 is electrically connected to the reset signal line Reset, a first electrode of the first transistor T1 is electrically connected to the first initial signal line INIT1, and a second electrode of the first transistor T1 is electrically connected to the first node N1. A control electrode of the second transistor T2 is electrically connected to the second scanning signal line Gate2, a first electrode of the second transistor T2 is electrically connected to the first node N1, and a second electrode of the second transistor T2 is electrically connected to the third node N3. A control electrode of the fourth transistor T4 is electrically connected to the first scanning signal line Gate1, a first electrode of the fourth transistor T4 is electrically connected to the data signal line Data, and a second electrode of the fourth transistor T4 is electrically connected to the second node N2. A control electrode of the seventh transistor T7 is electrically connected to the reset signal line Reset, a first electrode of the seventh transistor T7 is electrically connected to the second initial signal line INIT2, and a second electrode of the seventh transistor T7 is electrically connected to the fourth node N4. One end of the first capacitor C1 is electrically connected to the first power supply line VDD, and the other end of the first capacitor C1 is electrically connected to the first node N1.

Figure 5:
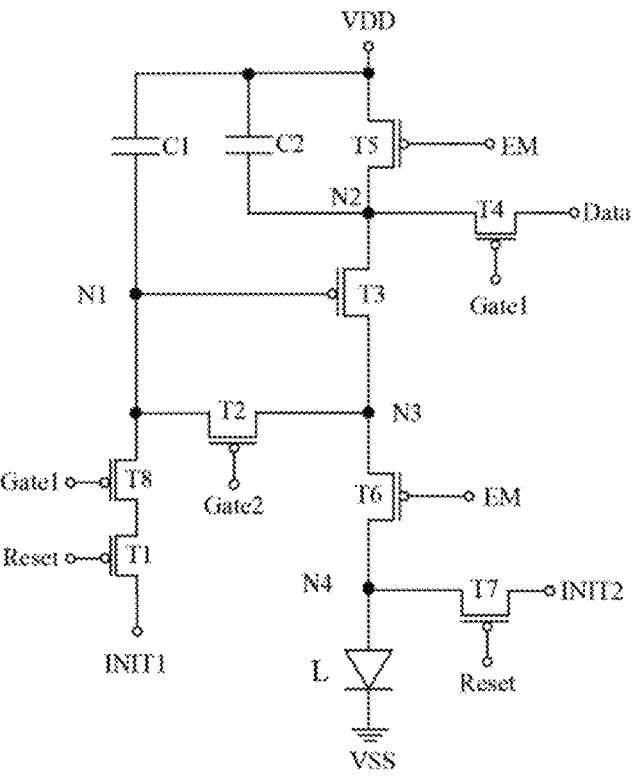
FIG. 5 is an equivalent circuit diagram of another pixel circuit.

FIG. 5 is an equivalent circuit diagram of another pixel circuit. As shown in FIG. 5, in an exemplary implementation mode, the reset sub-circuit may include a first transistor T1, a seventh transistor T7, and an eighth transistor T8, the write sub-circuit may include a fourth transistor T4, the compensation sub-circuit may include a second transistor T2, and the energy storage sub-circuit may include a first capacitor C1.

As shown in FIG. 5, a control electrode of the first transistor T1 is electrically connected to the reset signal line Reset, a first electrode of the first transistor T1 is electrically connected to the first initial signal line INIT1, and a second electrode of the first transistor T1 is electrically connected to a first electrode of the eighth transistor T8. A control electrode of the second transistor T2 is electrically connected to the second scanning signal line Gate2, a first electrode of the second transistor T2 is electrically connected to the first node N1, and a second electrode of the second transistor T2 is electrically connected to the third node N3. A control electrode of the fourth transistor T4 is electrically connected to the first scanning signal line Gate1, a first electrode of the fourth transistor T4 is electrically connected to the data signal line Data, and a second electrode of the fourth transistor T4 is electrically connected to the second node N2. A control electrode of the seventh transistor T7 is electrically connected to the reset signal line Reset, a first electrode of the seventh transistor T7 is electrically connected to the second initial signal line INIT2, and a second electrode of the seventh transistor T7 is electrically connected to the fourth node N4. A control electrode of the eighth transistor T8 is electrically connected to the first scanning signal line Gate1, and a second electrode of the eighth transistor T8 is electrically connected to the first node N1; One end of the first capacitor C1 is electrically connected to the first node N1, and the other end of the first capacitor C1 is electrically connected to the first power supply line VDD.

As shown in FIGS. 4 and 5, in an exemplary implementation mode, the storage sub-circuit may include a second capacitor C2. One end of the second capacitor C2 is electrically connected to the first power supply line VDD, and the other end of the second capacitor C2 is electrically connected to the second node N2.

As shown in FIG. 4, in an exemplary implementation mode, the node control sub-circuit may include a first transistor T1, a second transistor T2, a fourth transistor T4, a seventh transistor T7, and a first capacitor C1, the storage sub-circuit may include a second capacitor C2, the driving sub-circuit may include a third transistor T3, and the light emitting control sub-circuit may include a fifth transistor T5 and a sixth transistor T6. A control electrode of the first transistor T1 is electrically connected to the reset signal line Reset, a first electrode of the first transistor T1 is electrically connected to the first initial signal line INIT1, and a second electrode of the first transistor T1 is electrically connected to the first node N1. A control electrode of the second transistor T2 is electrically connected to the second scanning signal line Gate2, a first electrode of the second transistor T2 is electrically connected to the first node N1, and a second electrode of the second transistor T2 is electrically connected to the third node N3. A control electrode of the third transistor T3 is electrically connected to the first node N1, a first electrode of the third transistor T3 is electrically connected to the second node N2, and a second electrode of the third transistor T3 is electrically connected to the third node N3. A control electrode of the fourth transistor T4 is electrically connected to the first scanning signal line Gate1, a first electrode of the fourth transistor T4 is electrically connected to the data signal line Data, and a second electrode of the fourth transistor T4 is electrically connected to the second node N2. A control electrode of the fifth transistor T5 is electrically connected to the light emitting signal line EM, a first electrode of the fifth transistor T5 is electrically connected to the first power supply line VDD, and a second electrode of the fifth transistor T5 is electrically connected to the second node N2. A control electrode of the sixth transistor T6 is electrically connected to the light emitting signal line EM, a first electrode of the sixth transistor T6 is electrically connected to the third node N3, and a second electrode of the sixth transistor T6 is electrically connected to the fourth node N4. A control electrode of the seventh transistor T7 is electrically connected to the reset signal line Reset, a first electrode of the seventh transistor T7 is electrically connected to the second initial signal line INIT2, and a second electrode of the seventh transistor T7 is electrically connected to the fourth node N4. One end of the first capacitor C1 is electrically connected to the first power supply line VDD, and the other end of the first capacitor C1 is electrically connected to the first node N1. One end of the second capacitor C2 is electrically connected to the first power supply line VDD, and the other end of the second capacitor C2 is electrically connected to the second node N2.

Transistors may be divided into N-type transistors and P-type transistors according to their characteristics. When a transistor is a P-type transistor, its turn-on voltage is a low-level voltage (e.g., 0V, −5 V, −10 V, or another suitable voltage), and its turn-off voltage is a high-level voltage (e.g., 5 V, 10 V, or another suitable voltage). When a transistor is an N-type transistor, its turn-on voltage is a high-level voltage (e.g., 5 V, 10 V, or another suitable voltage), and its turn-off voltage is a low-level voltage (e.g., 0 V, −5 V, −10 V, or another suitable voltage).

In an exemplary implementation, the first transistor T1 to the seventh transistor T7 may be P-type transistors, or may be N-type transistors. Use of a same type of transistors in a pixel drive circuit may simplify a process flow, reduce a process difficulty of a display panel, and improve a product yield. In some possible implementations, the first transistor T1 to the seventh transistor T7 may include a P-type transistor and an N-type transistor.

In an exemplary implementation mode, for the first transistor T1 to the seventh transistor T7, low temperature poly-silicon thin film transistors may be used, or oxide thin film transistors may be used, or both a low temperature poly-silicon thin film transistor and an oxide thin film transistor may be used. An active layer of a low temperature poly-silicon thin film transistor may be made of Low Temperature Poly-Silicon (LTPS for short), and an active layer of an oxide thin film transistor may be made of an oxide semiconductor (Oxide). Low temperature poly-silicon thin film transistors have advantages such as high migration rate and fast charging, and oxide thin film transistors have advantages such as low leakage current. The low temperature poly-silicon thin film transistors and the oxide thin film transistors are integrated on one display substrate to form a low temperature polycrystalline oxide (LTPO) display substrate, so that the advantages of both the low temperature poly-silicon thin film transistors and the oxide thin film transistors can be utilized, low-frequency driving can be achieved, power consumption can be decreased, and display quality can be improved.

As shown in FIG. 5, in an exemplary implementation mode, the node control sub-circuit may include a first transistor T1, a second transistor T2, a fourth transistor T4, a seventh transistor T7, an eighth transistor T8, and a first capacitor C1, the storage sub-circuit may include a second capacitor C2, the driving sub-circuit may include a third transistor T3, and the light emitting control sub-circuit may include a fifth transistor T5 and a sixth transistor T6. A control electrode of the first transistor T1 is electrically connected to the reset signal line Reset, a first electrode of the first transistor T1 is electrically connected to the first initial signal line INIT1, and a second electrode of the first transistor T1 is electrically connected to a first electrode of the eighth transistor T8. A control electrode of the second transistor T2 is electrically connected to the second scanning signal line Gate2, a first electrode of the second transistor T2 is electrically connected to the first node N1, and a second electrode of the second transistor T2 is electrically connected to the third node N3. A control electrode of the third transistor T3 is electrically connected to the first node N1, a first electrode of the third transistor T3 is electrically connected to the second node N2, and a second electrode of the third transistor T3 is electrically connected to the third node N3. A control electrode of the fourth transistor T4 is electrically connected to the first scanning signal line Gate1, a first electrode of the fourth transistor T4 is electrically connected to the data signal line Data, and a second electrode of the fourth transistor T4 is electrically connected to the second node N2. A control electrode of the fifth transistor T5 is electrically connected to the light emitting signal line EM, a first electrode of the fifth transistor T5 is electrically connected to the first power supply line VDD, and a second electrode of the fifth transistor T5 is electrically connected to the second node N2. A control electrode of the sixth transistor T6 is electrically connected to the light emitting signal line EM, a first electrode of the sixth transistor T6 is electrically connected to the third node N3, and a second electrode of the sixth transistor T6 is electrically connected to the fourth node N4. A control electrode of the seventh transistor T7 is electrically connected to the reset signal line Reset, a first electrode of the seventh transistor T7 is electrically connected to the second initial signal line INIT2, and a second electrode of the seventh transistor T7 is electrically connected to the fourth node N4. A control electrode of the eighth transistor T8 is electrically connected to the first scanning signal line Gate1, and a second electrode of the eighth transistor T8 is electrically connected to the first node N1. One end of the first capacitor C1 is electrically connected to the first power supply line VDD, and the other end of the first capacitor C1 is electrically connected to the first node N1. One end of the second capacitor C2 is electrically connected to the first power supply line VDD, and the other end of the second capacitor C2 is electrically connected to the second node N2. In the present disclosure, by providing the eighth transistor, leakage of the first node N1 can be avoided and reliability of the pixel circuit can be improved.

In an exemplary implementation, the first transistor T1 to the eighth transistor T8 may be P-type transistors or N-type transistors. Use of a same type of transistors in a pixel drive circuit may simplify a process flow, reduce a process difficulty of a display panel, and improve a product yield. In some possible implementations, the first transistor T1 to the seventh transistor T7 may include a P-type transistor and an N-type transistor.

In an exemplary implementation, for the first transistor T1 to the eighth transistors T8, low temperature poly-silicon thin film transistors may be used, oxide thin film transistors may be used, or low temperature poly-silicon thin film transistors and oxide thin film transistors may be used. An active layer of a low temperature poly-silicon thin film transistor may be made of Low Temperature Poly-Silicon (LTPS for short), and an active layer of an oxide thin film transistor may be made of an oxide semiconductor (Oxide). Low temperature poly-silicon thin film transistors have advantages such as high migration rate and fast charging, and oxide thin film transistors have advantages such as low leakage current. The low temperature poly-silicon thin film transistors and the oxide thin film transistors are integrated on one display substrate to form a low temperature polycrystalline oxide (LTPO) display substrate, so that the advantages of both the low temperature poly-silicon thin film transistors and the oxide thin film transistors can be utilized, low-frequency driving can be achieved, power consumption can be decreased, and display quality can be improved.

In an exemplary embodiment, the third transistor T3 may be referred to as a drive transistor, and the third transistor T3 determines a drive current which flows between the first power supply line VDD and the second power supply line VSS according to a potential difference between the control electrode and the first electrode of the third transistor T3.

In an exemplary embodiment, the fifth transistor T5 and the sixth transistor T6 may be referred to as light emitting transistors. When a signal of the light emitting signal line EM is an effective level signal, the fifth transistor T5 and the sixth transistor T6 enable the light emitting device to emit light by forming a drive current path between the first power supply line VDD and the second power supply line VSS.

An exemplary structure of the node control sub-circuit, the storage sub-circuit, the driving sub-circuit and the light emitting control sub-circuit is shown in FIGS. 4 and 5. Those skills in that art can easily understand that implementation modes of the node control sub-circuit, the storage sub-circuit, the driving sub-circuit and the light emitting control sub-circuit are not limited thereto.

Figure 6:
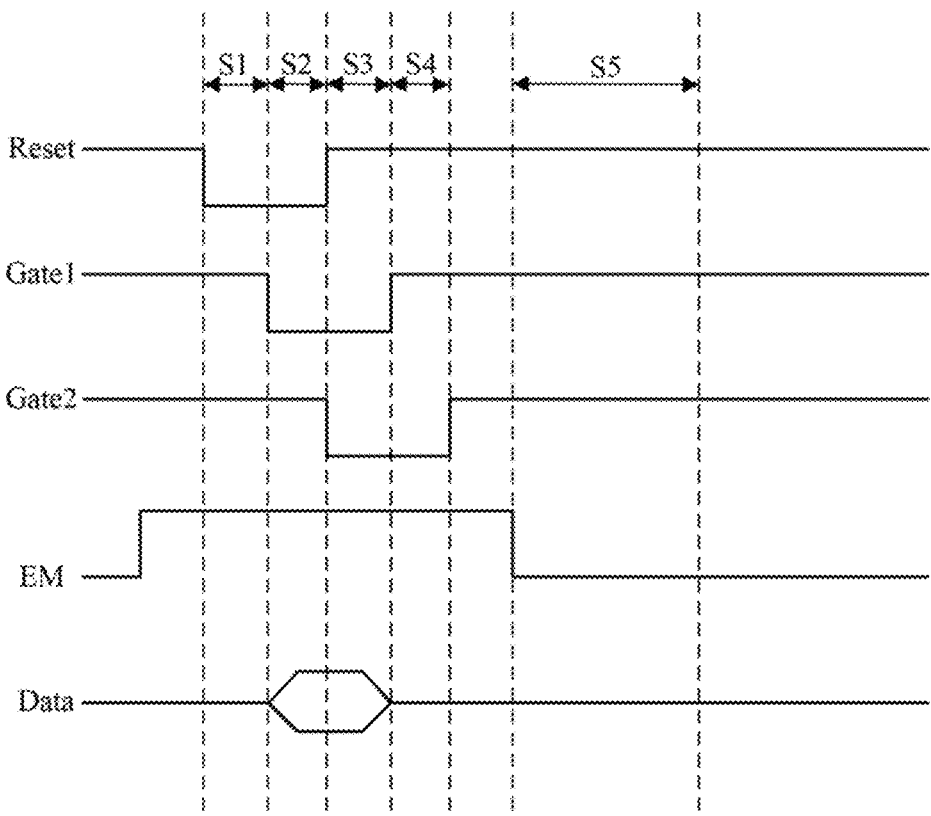
FIG. 6 is an operating timing diagram of a pixel circuit provided in FIGS. 4 and 5.

FIG. 6 is an operating timing diagram of a pixel circuit provided in FIGS. 4 and 5. FIG. 6 is illustrated by taking a case that all transistors in the pixel circuit are P-type transistors as an example.

In an exemplary implementation mode, the data signal line Data may output a data voltage in a second stage S2 and/or a third stage S3, and FIG. 6 is illustrated by taking a case that the data signal line Data outputs a data voltage in the second stage S2 and the third stage S3 as an example.

In an exemplary implementation mode, the display substrate on which the pixel circuit is located includes at least one gate driving circuit electrically connected to at least one signal line of the first scanning signal line, the second scanning signal line, the light emitting signal line, and the reset signal line. The gate driving circuit includes a plurality of shift registers, and when a cascade relationship exists between the plurality of shift registers, the data signal line Data may output a data voltage only in the third stage S3 or the second stage S2. The data signal line Data output the data voltage in the third stage S3 or the second stage S2, so that crosstalk between signals can be avoided and the display effect of the display substrate where the pixel circuit is located can be improved.

The operating process of the pixel circuit in FIG. 4 may include the following stages.

In a first stage S1, referred to as an initialization stage, a signal of the reset signal line Reset is a low-level signal, and signals of the first scanning signal line Gate1, the second scanning signal line Gate2 and the light emitting signal line EM are high-level signals. The reset signal line Reset is the low-level signal, so that the first transistor T1 and the seventh transistor T7 are turned on, a signal of the first initial signal line INIT1 is written into the first node N1 through the turned-on first transistor T1 to initialize (reset) the first node N1 and clear a pre-stored voltage inside the first node N1 so as to complete initialization, and a signal of the second initial signal line INIT2 is written into the fourth node N4 through the turned-on seventh transistor T7 to initialize (reset) the fourth node N4 and clear a pre-stored voltage inside the first node N1 so as to complete initialization. The signals of the first scanning signal line Gate1, the second scanning signal line Gate2 and the light emitting signal line EM are high-level signals, so that the second transistor T2, the fourth transistor T4, the fifth transistor T5, the sixth transistor T6 and the seventh transistor T7 are turned off. The light emitting device L does not emit light in this stage.

In a second stage S2, referred to as a charging stage, signals of the reset signal line Reset and the first scanning signal line Gate1 are low-level signals, signals of the second scanning signal line Gate2 and the light emitting signal line EM are high-level signals, and the data signal line Data outputs a data voltage. The reset signal line Reset is a low-level signal, the first transistor T1 and the seventh transistor T7 are continuously turned on. A signal of the first initial signal line INIT1 is written into the first node N1 through the turned-on first transistor T1, to continuously initialize (reset) the first node N1, clear a pre-stored voltage inside the first node N1 so as to complete initialization. A signal of the second initial signal line INIT2 is written into the fourth node N4 through the turned-on seventh transistor T7, to continuously initialize (reset) the fourth node N4, to clear a pre-stored voltage inside the fourth node N4 so as to complete initialization. A signal of the first scanning signal line Gate1 is a low-level signal, the fourth transistor T4 is turned on, so that a signal of the data signal line Data is written into the second node N2 through the turned-on fourth transistor T4 to charge the second capacitor C2. Signals of the second scanning signal line Gate2 and the light emitting signal line EM are high-level signals, so that the second transistor T2, the fifth transistor T5 and the sixth transistor T6 and the seventh transistor T7 are turned off, and the light emitting device L does not emit light in this stage.

In the third stage S3, referred to as a data writing stage, the signals of the first scanning signal line Gate1 and the second scanning signal line Gate2 are low-level signals, the signals of the reset signal line Reset and the light emitting signal line EM are high-level signals, and the data signal line Data outputs a data voltage. A signal of the first node N1 is a low-level signal, so that the third transistor T3 is turned on. The signals of the first scanning signal line Gate1 and the second scanning signal line Gate2 are the low-level signals, so that the second transistor T2 and the fourth transistor T4 are turned on, the data voltage output by the data signal line Data charges the first node N1, and the data voltage output by the data signal line Data is written into the first node N1 through the turned-on fourth transistor T4, the second node N2, the turned-on third transistor T3 and the third node N3, and the turned-on second transistor T2. The signals of the reset signal line Reset and the light emitting signal line EM are the high-level signals, so that the first transistor T1, the fifth transistor T5, the sixth transistor T6 and the seventh transistor T7 are turned off. In this stage, the voltage of the first node N1 is less than Vd−|Vth|, the third transistor T3 is continuously turned on, and the light emitting device L does not emit light.

In a fourth stage S4, referred to as a discharge stage, the signal of the second scanning signal line Gate2 is a low-level signal, and the signals of the first scanning signal line Gate1, the reset signal line Reset, and the light emitting signal line EM are high-level signals. The third transistor T3 is continuously turned on. The signal of the second scanning signal line Gate2 is the low-level signal, so that the fourth transistor T4 is continuously turned on, and the second capacitor C2 continues to charge the first node N1. A signal of the second node N2 is supplied to the first node N1 through the turned-on third transistor T3, the third node N3 and the turned-on second transistor T2 until the voltage of the first node N1 is Vd−|Vth|, where Vd is the data voltage output by the data signal line Data, and Vth is a threshold voltage of the third transistor T3. The signals of the first scanning signal line Gate1, the reset signal line Reset, and the light emitting signal line EM are the high-level signals, so that the first transistor T1, the fourth transistor T4, the fifth transistor T5, the sixth transistor T6, and the seventh transistor T7 are turned off. The light emitting device L does not emit light in this stage.

In a fifth stage S5, referred to as a light emitting stage, the signal of the light emitting signal line EM is a low-level signal, and the signals of the first scanning signal line Gate1, the second scanning signal line Gate2 and the reset signal line are high-level signals. The signals of the first scanning signal line Gate1, the second scanning signal line Gate2 and the reset signal line are the high-level signals, so that the first transistor T1, the second transistor T2, the fourth transistor T4 and the seventh transistor T7 are turned off. The signal of the light emitting signal line EM is the low-level signal, the fifth transistor T5 and the sixth transistor T6 are turned on, and a power supply voltage output from the first power supply line VDD provides a driving voltage to a first electrode of the light emitting device L through the turned-on fifth transistor T5, the second node N2, the third transistor T3, the third node N3, the turned-on sixth transistor T6 and the fourth node N4, so as to drive the light emitting device L to emit light.

In a driving process of the pixel circuit, a drive current flowing through the third transistor T3 (drive transistor) is determined by a voltage difference between a control electrode and a first electrode of the third transistor T3. Since the voltage of the first node N1 is Vd-|Vth|, the drive current of the third transistor T3 is as follows:

$$I = K * (Vgs - Vth)^2 = K * [(Vdd - Vd + |Vth|) - Vth]^2 = K * [(Vdd - Vd]^2$$

Herein, I is the drive current flowing through the third transistor T3, that is, a drive current driving the light emitting device L, K is a constant, Vgs is the voltage difference between the control electrode and the first electrode of the third transistor T3, and Vdd is the power supply voltage output by the first power supply line VDD.

In the present disclosure, by providing the second capacitor C2, the first node N1 can be continuously charged in the fourth stage S4 after the third stage, that is, the data writing stage, thereby prolonging the charging time for the first node N1 and effectively solving the technical problem of insufficient charging of the pixel circuit.

In an exemplary implementation mode, as shown in FIGS. 5 and 6, the operating process of the pixel circuit of FIG. 5 may the following stages.

In a first stage S1, referred to as an initialization stage, a signal of the reset signal line Reset is a low-level signal, and signals of the first scanning signal line Gate1, the second scanning signal line Gate2 and the light emitting signal line EM are high-level signals. The reset signal line Reset is the low-level signal, so that the first transistor T1 and the seventh transistor T7 are turned on, a signal of the second initial signal line INIT2 is written into the fourth node N4 through the turned-on seventh transistor T7, to initialize (reset) the fourth node N4, and clear a pre-stored voltage inside the fourth node N4, so as to complete initialization. The signals of the first scanning signal line Gate1, the second scanning signal line Gate2 and the light emitting signal line EM are the high-level signals, so that the second transistor T2, the fourth transistor T4, the fifth transistor T5, the sixth transistor T6, the seventh transistor T7 and the eighth transistor T8 are turned off. The light emitting device L does not emit light in this stage.

In a second stage S2, referred to as a charging stage, signals of the reset signal line Reset and the first scanning signal line Gate1 are low-level signals, signals of the second scanning signal line Gate2 and the light emitting signal line EM are high-level signals, and the data signal line Data outputs a data voltage. The signal of the reset signal line Reset is the low-level signal, so that the first transistor T1 and the seventh transistor T7 are continuously turned on, the signal of the first scanning signal line Gate1 is the low-level signal, so that the eighth transistor T8 is turned on. A signal of the first initial signal line INIT1 is written into the first node N1 through the turned-on first transistor T1 and the turned-on eighth transistor T8, to continuously initialize (reset) the first node N1 and clear a pre-stored voltage inside the first node N1, so as to complete initialization. A signal of the second initial signal line INIT2 is written into the fourth node N4 through the turned-on seventh transistor T7, to continuously initialize (reset) the fourth node N4, and clear a pre-stored voltage inside the fourth node N4, so as to complete initialization. The signal of the first scanning signal line Gate1 is the low-level signal, so that the fourth transistor T4 is turned on, and a signal of the data signal line Data is written into the second node N2 through the turned-on fourth transistor T4, so as to charge the second capacitor C2. The signals of the second scanning signal line Gate2 and the light emitting signal line EM are the high-level signals, so that the second transistor T2, the fifth transistor T5 and the sixth transistor T6 and the seventh transistor T7 are turned off. In this stage, the light emitting device L does not emit light.

In a third stage S3, referred to as a data writing stage, signals of the first scanning signal line Gate1 and the second scanning signal line Gate2 are low-level signals, signals of the reset signal line Reset and the light emitting signal line EM are high-level signals, and the data signal line Data outputs a data voltage. A signal of the first node N1 is a low-level signal, so that the third transistor T3 is turned on. The signals of the first scanning signal line Gate1 and the second scanning signal line Gate2 are the low-level signals, so that the second transistor T2, the fourth transistor T4 and the eighth transistor T8 are turned on, the data voltage output by the data signal line Data charges the first node N1, and the data voltage output by the data signal line Data is written into the first node N1 through the turned-on fourth transistor T4, the second node N2, the turned-on third transistor T3 and the third node N3, and the turned-on second transistor T2. The signals of the reset signal line Reset and the light emitting signal line EM are the high-level signals, so that the first transistor T1, the fifth transistor T5, the sixth transistor T6 and the seventh transistor T7 are turned off. In this stage, a voltage of the first node N1 is less than Vd-|Vth|, the third transistor T3 is continuously turned on, and the light emitting device L does not emit light.

In a fourth stage S4, referred to as a discharge stage, the signal of the second scanning signal line Gate2 is a low-level signal, and the signals of the first scanning signal line Gate1, the reset signal line Reset, and the light emitting signal line EM are high-level signals. The third transistor T3 is continuously turned on. The signal of the second scanning signal line Gate2 is the low-level signal, so that the fourth transistor T4 is continuously turned on, the second capacitor C2 continues to charge the first node N1, a signal of the second node N2 is supplied to the first node N1 through the turned-on third transistor T3, the third node N3 and the turned-on second transistor T2 until the voltage of the first node N1 is Vd-|Vth|, Vd is the data voltage output by the data signal line Data, and Vth is a threshold voltage of the third transistor T3. The signals of the first scanning signal line Gate1, the reset signal line Reset and the light emitting signal line EM are the high-level signals, so that the first transistor T1, the fourth transistor T4, the fifth transistor T5, the sixth transistor T6, the seventh transistor T7 and the eighth transistor T8 are turned off. The light emitting device L does not emit light in this stage.

In a fifth stage S5, referred to as a light emitting stage, the signal of the light emitting signal line EM is a low-level signal, and the signals of the first scanning signal line Gate1, the second scanning signal line Gate2 and the reset signal line are high-level signals. The signals of the first scanning signal line Gate1, the second scanning signal line Gate2 and the reset signal line are the high-level signals, so that the first transistor T1, the second transistor T2, the fourth transistor T4 and the seventh transistor T7 are turned off. The signal of the light emitting signal line EM is the low-level signal, so that the fifth transistor T5 and the sixth transistor T6 are turned on, and a power supply voltage output from the first power supply line VDD provides a driving voltage to a first electrode of the light emitting device L through the turned-on fifth transistor T5, the second node N2, the third transistor T3, the third node N3, the turned-on sixth transistor T6 and the fourth node N4, so as to drive the light emitting device L to emit light.

In a driving process of the pixel circuit, a drive current flowing through the third transistor T3 (drive transistor) is determined by a voltage difference between a control electrode and a first electrode of the third transistor T3. Since the voltage of the first node N1 is Vd−|Vth|, the drive current of the third transistor T3 is as follows:

$$I=K*(Vgs-Vth)^2=K*[(Vdd-Vd+|Vth|)-Vth]^2=K*[(Vdd-Vd]^2$$

Herein, I is the drive current flowing through the third transistor T3, that is, a drive current driving the light emitting device L, K is a constant, Vgs is the voltage difference between the control electrode and the first electrode of the third transistor T3, and Vdd is the power supply voltage output by the first power supply line VDD.

In the present disclosure, by providing the second capacitor C2, the first node N1 can be continuously charged in the fourth stage S4 after the third stage, i.e., the data writing stage, thereby prolonging charging time for the first node N1 and effectively solving the technical problem of insufficient charging of the pixel circuit, and improving the display effect of the display product.

An embodiment of the present disclosure further provides a display substrate. FIG. 7 is a first schematic structural diagram of a display substrate according to an embodiment of the present disclosure, and FIG. 8 is a second schematic structural diagram of a display substrate according to an embodiment of the present disclosure. As shown in FIGS. 7 and 8, the display substrate may include a base substrate and a drive circuit layer and a light emitting structure layer provided sequentially on the base substrate. The drive circuit layer includes a pixel circuit, a plurality of first initial signal lines INIT1, a plurality of second initial signal lines INIT2, a plurality of first scanning signal lines Gate1, a plurality of second scanning signal lines Gate2, a plurality of reset signal lines Reset, a plurality of first power supply lines VDD and a plurality of data signal lines Data. The light emitting structure layer includes a light emitting device. FIG. 7 is illustrated by taking a case that the display substrate includes the pixel circuit provided in FIG. 4 as an example and FIG. 8 is illustrated by taking a case that the display substrate includes the pixel circuit provided in FIG. 5 as an example.

The pixel circuit is the pixel circuit according to any one of the foregoing embodiments, and the implementation principle and implementation effects are similar, which will not be repeated here.

In an exemplary implementation mode, the display substrate may further include an encapsulation structure layer disposed on a side of the light emitting structure layer away from the base substrate. The display substrate may include other film layers such as a touch structure layer, which is not limited here in the present disclosure.

In an exemplary implementation mode, on a plane parallel to the display substrate, the display substrate may include multiple sub-pixels, at least one of which may include a pixel circuit and a light emitting device. The pixel circuit is configured to output a corresponding current to the connected light emitting device so that the light emitting device emits light of a corresponding brightness.

In an exemplary implementation mode, the multiple sub-pixels may include multiple pixel rows and multiple pixel columns. The multiple sub-pixels sequentially arranged along a horizontal direction are referred to as a row of pixels, and multiple sub-pixels sequentially arranged along a vertical direction are referred to as a column of pixels. The multiple rows of pixels and the multiple columns of pixels constitute a pixel array arranged in an array.

In an exemplary implementation mode, the multiple sub-pixels constitute a pixel unit, and the pixel unit may include a first sub-pixel, a second sub-pixel, and a third sub-pixel, or a first sub-pixel, a second sub-pixel, a third sub-pixel, and a fourth sub-pixel.

In an exemplary implementation mode, when the pixel unit includes a first sub-pixel, a second sub-pixel, and a third sub-pixel, the first sub-pixel may be a red sub-pixel (R) that emits red light, the second sub-pixel may be a blue sub-pixel (B) that emits blue light, the third sub-pixel P3 may be a green sub-pixel (G) that emits green light, and a shape of the three sub-pixels may be triangular, rectangular, diamond, pentagonal, hexagonal, etc., which is not limited here in the present disclosure. In a direction of the row of pixels, the first sub-pixel, the second sub-pixel, and the third sub-pixel may be sequentially arranged in an alignment manner, and in a direction of the column of pixels, the first sub-pixel, the second sub-pixel, and the third sub-pixel may be sequentially arranged in a misaligned manner to form a layout of the sub-pixels in a delta-shaped arrangement. For example, the first sub-pixel in an odd-numbered row may be located between its adjacent second sub-pixel and third sub-pixel in even-numbered rows, or the first sub-pixel in an even-numbered row may be located between its adjacent second sub-pixel and third sub-pixel in odd-numbered rows. As another example, the second sub-pixel in an odd-numbered row may be located between its adjacent first sub-pixel and third sub-pixel in even-numbered rows, or the second sub-pixel in an even-numbered row may be located between its adjacent first sub-pixel and third sub-pixel in odd-numbered rows. As another example, the third sub-pixel in an odd-numbered row may be located between its adjacent first sub-pixel and second sub-pixel in even-numbered rows, or the third sub-pixel in an even-numbered row may be located between its adjacent first sub-pixel and second sub-pixel in odd-numbered rows.

In an exemplary implementation mode, when the pixel unit includes a first sub-pixel, a second sub-pixel, a third sub-pixel, and a fourth sub-pixel, the first sub-pixel may be a red sub-pixel (R) emitting red light, the second sub-pixel may be a blue sub-pixel (B) emitting blue light, the third sub-pixel and the fourth sub-pixel may each be a green sub-pixel (G) emitting green light, and a shape of the four sub-pixels may be triangular, rectangular, diamond, pentagonal, hexagonal, etc., which is not limited here in the present disclosure. In an exemplary implementation mode, the four sub-pixels may be arranged side by side horizontally, side by side vertically, or in a manner of forming a square, which is not limited here in the present disclosure. The four sub-pixels may be arranged in a manner of square to form a GGRB pixel arrangement. In another exemplary implementation, the four sub-pixels may be arranged in a manner of forming a diamond to form an RGGB pixel arrangement.

In an exemplary implementation mode, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer, and it can be ensured that external moisture cannot enter the light emitting structure layer.

In an exemplary implementation mode, the display substrate may be a Low Temperature Poly-Silicon (LTPS for short) display substrate or a Low Temperature Polycrystalline Oxide (LTPO for short) display substrate.

In an exemplary embodiment, the base substrate may be a rigid substrate or a flexible substrate, wherein the rigid substrate may be, but is not limited to, one or more of glass and conductive foil. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. In an exemplary embodiment, the light emitting structure layer includes an anode layer, a pixel definition layer, an organic structure layer, and a cathode layer that are sequentially stacked on the base substrate. The anode layer includes an anode, the organic structure layer includes an organic light emitting layer, and the cathode layer includes a cathode.

In an exemplary implementation mode, the drive circuit layer includes a semiconductor layer, a first insulation layer, a first conductive layer, a second insulation layer, a second conductive layer, a third insulation layer, a third conductive layer, a fourth insulation layer and a fourth conductive layer that are sequentially stacked on the base substrate. The pixel circuit includes a plurality of transistors, a first capacitor and a second capacitor, and each of the first capacitor and the second capacitor includes a first plate and a second plate.

The semiconductor layer at least includes active layers of the plurality of transistors and the first plate of the second capacitor.

The first conductive layer at least includes a reset signal line, a light emitting signal line, control electrodes of the plurality of transistors, and the first plate of the first capacitor.

The second conductive layer at least includes a second initial signal line, the second plate of the first capacitor and the second plate of the second capacitor.

The third conductive layer at least includes: a first scanning signal line and a second scanning signal line.

The fourth conductive layer at least includes a first initial signal line, a first power supply line and a data signal line.

In an exemplary implementation mode, the pixel circuit includes a first transistor to a seventh transistor, and the active layer of each transistor may include a first region, a second region, and a channel region between the first region and the second region.

A length of the first region of the active layer of the third transistor in a first direction is greater than a length of the second region of the active layer of the third transistor in the first direction, and the first region of the active layer of the third transistor is also used as the first plate of the second capacitor.

In an exemplary implementation mode, for a same pixel circuit, the second plate of the first capacitor is connected to the second plate of the second capacitor, and the second plate of the second capacitor of a pixel circuit of the N-th column is connected to the second plate of the first capacitor of a pixel circuit of the (N+1)-th column located in a same row.

A length of the second plate of the first capacitor in a second direction is smaller than a length of the second plate of the second capacitor in the second direction, and the first direction and the second direction intersect.

In an exemplary implementation mode, the second plate of the second capacitor includes: a capacitor main body portion extending in the second direction and a first connection block and a second connection block extending in the first direction. The first connection block and the second connection block are respectively connected to the capacitor main body portion, the first connection block and the second connection block are arranged in parallel and are on a side of the capacitor main body portion away from the second plate of the first capacitor.

An orthographic projection of the capacitor main body portion on the base substrate at least partially overlaps with an orthographic projection of the first plate of the second capacitor on the base substrate. An orthographic projection of the first connection block on the base substrate partially overlaps with an orthographic projection of an active layer of second transistor between control electrodes of the second transistor on the base substrate. An orthographic projection of the second connection block on the base substrate partially overlaps with an orthographic projection of an active layer of the third transistor on the base substrate;

For a same pixel circuit, the second plate of the first capacitor is connected to the capacitor main body portion, and the second connection block of a pixel circuit of the N-th column is connected to the second plate of the first capacitor of a pixel circuit of the (N+1)-th column in a same row.

In an exemplary implementation mode, a length of the first power supply line in the first direction is greater than a length of the data signal line in the first direction and greater than a length of the first initial signal line in the first direction, and a length of the first initial signal line in the first direction is greater than the length of the data signal line in the first direction.

In an exemplary implementation mode, the drive circuit layer includes: a shield layer, a first insulation layer, a semiconductor layer, a second insulation layer, a first conductive layer, a third insulation layer, a second conductive layer, a fourth insulation layer, a third conductive layer, a fifth insulation layer, and a fourth conductive layer. The pixel circuit includes: a plurality of transistors, a first capacitor and a second capacitor. The first capacitor includes a first plate and a second plate, and the second capacitor includes a first plate, a second plate, and a third plate.

The shield layer at least includes the first plate of the second capacitor, and the shield layer is configured to transmit a high-voltage power supply signal.

The semiconductor layer at least includes active layers of the plurality of transistors, the second plate of the second capacitor, a first initial signal line and a second initial signal line.

The first conductive layer at least includes a light emitting signal line, control electrodes of the plurality of transistors and the first plate of the first capacitor.

The second conductive layer at least includes the second plate of the first capacitor and the third plate of the second capacitor.

The third conductive layer at least includes two reset signal lines, a first scanning signal line and a second scanning signal line.

The fourth conductive layer at least includes a first power supply line and a data signal line.

In an exemplary implementation mode, the plurality of transistors include: a first transistor to an eighth transistor, and the shield layer further includes: a first shield structure, a second shield structure, a first shield connection structure, a second shield connection structure, a third shield connection structure, and a fourth shield connection structure, and the first plate of the second capacitor is also used as the second shield structure.

The first shield connection structure and the second shield structure are respectively on opposite sides of the first shield structure and is connected to the first shield structure. The second shield connection structure is on a side of the second shield structure away from the first shield structure and is connected to the second shield structure. The third shield connection structure and the fourth shield connection structure are respectively on the other two opposite sides of the first shield structure, and the third shield connection structure is connected to the second shield structure and the fourth shield connection structure is connected to the first shield structure.

An orthographic projection of the first shield structure on the base substrate at least partially overlaps with an orthographic projection of a channel region of the active layer of the third transistor on the base substrate. An orthographic projection of the second shield structure on the base substrate at least partially overlaps with an orthographic projection of the second plate of the second capacitor on the base substrate. An orthographic projection of the third shield connection structure on the base substrate at least partially overlaps with an orthographic projection of the active layer of the first transistor on the base substrate. An orthographic projection of the fourth shield connection structure on the base substrate at least partially overlaps with an orthographic projection of the active layer of the seventh transistor on the base substrate.

In an exemplary implementation mode, the second shield structure of a sub-pixel of the N-th column is on a side of the first shield structure of the sub-pixel of the N-th column close to the first shield structure of a sub-pixel of the (N+1)-th column in a same row. The first shield connection structure of a sub-pixel of the N-th column is on a side of the first shield structure of the sub-pixel of the N-th column close to the first shield structure of a sub-pixel of the (N−1)-th column in a same row and is connected to the fourth shield connection structure of the sub-pixel of the (N−1)-th column. The second shield connection structure of a sub-pixel of the N-th column is connected to the first shield connection structure of a sub-pixel of the (N+1)-th column in a same row. The third shield connection structure of a sub-pixel of the M-th row is on a side of the first shield structure 11 of the sub-pixel of the M-th row close to the first shield structure of a sub-pixel of the (M−1)-th row located in a same column and is connected to the fourth shield connection structure of the sub-pixel of the (M−1)-th row. The fourth shield connection structure of a sub-pixel of the M-th row is on a side of the first shield structure of the sub-pixel of the M-th row close to the first shield structure of a sub-pixel of the (M+1)-th row located in a same column and is connected to the fifth shield connection structure of the sub-pixel of the (M+1)-th row.

In an exemplary implementation mode, for a same sub-pixel, the second plate of the first capacitor and the third plate of the second capacitor are connected to each other.

For sub-pixels of a same row, the third plate of the second capacitor of a sub-pixel of the N-th column is located at the second plate of the first capacitor of the sub-pixel of the N-th column close to the second plate of the first capacitor of a sub-pixel of the (N+1)-th column, and is connected to the second plate of the first capacitor of the sub-pixel of the (N+1)-th column.

A length of the second plate of the first capacitor in the second direction is smaller than a length of the third plate of the second capacitor in the second direction.

Exemplary description is made below through a manufacturing process of a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition. The coating may be any one or more of spray coating, spin coating, and inkjet printing. A "thin film" refers to a layer of thin film made of a certain material on a base substrate using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are disposed in a same layer" in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or the boundary of the orthographic projection of A coincides with the boundary of the orthographic projection of B.

A manufacturing process of the display substrate provided in FIG. 7 is explained below in terms of pixel circuits with one row and two columns. A manufacturing process of a display substrate according to an exemplary embodiment may include:

(1) A pattern of a semiconductor layer is formed on a base substrate. In an exemplary implementation mode, forming the pattern of the semiconductor layer may include sequentially depositing a semiconductor thin film on a base substrate, patterning the semiconductor thin film using a patterning process to form the pattern of the semiconductor layer, as shown in FIG. 9. FIG. 9 is a schematic diagram of the display substrate provided in FIG. 7 after the pattern of the semiconductor layer is formed.

In an exemplary implementation mode, as shown in FIG. 9, the pattern of the semiconductor layer of each sub-pixel may at least include an active layer T11 of a first transistor to an active layer T71 of a seventh transistor.

In an exemplary implementation mode, as shown in FIG. 9, the active layer T11 of the first transistor to the active layer T61 of the sixth transistor are interconnected to form an integral structure.

In an exemplary implementation mode, as shown in FIG. 9, in a first direction X, the active layer T21 of the second transistor and the active layer T61 of the sixth transistor may be on a same side of the active layer T31 of the third transistor in the present sub-pixel. The active layer T41 of the fourth transistor and the active layer T51 of the fifth transistor may be on a same side of the active layer T31 of the third transistor in the present sub-pixel. The active layer T21 of the second transistor and the active layer T41 of the fourth transistor may be on different sides of the active layer T31 of the third transistor in the present sub-pixel. In the second direction Y, the active layer T11 of the first transistor, the active layer T21 of the second transistor, the active layer T41 of the fourth transistor and the active layer T71 of the seventh transistor may be disposed on a same layer as the active layer T31 of the third transistor in the present sub-pixel, and the active layer T51 of the fifth transistor and the active layer T61 of the sixth transistor may be on the other side of the active layer T31 of the third transistor in the present sub-pixel.

In an exemplary implementation mode, as shown in FIG. 9, the active layer T11 of the first transistor may be in a shape of an "n", the active layer T21 of the second transistor may be in a shape of an "L", the active layer T31 of the third transistor may be in a shape of an "Q", and the active layer T41 of the fourth transistor, the active layer T51 of the fifth transistor, the active layer T61 of the sixth transistor, and the active layer T71 of the seventh transistor may be in a shape of an "I".

In an exemplary implementation mode, as shown in FIG. 9, an active layer of each transistor may include a first region, a second region and a channel region between the first region and the second region. In an exemplary implementation mode, a second region T11_2 of the active layer T11 of the first transistor may serve as a first region T21_1 of the active layer T21 of the second transistor. A first region T31_1 of the active layer T31 of the third transistor may simultaneously serve as a second region T41_2 of the active layer T41 of the fourth transistor and a second region T51_2 of the active layer T51 of the fifth transistor. A second region T31_2 of the active layer T31 of the third transistor may simultaneously serve as a second region T21_2 of the active layer T21 of the second transistor and a first region T61_1 of the active layer T61 of the sixth transistor. A second region T61_2 of the active layer t61 of the sixth transistor may serve as a second region T71_2 of the active layer T71 of the seventh transistor. A first region T11_1 of the active layer T11 of the first transistor, a first region T41_1 of the active layer T41 of the fourth transistor, a first region T51_1 of the active layer T51 of the fifth transistor and a first region T71_1 of the active layer T71 of the seventh transistor may be provided separately.

In an exemplary implementation mode, as shown in FIG. 9, the first region T31_1 of the active layer T31 of the third transistor (also the second region T41_2 of the active layer T41 of the fourth transistor and the second region T51_2 of the active layer T51 of the fifth transistor) may be in a shape of a strip extending in the second direction Y, and have a length in the first direction X greater than a length of the first region T41_1 of the active layer T41 of the fourth transistor and a length of the first region T51_1 of the active layer T51 of the fifth transistor in the first direction X.

Figure 10:
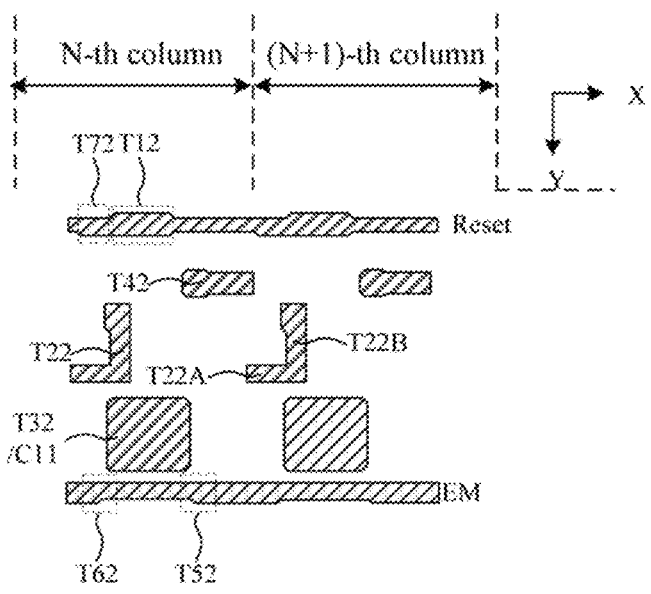
FIG. 10 is a schematic diagram of a pattern of a first conductive layer of the display substrate provided in FIG. 7.
Figure 11:
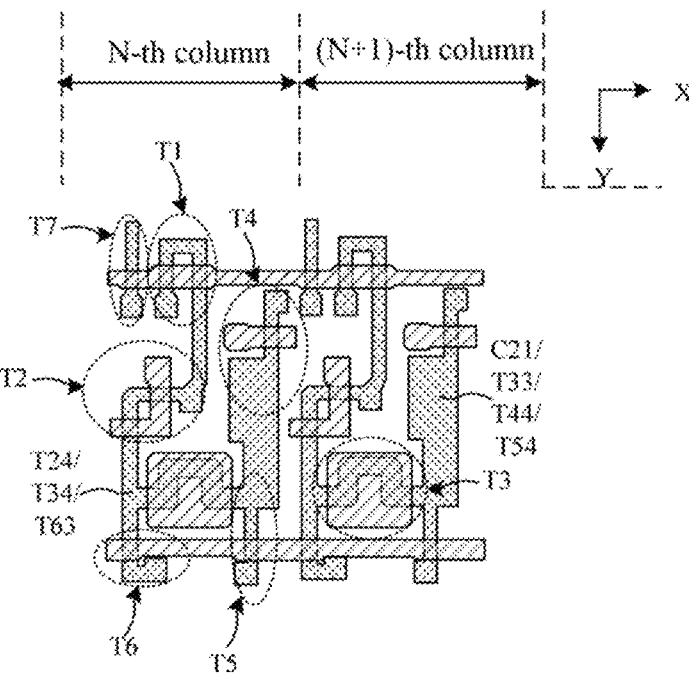
FIG. 11 is a schematic diagram of the display substrate provided in FIG. 7 after the pattern of the first conductive layer is formed.

(2) A pattern of a first conductive layer is formed. In an exemplary implementation mode, forming the pattern of the first conductive layer may include sequentially depositing a first insulation thin film and a first conductive thin film on the base substrate on which the above-mentioned patterns are formed, patterning the first conductive thin film using a patterning process to form a first insulation layer covering the pattern of the semiconductor layer, and the pattern of the first conductive layer on the first insulation layer, as shown in FIGS. 10 and 11. FIG. 10 is a schematic diagram of a pattern of a first conductive layer of the display substrate provided in FIG. 7, and FIG. 11 is a schematic diagram of the display substrate provided in FIG. 7 after the pattern of the first conductive layer is formed.

In an exemplary implementation mode, the first conductive layer may be referred to as a first gate metal (GATE1) layer.

In an exemplary implementation mode, the pattern of the first conductive layer of each sub-pixel may at least include a reset signal line Reset, a light emitting signal line EM, a control electrode T12 of the first transistor to a control electrode T72 of the seventh transistor, and a first plate C11 of the first capacitor.

In an exemplary implementation mode, as shown in FIGS. 10 and 11, the first plate C11 of the first capacitor may be rectangular, corners of the rectangle may be provided with chamfers, and an orthographic projection of the first plate C11 of the first capacitor on the base substrate at least partially overlaps with an orthographic projection of the active layer of the third transistor T3 on the base substrate. In an exemplary implementation mode, the first plate C11 of the first capacitor may simultaneously serve as a control electrode T32 of the third transistor T3.

In an exemplary implementation mode, as shown in FIGS. 10 and 11, the reset signal line Reset may be in a shape of a line extending in the first direction X, and the reset signal line Reset may be on a side of the first plate C11 of the first capacitor away from the light emitting signal line EM. A region where the reset signal line Reset overlaps with the active layer of the first transistor T1 serves as a control electrode T12 of the first transistor, and a region where the reset signal line Reset overlaps with the active layer of the seventh transistor serves as the control electrode T72 of the seventh transistor. Since the active layer T11 of the first transistor may be in a shape of an "n", there are two regions where the reset signal line Reset overlaps with the active layer of the first transistor, that is, the first transistor has two control electrodes T12, and the first transistor has a double-gate structure.

In an exemplary implementation mode, the light emitting signal line EM may be in a shape of a line extending in the first direction X, a region where the light emitting signal line EM overlaps with the active layer of the fifth transistor T5 serves as a control electrode T52 of the fifth transistor T5, and a region where the light emitting signal line EM overlaps with the active layer of the sixth transistor T6 serves as a control electrode T62 of the sixth transistor T6.

In an exemplary implementation mode, as shown in FIGS. 10 and 11, a control electrode T22 of the second transistor T2 and a control electrode T42 of the fourth transistor T4 may be on a side of the first plate C11 of the first capacitor close to the reset signal line Reset, and the control electrode T42 of the fourth transistor of the present sub-pixel may be on a side of the control electrode T22 of the second transistor T2 of the present sub-pixel close to a control electrode T22 of a second transistor T2 of a sub-pixel in an adjacent column.

In an exemplary implementation mode, as shown in FIGS. 10 and 11, the control electrode T22 of the second transistor may include a first electrode connection portion T22A and a second electrode connection portion T22B, and the first electrode connection portion T22A is on a side of the second electrode connection portion T22B away from the control electrode T42 of the fourth transistor. The first electrode connection portion T22A is in a shape of a line extending in the first direction X, and the second electrode connection portion T22B is in a shape of a line extending in the second direction Y. Orthographic projections of the first electrode connection portion T22A and the second electrode connection portion T22B on the base substrate overlap with an orthographic projection of the active layer of the second transistor on the base substrate, therefore, there are two regions where the control electrode T22 of the second transistor overlaps with the active layer T21 of the second transistor, that is, the second transistor has two control electrodes T22, and the second transistor has a double-gate structure.

In an exemplary implementation mode, the control electrode T42 of the fourth transistor may be in a shape of a line extending in the first direction X.

In an exemplary implementation mode, the reset signal line Reset and the light emitting signal line EM may be in a design of equal width, or may be in design of non-equal widths, may be straight lines, or may be bend lines, which may not only facilitate layout of the pixel structure, but also reduce a parasitic capacitance between the signal lines, which is not limited here in the present disclosure.

In an exemplary implementation mode, after the pattern of the first conductive layer is formed, the semiconductor layer may be subjected to a conductorization treatment by using the first conductive layer as a shield. A region of the semiconductor layer, which is shielded by the first conductive layer, forms channel regions of the first transistor T1 to the seventh transistor T7. The region of the semiconductor layer, which is not shielded by the first conductive layer, is made to be conductorized, i.e., the first regions and the second regions of the active layer of the first transistor to the active layer of the seventh transistor are all made to be conductorized, and the first region of the active layer of the third transistor after conductorization (also the second region of the active layer of the fourth transistor and the second region of the active layer of the fifth transistor) can be used as a first electrode T33 of the third transistor, a second electrode T44 of the fourth transistor, a second electrode T54 of the fifth transistor and the first plate C21 of the second capacitor at the same time. The second region T31_2 of the active layer T31 of the third transistor after conductorization (which is also the second region T21_2 of the active layer T21 of the second transistor and the first region T61_1 of the active layer T61 of the sixth transistor) also serves as a second electrode T24 of the second transistor, a second electrode T34 of the third transistor and a first electrode T63 of the sixth transistor at the same time.

Figure 12:
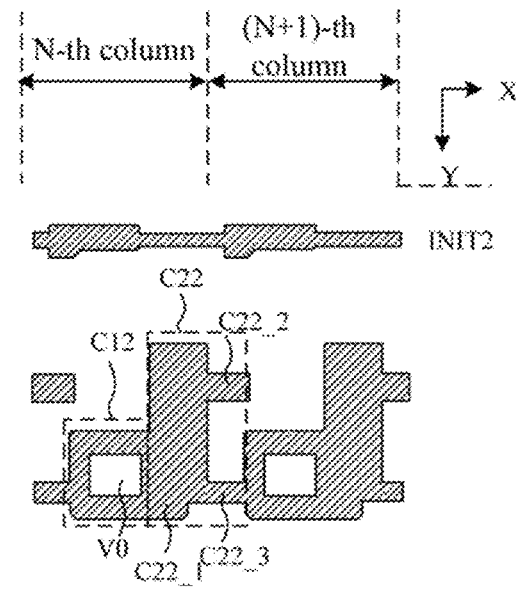
FIG. 12 is a schematic diagram of a pattern of a second conductive layer of the display substrate provided in FIG. 7.

(3) A pattern of a second conductive layer is formed. In an exemplary implementation mode, forming the pattern of the second conductive layer may include depositing a second insulation layer thin film and a second conductive thin film on the base substrate on which the above-mentioned patterns are formed, patterning the second conductive thin film using a patterning process to form the pattern of the second conductive layer on the second insulation layer. As shown in FIGS. 12 and 13, FIG. 12 is a schematic diagram of a pattern of a second conductive layer of the display substrate provided in FIG. 7, and FIG. 13 is a schematic diagram of the display substrate provided in FIG. 7 after the pattern of the second conductive layer is formed. In an exemplary implementation mode, the second conductive layer may be referred to as a second gate metal (GATE2) layer.

In an exemplary implementation mode, as shown in FIGS. 12 and 13, the pattern of the second conductive layer of each sub-pixel may at least include a second initial signal line INIT2, a second plate C12 of the first capacitor, and a second plate C22 of the second capacitor.

In an exemplary implementation mode, as shown in FIGS. 12 and 13, the second plate C12 of the first capacitor and the second plate C22 of the second capacitor are connected to each other to form an integral structure.

In an exemplary implementation mode, as shown in FIGS. 12 and 13, the second plate C12 of the first capacitor may be rectangular, corners of the rectangle may be provided with chamfers, and an orthographic projection of the second plate C12 of the first capacitor on the base substrate at least partially overlaps with an orthographic projection of the first plate of the first capacitor on the base substrate. The second plate C12 of the first capacitor is provided with an opening V0, the opening V0 may be rectangular and may be in the middle of the second plate C12 of the first capacitor, so that the second plate C12 of the first capacitor forms an annular structure. The opening exposes the second insulation layer covering the first plate of the first capacitor, and an orthographic projection of the first plate of the first capacitor on the base substrate includes an orthographic projection of the opening V0 on the base substrate.

In an exemplary implementation mode, as shown in FIGS. 12 and 13, the second plate C22 of the second capacitor may include a capacitor main body portion C22_1, a first connection block C22_2, and a second connection block C22_3 connected to each other. The capacitor main body portion C22_1 may be in a shape of a line extending in the second direction Y, and the first connection block C22_2 and the second connection block C22_3 may each be in a shape of a line extending in the first direction X. The first connection block C22_2 and the second connection block C22_3 may be on a side of the capacitor main body portion C22_1 away from the second plate C12 of the first capacitor, and the first connection block C22_2 and the second connection block C22_3 are arranged along the second direction Y, i.e., the second plate C22 of the second capacitor may be in a comb-like structure. The capacitor main body portion C22_1 may be used as the back of the comb, and the first connection block C22_2 and the second connection block C22_3 may be used as the teeth of the comb, respectively.

In an exemplary implementation mode, as shown in FIGS. 12 and 13, an orthographic projection of the capacitor main body portion C22_1 on the base substrate at least partially overlaps with an orthographic projection of the first plate of the second capacitor on the base substrate.

In an exemplary implementation mode, as shown in FIGS. 12 and 13, an orthographic projection of the first connection block C22_2 on the base substrate at least partially overlaps with an orthographic projection of the active layer of the second transistor between the control electrodes of the second transistor on the base substrate. An orthographic projection of the first connection block on the base substrate at least partially overlaps with an orthographic projection of the active layer of the second transistor between the control electrodes of the second transistor on the base substrate, so that the active layer of the second transistor between the control electrodes of the second transistor can be shielded by the first connection block, and leakage can be effectively prevented, thereby improving reliability of the display substrate.

In an exemplary implementation mode, as shown in FIGS. 12 and 13, an orthographic projection of the second connection block C22_3 on the base substrate at least partially overlaps with an orthographic projection of the second region of the active layer of the third transistor (also the second region of the active layer of the second transistor and the first region of the active layer of the sixth transistor) on the base substrate.

In an exemplary implementation mode, as shown in FIGS. 12 and 13, a virtual straight line extending in the first direction X does not simultaneously pass through the second plate C12 of the first capacitor and the first connection block C22_2, and the virtual straight line extending in the first direction passes through the second plate C12 of the first capacitor and the first connection block C22_2.

In an exemplary implementation mode, as shown in FIGS. 12 and 13, the second plate C12 of the first capacitor in the present sub-pixel is connected to the capacitor main body portion of the second plate C22 of the second capacitor. The second connection block of the present sub-pixel is connected to the second plate C12 of the first capacitor of an adjacent sub-pixel.

In an exemplary implementation mode, as shown in FIGS. 12 and 13, a length of the second plate C12 of the first capacitor in the second direction Y is smaller than a length of the second plate C22 of the second capacitor in the second direction Y. In an exemplary implementation mode, a length of the first connection block C22_2 in the second direction Y may be the same as or different from a length of the second connection block C22_3 in the second direction Y, which is not limited here in the present disclosure.

In an exemplary implementation mode, as shown in FIGS. 12 and 13, the second initial signal line INIT2 may be in a shape of a line extending in the first direction X, and the second initial signal line INIT2 may be on a side of the reset signal line away from the first plate of the first capacitor. An orthographic projection of the second initial signal line INIT2 on the base substrate may partially overlap with orthographic projections of the active layer of the seventh transistor and the active layer of the first transistor on the base substrate.

In an exemplary embodiment, the second plate C12 of the first capacitor of the sub-pixel arranged along the first direction X is connected to the second plate C22 of the second capacitor of an adjacent sub-pixel, so that the signals flowing through the second plate C12 of the first capacitor and the second plate C22 of the second capacitor of the sub-pixel arranged along the first direction X are the same, and display uniformity of the display substrate can be improved.

(4) A pattern of a third insulation layer is formed. In an exemplary implementation, forming the pattern of the third insulation layer may include: depositing a third insulation thin film on the base substrate on which the aforementioned patterns are formed, and patterning the third insulation thin film using a patterning process, to form the third insulation layer covering the second conductive layer, and a plurality of vias are arranged on the third insulation layer. As shown in FIG. 14, FIG. 14 is a schematic diagram of the display substrate provided in FIG. 7 after the third insulation layer is formed.

In an exemplary implementation mode, as shown in FIG. 14, the plurality of vias of the third insulation layer of each sub-pixel may at least include a first via V1, a second via V2, a third via V3, a fourth via V4, a fifth via V5, a sixth via V6, a seventh via V7, an eighth via V8, a ninth via V9, a tenth via V10, and an eleventh via V11.

In an exemplary implementation mode, an orthographic projection of the first via V1 on the base substrate is within a range of an orthographic projection of the first region of the active layer of the first transistor on the base substrate. The first insulation layer and the second insulation layer within the first via V1 are etched away to expose a surface of the first region of the active layer of the first transistor. The first via V1 is configured such that a first electrode of the first transistor T1 to be formed subsequently is connected to the first region of the active layer of the first transistor through the first via V1.

In an exemplary implementation mode, an orthographic projection of the second via V2 on the base substrate is within a range of an orthographic projection of the second region of the active layer of the first transistor (also the first region of the active layer of the second transistor) on the base substrate, the first insulation layer and the second insulation layer within the second via V2 are etched away to expose a surface of the second region of the active layer of the first transistor (also the first region of the active layer of the second transistor), and the second via V2 is configured such that a second electrode (also a first electrode of the second transistor) of the first transistor T1 to be formed subsequently is connected to the first region of the active layer of the first transistor (also the first region of the active layer of the second transistor) through the second via V2.

In an exemplary implementation mode, an orthographic projection of the third via V3 on the base substrate is within a range of an orthographic projection of the first region of the active layer of the fourth transistor on the base substrate. The first insulation layer and the second insulation layer in the third via V3 are etched away to expose a surface of the first region of the active layer of the fourth transistor. The third via V3 is configured such that a first electrode of the fourth transistor to be formed subsequently is connected to the first region of the active layer of the fourth transistor through the third via V3.

In an exemplary implementation mode, an orthographic projection of the fourth via V4 on the base substrate is within a range of an orthographic projection of the first region of the active layer of the fifth transistor on the base substrate. The first insulation layer and the second insulation layer in the fourth via V4 are etched away to expose a surface of the first region of the active layer of the fifth transistor. The fourth via V4 is configured such that a first electrode of the fifth transistor to be formed subsequently is connected to the first region of the active layer of the fifth transistor through the fourth via V4.

In an exemplary implementation mode, an orthographic projection of the fifth via V5 on the base substrate is within a range of an orthographic projection of the second region of the active layer of the sixth transistor (also the second region of the active layer of the seventh transistor) on the base substrate. The first insulation layer and the second insulation layer in the fifth via V5 are etched away to expose a surface of the second region of the active layer of the sixth transistor (also the second region of the active layer of the seventh transistor). The fifth via V5 is configured such that a second electrode (also a second electrode of the seventh transistor) of the sixth transistor T1 to be formed subsequently is connected to the second region of the active layer of the sixth transistor (also the second region of the active layer of the seventh transistor) through the fifth via V5.

In an exemplary implementation mode, an orthographic projection of the sixth via V6 on the base substrate is within a range of an orthographic projection of the first region of the active layer of the seventh transistor on the base substrate. The first insulation layer and the second insulation layer in the sixth via V6 are etched away to expose a surface of the first region of the active layer of the seventh transistor. The sixth via V6 is configured such that a first electrode of the seventh transistor to be formed subsequently is connected to the first region of the active layer of the seventh transistor through the sixth via V6.

In an exemplary implementation mode, an orthographic projection of the seventh via V7 on the base substrate is within a range of an orthographic projection of the second electrode connection portion of the control electrode of the second transistor on the base substrate. The second insulation layer in the seventh via V7 is etched away to expose a surface of the control electrode of the second transistor, and the seventh via V7 is configured such that a second scanning signal line to be formed subsequently is connected to the control electrode of the second transistor through the seventh via V7.

In an exemplary implementation mode, an orthographic projection of the eighth via V8 on the base substrate is within a range of an orthographic projection of the opening on the base substrate. The second insulation layer in the eighth via V8 is etched away to expose a surface of the first plate of the first capacitor (also the control electrode of the third transistor), and the eighth via V8 is configured such that the second electrode of the first transistor to be formed subsequently (also the first electrode of the second transistor) is connected to the first plate of the first capacitor (also the control electrode of the third transistor) through the eighth via V8.

In an exemplary implementation mode, an orthographic projection of the ninth via V9 on the base substrate is within a range of an orthographic projection of the control electrode of the fourth transistor on the base substrate. The second insulation layer in the ninth via V9 is etched away to expose a surface of the control electrode of the fourth transistor, and the ninth via V9 is configured such that a first scanning signal line to be formed subsequently is connected to the control electrode of the fourth transistor through the ninth via V9.

In an exemplary implementation mode, an orthographic projection of the tenth via V10 on the base substrate is within a range of the orthographic projection of the second initial signal line INIT2 on the base substrate. The tenth via V10 exposes a surface of the second initial signal line INIT2, and the tenth via V10 is configured such that a first electrode of the seventh transistor to be formed subsequently is connected to the second initial signal line INIT2 through the tenth via V10.

In an exemplary implementation mode, an orthographic projection of the eleventh via V11 on the base substrate is within a range of an orthographic projection of the second plate of the first capacitor (also the second plate of the second capacitor) on the base substrate. The eleventh via V11 exposes a surface of the second plate of the first capacitor (also the second plate of the second capacitor). The eleventh via V11 is configured such that a first electrode of the fifth transistor to be formed subsequently is connected to the second plate of the first capacitor (also the second plate of the second capacitor) through the via. In an exemplary implementation mode, a plurality of eleventh vias V11 may be provided and the plurality of eleventh vias V11 may be arranged sequentially along the second direction Y to improve connection reliability.

In an exemplary embodiment, a virtual straight line extending in the second direction may pass through the second via V2 and the eighth via V8.

In an exemplary embodiment, a virtual straight line extending in the second direction may pass through the fourth via V4 and the ninth via V9.

In an exemplary embodiment, a virtual straight line extending in the second direction passes through the fifth via V5 and the seventh via V7.

In an exemplary embodiment, a virtual straight line extending in the second direction passes through the sixth via V6 and the tenth via V10.

(5) Forming a third conductive layer. In an exemplary implementation, forming the pattern of the third conductive layer may include depositing a third conductive thin film on the base substrate on which the aforementioned patterns are formed, patterning the third conductive thin film by using a patterning process to form a third conductive layer arranged on the third insulation layer, as shown in FIG. 15 to FIG. 16. FIG. 15 is a schematic diagram of a pattern of a third conductive layer of the display substrate provided in FIG. 7, and FIG. 16 is a schematic diagram of the display substrate provided in FIG. 7 after the pattern of the third conductive layer is formed. In an exemplary implementation mode, the third conductive layer may be referred to as a first source-drain metal (SD1) layer.

In an exemplary implementation mode, as shown in FIGS. 15 and 16, the pattern of the third conductive layer of each sub-pixel may at least include a first electrode T13 and a second electrode T14 of the first transistor, a first electrode T23 of the second transistor, a first electrode T43 of the fourth transistor, a first electrode T53 of the fifth transistor, a second electrode T64 of the sixth transistor, a first electrode T73 and a second electrode T74 of the seventh transistor, and the first scanning signal line Gate1 and the second scanning signal line Gate2.

In an exemplary implementation mode, as shown in FIGS. 15 and 16, the second electrode T14 of the first transistor may simultaneously serve as the first electrode T23 of the second transistor, the second electrode T64 of the sixth transistor may simultaneously serve as the second electrode T74 of the seventh transistor, and the first electrode T13 of the first transistor, the first electrode T43 of the fourth transistor, the first electrode T53 of the fifth transistor and the first electrode T73 of the seventh transistor may be provided separately.

In an exemplary implementation mode, as shown in FIGS. 15 and 16, the first electrode T13 of the first transistor, the first electrode T43 of the fourth transistor and the first electrode T73 of the seventh transistor may be on a side of the first scanning signal line Gate1 away from the second scanning signal line Gate2, and the first electrode T43 of the fourth transistor and the first electrode T73 of the seventh transistor are respectively on two sides of the first electrode T13 of the first transistor.

In an exemplary implementation mode, as shown in FIGS. 15 and 16, the second electrode T14 of the first transistor (also the first electrode T23 of the second transistor), the first electrode T53 of the fifth transistor, and the second electrode T64 of the sixth transistor (the second electrode T74 of the seventh transistor) may be on a side of the second scanning signal line Gate2 away from the first scanning signal line Gate1. The second electrode T64 of the sixth transistor (the second electrode T74 of the seventh transistor) and the first electrode T53 of the fifth transistor are on two sides of the second electrode T14 of the first transistor (also the first electrode T23 of the second transistor), respectively.

In an exemplary implementation mode, as shown in FIGS. 15 and 16, the first electrode T13 of the first transistor may be in a structure of a block. An orthographic projection of the first electrode T13 of the first transistor on the base substrate may partially overlap with orthographic projections of the first via and the reset signal line RESET on the base substrate. The first electrode T13 of the first transistor is connected to the first region of the active layer of the first transistor through the first via.

In an exemplary implementation mode, as shown in FIGS. 15 and 16, the second electrode T14 of the first transistor (also the first electrode T23 of the second transistor) may be in a shape of a line extending in the second direction Y. An orthographic projection of the second electrode T14 of the first transistor (also the first electrode T23 of the second transistor) on the base substrate may partially overlap with orthographic projections of the second via, the eighth via, the first plate of the first capacitor and the second plate of the first capacitor on the base substrate. The second electrode T14 of the first transistor (also the first electrode T23 of the second transistor) is connected to the second region of the active layer of the first transistor (also the first region of the active layer of the second transistor) through the second via, and is connected to the first plate of the first capacitor through the eighth via.

In an exemplary implementation mode, as shown in FIGS. 15 and 16, the first electrode T43 of the fourth transistor may be in a shape of a line extending in the second direction Y. An orthographic projection of the first electrode T43 of the fourth transistor on the base substrate at least partially overlaps with orthographic projections of the third via and the reset signal line Reset on the base substrate. The first electrode of the fourth transistor is connected to the first region of the active layer of the fourth transistor through the third via.

In an exemplary implementation mode, as shown in FIGS. 15 and 16, the first electrode T53 of the fifth transistor may be in a shape of a line extending in the second direction Y. An orthographic projection of the first electrode T53 of the fifth transistor on the base substrate may at least partially overlap with orthographic projections of the fourth via, the eleventh via, the light emitting signal line EM and the second plate of the first capacitor (also the second plate of the second capacitor) on the base substrate. The first electrode T53 of the fifth transistor is connected to the first region of the active layer of the fifth transistor through the fourth via, and overlaps with the orthographic projection of the second plate of the first capacitor (also the second plate of the second capacitor) on the base substrate through the eleventh via.

In an exemplary implementation mode, as shown in FIGS. 15 and 16, the second electrode T64 of the sixth transistor (the second electrode T74 of the seventh transistor) may be in a structure of a block. An orthographic projection of the second electrode T64 of the sixth transistor (the second electrode T74 of the seventh transistor) on the base substrate may at least partially overlaps with orthographic projections of the fifth via and the light emitting signal line EM on the base substrate. The second electrode T64 of the sixth transistor (the second electrode T74 of the seventh transistor) is connected to the second region of the active layer of the sixth transistor (also the second region of the active layer of the seventh transistor) through the fifth via V5.

In an exemplary implementation mode, as shown in FIGS. 15 and 16, the first electrode T73 of the seventh transistor may be in a shape of a line extending in the second direction Y. An orthographic projection of the first electrode T73 of the seventh transistor on the base substrate at least partially overlaps with orthographic projections of the sixth via, the tenth via, the reset signal line Reset and the second initial signal line INIT2 on the base substrate. The first electrode of the seventh transistor is connected to the first region of the active layer of the seventh transistor through the sixth via V6, and is connected to the second initial signal line INIT2 through the tenth via V.

In an exemplary implementation mode, as shown in FIGS. 15 and 16, the first scanning signal line Gate1 may be in a shape of a line extending in the first direction X, and the first scanning signal line Gate1 may be on a side of the second scanning signal line Gate2 close to the first electrode T13 of the first transistor. An orthographic projection of the first scanning signal line Gate1 on the base substrate may at least partially overlap with orthographic projections of the ninth via and the control electrode of the fourth transistor on the base substrate. The first scanning signal line Gate1 is connected to the control electrode of the fourth transistor through the ninth via.

In an exemplary implementation mode, as shown in FIGS. 15 and 16, the second scanning signal line Gate2 may be in a shape of a line extending in the first direction X, and the second scanning signal line Gate2 may be on a side of the first scanning signal line Gate1 close to the first electrode T53 of the fifth transistor. An orthographic projection of the second scanning signal line Gate2 on the base substrate may at least partially overlap with orthographic projections of the seventh via, the second electrode connection portion of the control electrode of the second transistor, and the capacitor main body portion of the second plate of the second capacitor on the base substrate. The second scanning signal line Gate2 is connected to the control electrode of the second transistor through the seventh via.

In an exemplary implementation mode, the first scanning signal lines Gate1 and the second scanning signal lines Gate2 may be in a design of equal width, or may be in a design of non-equal widths, may be straight lines, or may be bend lines, which may not only facilitate the layout of the pixel structure, but also reduce the parasitic capacitance between the signal lines, which is not limited here in the present disclosure.

(6) A pattern of a fourth insulation layer is formed. In an exemplary implementation, forming the pattern of the fourth insulation layer may include: depositing a fourth insulation thin film on the base substrate on which the aforementioned patterns are formed, and patterning the fourth insulation thin film using a patterning process, to form a fourth insulation layer covering the third conductive layer, wherein a plurality of vias are provided on the third insulation layer, as shown in FIG. 17. FIG. 17 is a schematic diagram of the display substrate provided in FIG. 7 after the pattern of the fourth insulation layer is formed.

In an exemplary implementation mode, as shown in FIG. 17, the plurality of vias of the fourth insulation layer of each sub-pixel may at least include a twelfth via V12, a thirteenth via V13, a fourteenth via V14, and a fifteenth via V15.

In an exemplary implementation mode, an orthographic projection of the twelfth via V12 on the base substrate is within a range of an orthographic projection of the first electrode of the first transistor on the base substrate. The twelfth via V12 exposes a surface of the first electrode of the first transistor, and the twelfth via V12 is configured such that a first initial signal line to be formed subsequently is connected to the first electrode of the first transistor through the twelfth via V12.

In an exemplary implementation mode, an orthographic projection of the thirteenth via V13 on the base substrate is within a range of an orthographic projection of the first electrode of the fourth transistor on the base substrate. The thirteenth via V13 exposes a surface of a first electrode of the fourth transistor, and the thirteenth via V13 is configured such that a data signal line to be formed subsequently is connected to the first electrode of the fourth transistor through the thirteenth via V13.

In an exemplary implementation mode, an orthographic projection of the fourteenth via V14 on the base substrate is within a range of an orthographic projection of the first electrode of the fifth transistor on the base substrate. The fourteenth via V14 exposes a surface of the first electrode of the fifth transistor, and the fourteenth via V14 is configured such that a first power supply line to be formed subsequently is connected to the first electrode of the fifth transistor through the fourteenth via V14.

In an exemplary implementation mode, an orthographic projection of the fifteenth via V15 on the base substrate is within a range of an orthographic projection of the second electrode of the sixth transistor (also the second electrode of the seventh transistor) on the base substrate. The fifteenth via V15 exposes a surface of the second electrode of the sixth transistor (also the second electrode of the seventh transistor), and the fifteenth via V15 is configured such that a connection electrode to be formed subsequently is connected to the second electrode of the sixth transistor (also the second electrode of the seventh transistor) through the fifteenth via V15.

(7) A pattern of a fourth conductive layer is formed, in an exemplary implementation mode, forming the pattern of the fourth conductive layer may include depositing a fourth conductive thin film on the base substrate on which the above-mentioned patterns are formed, and patterning the fourth conductive thin film using a patterning process to form the pattern of the fourth conductive layer, as shown in FIGS. 18 and 19. FIG. 18 is a schematic diagram of a pattern of a fourth conductive layer of the display substrate provided in FIG. 7, and FIG. 19 is a schematic diagram of the display substrate provided in FIG. 7 after the pattern of the fourth conductive layer is formed. In an exemplary implementation mode, the fourth conductive layer may be referred to as a second source-drain metal (SD2) layer.

In an exemplary implementation mode, as shown in FIGS. 18 and 19, the pattern of the fourth conductive layer of each sub-pixel may at least include a first initial signal line INIT1, a connection electrode VL, a first power supply line VDD, and a data signal line Data.

In an exemplary implementation mode, as shown in FIGS. 18 and 19, the connection electrode VL may be on a side of the first initial signal line INIT1 away from the first power supply line VDD, and the first power supply line VDD is located between the first initial signal line INIT1 and the data signal line Data.

In an exemplary implementation mode, as shown in FIGS. 18 and 19, the connection electrode VL may be in a shape of a strip. An orthographic projection of the connection electrode VL on the base substrate overlaps with an orthographic projection of the fifteenth via on the base substrate. The connection electrode VL is connected to the second region of the active layer of the sixth transistor T6 (also the second region of the seventh active layer) which is a second electrode of the sixth transistor T6 (also a second electrode of the seventh transistor T7) through the fifteenth via. In an exemplary implementation mode, the connection electrode VL is configured to be connected to an anode to be formed subsequently.

In an exemplary implementation mode, as shown in FIGS. 18 and 19, the first initial signal line INIT1 may be in a shape of a line with a main body portion extending in the second direction Y. An orthographic projection of the first initial signal line INIT1 on the base substrate at least partially overlaps with orthographic projections of the second via, the eighth via, the twelfth via and a second electrode of the first transistor (which is also the first electrode of the second transistor) on the base substrate. The first initial signal line INIT1 is connected to the first electrode of the first transistor through the twelfth via. The orthographic projection of the first initial signal line on the base substrate at least partially overlaps with an orthographic projection of the eighth via on the base substrate, which can prevent other signals from interfering with the first node and effectively improve stability of the first node. The orthographic projection of the first initial signal line on the base substrate partially overlaps with an orthographic projection of the twelfth via on the base substrate, so that the active layer of the first transistor between the control electrodes of the first transistor is shielded by the first initial signal line, and leakage can be effectively prevented, thereby improving the reliability of the display substrate.

In an exemplary implementation mode, as shown in FIGS. 18 and 19, the first initial signal line is disposed in the fourth conductive layer, with a main body portion extending in the second direction. Since a signal of the first initial signal line is fed into the display region through a chip in a bonding region, the first initial signal line with the main body portion extending in the second direction is the shortest path in design, and the first initial signal line can be fed directly from below, which can be more conducive to speeding up the initialization of the first node.

In an exemplary implementation mode, as shown in FIGS. 18 and 19, a main body portion of the first power supply line VDD may be in a shape of a line extending in the second direction Y. An orthographic projection of the first power supply line VDD on the base substrate overlaps with orthographic projections of the ninth via, the fourteenth via, a control electrode of the fourth transistor, and the second plate of the first capacitor and the capacitor main body portion of the second plate of the second capacitor on the base substrate. The first power supply line VDD is connected to the first electrode of the fifth transistor through the fourteenth via, realizing that a power supply signal is written to the first electrode of the fifth transistor. The first electrode of the fifth transistor is connected to the second plate of the first capacitor and the second plate of the second capacitor, so that the first electrode of the fifth transistor, the second plate of the first capacitor and the second plate of the second capacitor have a same potential.

In an exemplary implementation mode, as shown in FIGS. 18 and 19, an orthographic projection of the first power supply line VDD on the base substrate is located between the orthographic projection of the eighth via on the base substrate and an orthographic projection of the data signal line Data on the base substrate, so that the first power supply line VDD has a shielding and separation effect between the first node and the data signal line Data, effectively preventing influence of jump change of the data signal line Data on the first node, thereby preventing occurrence of signal crosstalk and improving the reliability of the display substrate.

In an exemplary implementation mode, as shown in FIGS. 18 and 19, the data signal line Data may be in a shape of a line with a main body portion extending in the second direction Y, and an orthographic projection of the data signal line Data on the base substrate at least partially overlaps with orthographic projections of the thirteenth via, the capacitor main body portion of the second plate of the second capacitor, and the control electrode of the fourth transistor on the base substrate. The data signal line Data is connected to the first electrode of the fourth transistor through the thirteenth via.

In an exemplary implementation mode, as shown in FIGS. 18 and 19, the data signal line Data is disposed in the fourth conductive layer, which can reduce the parasitic capacitance between the data signal line Data and a conductive film layer underneath it, thereby reducing load on the data signal line Data, which is beneficial to saving charging time and saving power consumption.

In an exemplary implementation mode, the first initial signal line INIT1, the data signal line Data, and the first power supply line VDD may be in a design of equal width, or may be in a design of non-equal widths, may be straight lines, or may be bend lines, which may not only facilitate the layout of the pixel structure, but also reduce parasitic capacitance between signal lines, which is not limited here in the present disclosure. By way of example, a width of the first power supply line VDD may be greater than a width of the data signal line Data and greater than a width of the first initial signal line INIT1, which may be greater than the width of the data signal line Data.

(8) A pattern of a planarization layer is formed. In an exemplary implementation mode, forming the pattern of the planarization layer may include coating a planarization thin film on the base substrate on which the above-mentioned patterns are formed, patterning the planarization thin film using a patterning process to form a planarization layer covering the pattern of the fourth conductive layer.

Hereto, the drive circuit layer of the display substrate provided in FIG. 7 is prepared on the base substrate. In a plane parallel to the display substrate, the drive circuit layer may include a plurality of pixel circuits, and the drive circuit layer further includes a first scanning signal line, a second scanning signal line, a light emitting signal line, a first initial signal line, a second initial signal line, a data signal line and a first power supply line. In a plane perpendicular to the display substrate, the drive circuit layer may be disposed on the base substrate, and the base substrate may include a first flexible layer, a block layer, a base substrate conductive layer, and a second flexible layer which are stacked.

The drive circuit layer may include a semiconductor layer, a first insulation layer, a first conductive layer, a second insulation layer, a second conductive layer, a third insulation layer, a third conductive layer, a fourth insulation layer, a fourth conductive layer, and a planarization layer that are sequentially disposed on the base substrate. The semiconductor layer may at least include active layers of the first transistor to the seventh transistor and a first plate of a second capacitor. The first conductive layer may at least include a reset signal line, the light emitting signal line, control electrodes of the first transistor to the seventh transistor and a first plate of a first capacitor, the second conductive layer may at least include a second plate of the first capacitor, a second plate of the second capacitor and the second initial signal line. The third conductive layer may at least include the first scanning signal line and the second scanning signal line. The fourth conductive layer may at least include the first initial signal line, the data signal line, the first power supply line and a connection electrode.

In an exemplary implementation mode, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, the fourth insulation layer, and the fifth insulation layer may be made of any one or more of Silicon Oxide $(SiO_x)$, Silicon Nitride $(SiN_x)$, and Silicon Oxynitride (SiON), and may be a single layer, multiple layers, or a composite layer. The first insulation layer may be referred to as a buffer layer, the second insulation layer may be referred to as a gate insulation (GI) layer, the fourth insulation layer may be referred to as an interlayer dielectric (ILD) layer, and the fifth insulation layer may be referred to as a passivation (PVX) layer. The planarization layer may be made of an organic material such as resin.

A manufacturing process of the display substrate provided in FIG. 8 is explained below in terms of pixel circuits with one row and two columns. A manufacturing process of a display substrate according to an exemplary embodiment may include:

(1) A pattern of a shield layer is formed on the base substrate. In an exemplary implementation mode, forming the pattern of the shield layer may include sequentially depositing a shield conductive thin film on the base substrate, patterning the shield conductive thin film using a patterning process to form the pattern of the shield layer, as shown in FIG. 20. FIG. 20 is a schematic diagram of the display substrate provided in FIG. 8 after the pattern of the shield layer is formed.

In an exemplary implementation mode, as shown in FIG. 20, the pattern of the shield layer of each sub-pixel may at least include a first shield structure 11, a second shield structure 12, a first shield connection structure 13, a second shield connection structure 14, a third shield connection structure 15, a fourth shield connection structure 16, and a first plate C21 of a second capacitor. The second shield structure 12 is also the first plate C21 of the second capacitor.

In an exemplary implementation mode, the shield layer is configured to transmit high-voltage power supply signals.

In an exemplary implementation mode, as shown in FIG. 20, for a same sub-pixel, the first shield connection structure 13 and the second shield structure 12 are respectively on opposite sides of the first shield structure 11 and are connected to the first shield structure 11. The second shield connection structure 14 is on a side of the second shield structure 12 (also the first plate C21 of the second capacitor) away from the first shield structure 11 and is connected to the second shield structure 12 (also the first plate C21 of the second capacitor). The third shield connection structure 15 and the fourth shield connection structure 16 are respectively on other two opposite sides of the first shield structure 11, and the third shield connection structure 15 is connected to the second shield structure 12 (also the first plate C21 of the second capacitor), and the fourth shield connection structure 16 is connected to the first shield structure 11.

In an exemplary implementation mode, as shown in FIG. 20, the second shield structure 12 (also the first plate C21 of the second capacitor) of a sub-pixel of the N-th column is on a side of the first shield structure 11 of the present sub-pixel close to the first shield structure 11 of a sub-pixel of the (N+1)-th column in a same row. The first shield connection structure 13 of a sub-pixel of the N-th column is on a side of the first shield structure 11 of the present sub-pixel close to the first shield structure 11 of a sub-pixel of the (N−1)-th column in a same row, and is connected to the fourth shield connection structure 14 of the sub-pixel of the (N−1)-th column. The second shield connection structure 14 of a sub-pixel of the N-th column is connected to the first shield connection structure 13 of a sub-pixel of the (N+1)-th column located in a same row.

In an exemplary implementation mode, as shown in FIG. 20, the third shield connection structure 15 of a sub-pixel of the M-th row is on a side of the first shield structure 11 of the present sub-pixel close to the first shield structure 11 of a sub-pixel of the (M−1)-th row in a same column, and is connected to the fourth shield connection structure 16 of the sub-pixel of the (M−1)-th row. The fourth shield connection structure 16 of a sub-pixel of the M-th row is on a side of the first shield structure 11 of the present sub-pixel close to the first shield structure 11 of a sub-pixel of the (M+1)-th row in a same column, and is connected to the fifth shield connection structure 15 of the sub-pixel of the (M+1)-th row.

In an exemplary implementation mode, as shown in FIG. 20, a virtual straight line extending in the second direction Y passes through the third shield connection structure 15 and the fourth shield connection structure 16.

In an exemplary implementation mode, as shown in FIG. 20, the first shield structure 11 may be rectangular, corners of the rectangle may be provided with chamfers. The second shield structure 12 may be in a shape of a line extending in the second direction Y. The first shield connection structure 13 and the second shield connection structure 14 may each be in a shape of a line extending in the first direction X. The main body of the third shield connection structure 15 may be in a shape of a bend line extending in the second direction Y. The fourth shield connection structure 16 may be in a shape of a line extending in the second direction Y.

In an exemplary implementation mode, as shown in FIG. 20, a length of the first shield structure 11 in the first direction X is greater than a length of the second shield structure 12 in the first direction X, and a length of the first shield structure 11 in the second direction Y is smaller than a length of the second shield structure 12 in the second direction Y.

In an exemplary implementation mode, shapes of the shield layers in multiple sub-pixels may be the same.

In an exemplary implementation mode, the shield layers of all sub-pixels are connected together to form a mesh, which may ensure that the shield layers in the display substrate have a same potential, which is beneficial to improving uniformity of a panel, avoiding poor display of the display substrate, and ensuring a display effect of the display substrate.

(2) A pattern of a semiconductor layer is formed. In an exemplary implementation mode, forming the pattern of the semiconductor layer may include depositing a first insulation thin film and a semiconductor thin film on the base substrate on which the above-mentioned patterns are formed, patterning the semiconductor thin film using a patterning process to form a first insulation layer covering the pattern of the shield layer, and the pattern of the semiconductor layer on the first insulation layer, as shown in FIGS. 21 and 22. FIG. 21 is a schematic diagram of a pattern of a semiconductor layer of the display substrate provided in FIG. 8, and FIG. 22 is a schematic diagram of the display substrate provided in FIG. 8 after the pattern of the semiconductor layer is formed.

In an exemplary implementation mode, as shown in FIGS. 21 and 22, the pattern of the semiconductor layer of each sub-pixel may at least include an active layer T11 of the first transistor to an active layer T81 of the eighth transistor.

In an exemplary implementation mode, as shown in FIGS. 21 and 22, the active layer T11 of the first transistor to the active layer T81 of the eighth transistor are interconnected in an integral structure.

In an exemplary implementation mode, as shown in FIGS. 21 and 22, in the first direction X, the active layer T21 of the second transistor and the active layer T61 of the sixth transistor may be on a same side of the active layer T31 of the third transistor in the present sub-pixel. The active layer T41 of the fourth transistor and the active layer T51 of the fifth transistor may be on a same side of the active layer T31 of the third transistor in the present sub-pixel. The active layer T21 of the second transistor and the active layer T41 of the fourth transistor may be on different sides of the active layer T31 of the third transistor in the present sub-pixel. In the second direction Y, the active layer T11 of the first transistor, the active layer T21 of the second transistor, the active layer T41 of the fourth transistor and the active layer T81 of the eighth transistor may be on a same side of the active layer T31 of the third transistor in the present sub-pixel. The active layer T51 of the fifth transistor, the active layer T61 of the sixth transistor and the active layer T71 of the seventh transistor may be on other side of the active layer T31 of the third transistor in the present sub-pixel.

In an exemplary implementation mode, as shown in FIGS. 21 and 22, the active layer T11 of the first transistor may be in a shape of a "T", the active layer T21 of the second transistor may be in a shape of a horizontally inverted "7", the active layer T31 of the third transistor may be in a shape of an "Q". The active layer T41 of the fourth transistor, the active layer T51 of the fifth transistor, the active layer T61 of the sixth transistor and the active layer T81 of the eighth transistor may each be in a shape of an "I" shape, and the active layer T71 of the seventh transistor may be in a shape of a "⊥".

In an exemplary implementation mode, as shown in FIGS. 21 and 22, the active layer of each transistor may include a first region, a second region and a channel region between the first region and the second region. In an exemplary implementation mode, a second region T11_2 of the active layer T11 of the first transistor may serve as a first region T81_1 of the active layer T81 of the eighth transistor. A second region T81_2 of the active layer T81 of the eighth transistor may serve as a first region T21_1 of the active layer T21 of the second transistor. A first region T31_1 of the active layer T31 of the third transistor may simultaneously serve as a second region T41_2 of the active layer T41 of the fourth transistor and a second region T51_2 of the active layer T51 of the fifth transistor. A second region T31_2 of the active layer T31 of the third transistor can simultaneously serve as a second region T21_2 of the active layer T21 of the second transistor and a first region T61_1 of the active layer T61 of the sixth transistor. A second region T61_2 of the active layer T61 of the sixth transistor may serve as a second region T71_2 of the active layer T71 of the seventh transistor. A first region T11_1 of the active layer T11 of the first transistor, a first region T41_1 of the active layer T41 of the fourth transistor, a first region T51_1 of the active layer T51_1 of the fifth transistor and a first region T71_1 of the active layer T71 of the seventh transistor may be provided separately.

In an exemplary implementation mode, as shown in FIGS. 21 and 22, the first region T11_1 of the active layer T11 of the first transistor includes a first connection portion T11_1A extending in the first direction X and a second connection portion T11_1B extending in the second direction Y.

In an exemplary implementation mode, as shown in FIGS. 21 and 22, first regions T11_1 of the active layers T11 of the first transistors of adjacent sub-pixels located in a same row are connected to each other. First connection portions T11_1A of the first regions T11_1 of the active layers T11 of the first transistors of adjacent sub-pixels in a same row are connected to each other.

In an exemplary implementation mode, as shown in FIGS. 21 and 22, the first region T71_1 of the active layer T71 of the seventh transistor includes a third connection portion T71_1A extending in the first direction X and a fourth connection portion T71_1B extending in the second direction Y.

In an exemplary implementation mode, as shown in FIGS. 21 and 22, first regions T71_1 of the active layers T71 of the seventh transistors of adjacent sub-pixels located in a same row are connected to each other. Third connection portions T71_1A of the first regions T71_1 of the active layers T71 of the seventh transistors of adjacent sub-pixels located in a same row are connected to each other.

In an exemplary implementation mode, as shown in FIGS. 21 and 22, an orthographic projection of the first shield structure on the base substrate at least partially overlaps with an orthographic projection of a channel region of the active layer T31 of the third transistor on the base substrate. An orthographic projection of the second shield structure on the base substrate at least partially overlaps with an orthographic projection of the first region T31_1 of the active layer T31 of the third transistor (the second region T41_2 of the active layer T41 of the fourth transistor and the second region T51_2 of the active layer T51 of the fifth transistor) on the base substrate. An orthographic projection of the third shield connection structure on the base substrate at least partially overlaps with an orthographic projection of the first region T11_1 of the active layer T11 of the first transistor on the base substrate. An orthographic projection of the fourth shield connection structure on the base substrate at least partially overlaps with an orthographic projection of the first region T71_1 of the active layer T71 of the seventh transistor on the base substrate.

In the present disclosure, the orthographic projection of the first shield structure on the base substrate at least partially overlaps with the orthographic projection of the channel region of the active layer T31 of the third transistor on the base substrate, which can improve performance of the third transistor, i.e., the driving transistor, and further improve reliability of the display substrate.

(3) A pattern of a first conductive layer is formed. In an exemplary implementation mode, forming the pattern of the first conductive layer may include sequentially depositing a second insulation thin film and a first conductive thin film on the base substrate on which the above-mentioned patterns are formed, patterning the first conductive thin film using a patterning process to form a second insulation layer covering the pattern of the semiconductor layer, and the pattern of the first conductive layer on the second insulation layer, as shown in FIGS. 23 and 24. FIG. 23 is a schematic diagram of a pattern of a first conductive layer of the display substrate provided in FIG. 8, and FIG. 24 is a schematic diagram of the display substrate provided in FIG. 8 after the pattern of the first conductive layer is formed. In an exemplary implementation mode, the first conductive layer may be referred to as a first gate metal (GATE1) layer.

In an exemplary implementation mode, the pattern of the first conductive layer of each sub-pixel may at least include a light emitting signal line EM, a control electrode T12 of the first transistor to a control electrode T82 of the eighth transistor, and a first plate C11 of a first capacitor.

In an exemplary implementation mode, as shown in FIGS. 23 and 24, the first plate C11 of the first capacitor may be rectangular, corners of the rectangle may be provided with chamfers, and an orthographic projection of the first plate C11 of the first capacitor on the base substrate at least partially overlaps with the orthographic projection of the active layer of the third transistor T3 on the base substrate. In an exemplary implementation mode, the first plate C11 of the first capacitor may simultaneously serve as the control electrode T32 of the third transistor T3.

In an exemplary implementation mode, as shown in FIGS. 23 and 24, the light emitting signal line EM may be in a shape of a line extending in the first direction X, a region where the light emitting signal line EM overlaps with the active layer of the fifth transistor T5 serves as a control electrode T52 of the fifth transistor T5, and a region where the light emitting signal line EM overlaps with the active layer of the sixth transistor T6 serves as a control electrode T62 of the sixth transistor T6.

In an exemplary implementation mode, as shown in FIGS. 23 and 24, the control electrode T12 of the first transistor T1, the control electrode T22 of the second transistor T2, the control electrode T42 of the fourth transistor T4, and the control electrode T82 of the eighth transistor T8 may be on a side of the first plate C11 of the first capacitor away from the light emitting signal line EM. The control electrode T42 of the fourth transistor T4 and the control electrode T82 of the eighth transistor T8 are on a side of the control electrode T22 of the second transistor T2 away from the first plate C11 of the first capacitor. The control electrode T12 of the first transistor T1 is on a side of the control electrode T42 of the fourth transistor T4 and the control electrode T82 of the eighth transistor T8 away from the first plate C11 of the first capacitor. The control electrode of the seventh transistor T72 is on a side of the light emitting signal line EM away from the first plate C11 of the first capacitor.

In an exemplary implementation mode, as shown in FIGS. 23 and 24, the control electrode T12 of the first transistor and the control electrode T72 of the seventh transistor may each be in a shape of a line extending in the first direction X.

In an exemplary implementation mode, as shown in FIGS. 23 and 24, the control electrode T42 of the fourth transistor may simultaneously serve as the control electrode T82 of the eighth transistor. The control electrode T42 of the fourth transistor (also the control electrode T82 of the eighth transistor) may be in a shape of a line extending in the first direction X.

In an exemplary implementation mode, as shown in FIGS. 23 and 24, the control electrode T22 of the second transistor may include a first electrode connection portion T22A extending in the first direction X and a second electrode connection portion T22B extending in the second direction Y. Orthographic projections of the first electrode connection portion T22A and the second electrode connection portion T22B on the base substrate partially overlap with an orthographic projection of the active layer of the second transistor on the base substrate, therefore, there are two regions where the control electrode T22 of the second transistor overlaps with the active layer T21 of the second transistor, that is, the second transistor has two control electrodes T22, and the second transistor has a double-gate structure.

In an exemplary implementation mode, after the pattern of the first conductive layer is formed, the semiconductor layer may be conductorized by using the first conductive layer as a shield. A region of the semiconductor layer, which is shielded by the first conductive layer, forms channel regions of the first transistor T1 to the eighth transistor T8. An area of the semiconductor layer, which is not shielded by the first conductive layer, is conductorized, that is, the first regions and the second regions of the active layer of the first transistor to the active layer of the eighth transistor are all conductorized. The first region T11_1 of the active layer T11 of the first transistor, after being conductorized can serve as the first electrode T13 of the first transistor and a first initial signal line INIT1 at the same time. The second region T11_2 of the active layer T11 of the first transistor after being conductorized (also the first region T81_1 of the active layer T81 of the eighth transistor) may simultaneously serve as the second electrode T14 of the first transistor and the first electrode T83 of the eighth transistor. The first region T31_1 of the active layer T31 of the third transistor after being conductorized (also the second region T41_2 of the active layer T41 of the fourth transistor and the second region T51_2 of the active layer T51 of the fifth transistor) may simultaneously serve as the first electrode T33 of the third transistor, the second electrode T44 of the fourth transistor, the second electrode T54 of the fifth transistor and a second plate C22 of the second capacitor. The second region T31_2 of the active layer T31 of the third transistor after being conductorized (which is also the second region T21_2 of the active layer T21 of the second transistor and the first region T61_1 of the active layer T61 of the sixth transistor) also serves as the second electrode T24 of the second transistor, the second electrode T34 of the third transistor and the first electrode T63 of the sixth transistor at the same time. The first region T71_1 of the active layer T71 of the seventh transistor after being conductorized can serve as the first electrode T73 of the seventh transistor and a second initial signal line INIT2 at the same time.

In an exemplary implementation mode, the first initial signal line INIT1, the second initial signal line INIT2 and the light emitting signal line EM may be in a design of equal width, or may be in a design of non-equal widths, may be straight lines, or may be bend lines, which may not only facilitate the layout of the pixel structure, but also reduce parasitic capacitance between the signal lines, which is not limited here in the present disclosure.

(4) A pattern of a second conductive layer is formed. In an exemplary implementation mode, forming the pattern of the second conductive layer may include depositing a third insulation layer thin film and a second conductive thin film on the base substrate on which the above-mentioned patterns are formed, patterning the second conductive thin film using a patterning process to form the pattern of the second conductive layer on the third insulation layer. As shown in FIG. 25 and FIG. 26, FIG. 25 is a schematic diagram of a pattern of a second conductive layer of the display substrate provided in FIG. 8, and FIG. 26 is a schematic diagram of the display substrate provided in FIG. 8 after the pattern of the second conductive layer is formed. In an exemplary implementation mode, the second conductive layer may be referred to as a second gate metal (GATE2) layer.

In an exemplary implementation mode, as shown in FIGS. 25 and 26, the pattern of the second conductive layer of each sub-pixel at least includes a second plate C12 of the first capacitor, a third plate C23 of the second capacitor, and a shield electrode 21.

In an exemplary implementation mode, as shown in FIGS. 25 and 26, for a same sub-pixel, the second plate C12 of the first capacitor and the third plate C23 of the second capacitor are connected to each other, and the shield electrode 21 is separately provided.

In an exemplary implementation mode, as shown in FIGS. 25 and 26, for sub-pixels of a same row, the third plate C23 of the second capacitor of a sub-pixel of the N-th column is on a side of the second plate C12 of the first capacitor of the sub-pixel of the N-th column close to the second plate C12 of the first capacitor of a sub-pixel of the (N+1)-th column, and is connected to the second plate C12 of the first capacitor of the sub-pixel of the (N+1)-th column. The third plate C23 of the second capacitor of the sub-pixel of the N-th column is connected to the second plate C12 of the first capacitor of the sub-pixel of the (N+1)-th column, so that signals flowing through the second plate C12 of the first capacitor and the third plate C23 of the second capacitor of adjacent sub-pixels arranged in the first direction X are the same, and the display uniformity of the display substrate can be improved.

In an exemplary implementation mode, the second capacitor includes a first plate disposed in the shield layer, a second plate disposed in the semiconductor layer, and a third plate disposed in the second conductive layer. The first plate and the third plate each transmit a high-voltage power supply signal. In the present disclosure, by providing a second capacitor which includes a first plate disposed in the shield layer, a second plate disposed in the semiconductor layer and a third plate disposed in the second conductive layer, the second capacitor can store more charges, charging performance of the second capacitor can be improved, charging time of the first node in the pixel circuit can be prolonged, thus the performance of the display substrate is improved, which facilitates achieving a high refresh rate.

In an exemplary implementation mode, as shown in FIGS. 25 and 26, the second plate C12 of the first capacitor may include a capacitor main body portion C12A and a connection portion C12B connected to each other. The connection portion C12B and the third plate C23 of the second capacitor are respectively on opposite sides of the capacitor main body portion C12A, and are respectively connected to the capacitor main body portion C12A. The connection portion C12B of a sub-pixel of the (N+1)-th column is connected to the third plate C23 of the second capacitor of a sub-pixel of the N-th column.

In an exemplary implementation mode, as shown in FIGS. 25 and 26, the capacitor main body portion C12A may be rectangular, corners of the rectangle may be provided with chamfers, and an orthographic projection of the capacitor main body portion C12A on the base substrate at least partially overlaps with an orthographic projection of the first plate of the first capacitor on the base substrate. The capacitor main body portion C12A is provided with an opening V0, the opening V0 may be rectangular and may be in the middle of the capacitor main body portion C12A, so that the capacitor main body portion C12A forms an annular structure. The opening V0 exposes the third insulation layer covering the first plate of the first capacitor, and the orthographic projection of the first plate of the first capacitor on the base substrate includes an orthographic projection of the opening V0 on the base substrate.

In an exemplary implementation mode, as shown in FIGS. 25 and 26, the connection portion C12B may be in a shape of a line extending in the first direction X.

In an exemplary implementation mode, as shown in FIGS. 25 and 26, the third plate C23 of the second capacitor may be in a shape of a bend line extending in the second direction X. An orthographic projection of the third plate C23 of the second capacitor on the base substrate at least partially overlaps with an orthographic projection of the second plate of the second capacitor on the base substrate.

In an exemplary implementation mode, as shown in FIGS. 25 and 26, a length of the second plate C12 of the first capacitor in the second direction Y is smaller than a length of the third plate C23 of the second capacitor in the second direction Y.

In an exemplary implementation mode, as shown in FIGS. 25 and 26, for sub-pixels of a same column, the shield electrode 21 of a sub-pixel of the (M+1)-th row is on a side of the second plate C12 of the first capacitor of the sub-pixel of the (M+1)-th row close to the second plate C12 of the first capacitor of a sub-pixel of the M-th row. For sub-pixels of a same row, the shield electrode 21 of a sub-pixel of the (N+1)-th column is electrically connected to the third plate C23 of the second capacitor of a sub-pixel of the N-th column.

In an exemplary implementation mode, as shown in FIGS. 25 and 26, the shield electrode 21 may be in a shape of a block. An orthographic projection of the shield electrode 21 on the base substrate at least partially overlaps with an orthographic projection of the active layer of the second transistor between the control electrodes of the second transistor on the base substrate. The orthographic projection of the shield electrode 21 on the base substrate at least partially overlaps with the orthographic projection of the active layer of the second transistor between the control electrodes of the second transistor on the base substrate so that the active layer of the second transistor between the control electrodes of the second transistor is shielded by the shield electrode, which can effectively prevent leakage, thereby improving the reliability of the display substrate.

(5) A pattern of a fourth insulation layer is formed. In an exemplary implementation, forming the pattern of the fourth insulation layer may include: depositing a fourth insulation thin film on the base substrate on which the aforementioned patterns are formed, and patterning the fourth insulation thin film using a patterning process, to form a fourth insulation layer covering the second conductive layer, wherein a plurality of vias are provided on the fourth insulation layer, as shown in FIG. 27. FIG. 27 is a schematic diagram of the display substrate provided in FIG. 8 after a pattern of a fourth insulation layer is formed.

In an exemplary implementation mode, as shown in FIG. 27, the plurality of vias of the fourth insulation layer of each sub-pixel may at least include a first via V1, a second via V2, a third via V3, a fourth via V4, a fifth via V5, a sixth via V6, a seventh via V7, an eighth via V8, and a ninth via V9.

In an exemplary implementation mode, an orthographic projection of the first via V1 on the base substrate is within a range of an orthographic projection of the first region of the active layer T21 of the second transistor (also the second region of the active layer of the eighth transistor) on the base substrate. The second insulation layer and the third insulation layer within the first via V1 are etched away to expose a surface of the first region of the active layer of the second transistor (also the second region of the active layer of the eighth transistor), and the first via V1 is configured such that a first electrode (also a second electrode of the eighth transistor) of the second transistor to be formed subsequently is connected to the first region of the active layer of the second transistor (also the second region of the active layer of the eighth transistor) through the first via V1.

In an exemplary implementation mode, an orthographic projection of the second via V2 on the base substrate is within a range of an orthographic projection of the first region of the active layer of the fourth transistor on the base substrate. The second insulation layer and the third insulation layer in the second via V2 are etched away to expose a surface of the first region of the active layer of the fourth transistor, and the second via V2 is configured such that a first electrode of the fourth transistor to be formed subsequently is connected to the first region of the active layer of the fourth transistor through the second via V2.

In an exemplary implementation mode, an orthographic projection of the third via V3 on the base substrate is within a range of an orthographic projection of the first region of the active layer of the fifth transistor on the base substrate. The second insulation layer and the third insulation layer in the third via V3 are etched away to expose a surface of the first region of the active layer of the fifth transistor, and the third via V3 is configured such that a first electrode of the fifth transistor to be formed subsequently is connected to the first region of the active layer of the fifth transistor through the third via V3.

In an exemplary implementation mode, an orthographic projection of the fourth via V4 on the base substrate is within a range of an orthographic projection of the second region of the active layer of the sixth transistor (also the second region of the active layer of the seventh transistor) on the base substrate. The second insulation layer and the third insulation layer in the fourth via V4 are etched away to expose a surface of the second region of the active layer of the sixth transistor (also the second region of the active layer of the seventh transistor), and the fourth via V5 is configured such that a second electrode of the sixth transistor to be formed subsequently (also a second electrode of the seventh transistor) is connected to the second region of the active layer of the sixth transistor (also the second region of the active layer of the seventh transistor) through the fourth via V4.

In an exemplary implementation mode, an orthographic projection of the fifth via V5 on the base substrate is within a range of an orthographic projection of the control electrode of the first transistor on the base substrate. The third insulation layer in the fifth via V5 is etched away to expose a surface of a control electrode of the first transistor, and the fifth via V5 is configured such that one of reset signal lines to be formed subsequently is connected to a control electrode of the first transistor through the fifth via V5.

In an exemplary implementation mode, an orthographic projection of the sixth via V6 on the base substrate is within a range of an orthographic projection of the control electrode of the second transistor on the base substrate. The third insulation layer in the sixth via V6 is etched away to expose a surface of the control electrode of the second transistor, and the sixth via V6 is configured such that a first scanning signal line to be formed subsequently is connected to the control electrode of the second transistor through the sixth via V6.

In an exemplary implementation mode, an orthographic projection of the seventh via V7 on the base substrate is within a range of the orthographic projection of the opening on the base substrate. The third insulation layer in the seventh via V7 is etched away to expose a surface of the first plate of the first capacitor (also the control electrode of the third transistor), and the seventh via V7 is configured such that the first electrode of the second transistor to be formed subsequently (also the second electrode of the eighth transistor) is connected to the first plate of the first capacitor (also the control electrode of the third transistor) through the seventh via V7.

In an exemplary implementation mode, an orthographic projection of the eighth via V8 on the base substrate is within a range of an orthographic projection of a control electrode of the fourth transistor (also a control electrode of the eighth transistor) on the base substrate. The third insulation layer in the eighth via V8 is etched away to expose a surface of the control electrode of the fourth transistor (also the control electrode of the eighth transistor), and the eighth via V8 is configured such that a second scanning signal line to be formed subsequently is connected to the control electrode of the fourth transistor (also the control electrode of the eighth transistor) through the eighth via V8.

In an exemplary implementation mode, an orthographic projection of the ninth via V9 on the base substrate is within a range of an orthographic projection of the control electrode of the seventh transistor on the base substrate. The third insulation layer in the ninth via V9 is etched away to expose a surface of the control electrode of the seventh transistor, and the ninth via V9 is configured such that another reset signal line to be formed subsequently is connected to the control electrode of the seventh transistor through the ninth via V9.

(6) Forming a third conductive layer. In an exemplary implementation, forming the pattern of the third conductive layer may include depositing a third conductive thin film on the base substrate on which the aforementioned patterns are formed, patterning the third conductive thin film by using a patterning process to form a third conductive layer arranged on the fourth insulation layer, as shown in FIG. 28 to FIG. 29. FIG. 28 is a schematic diagram of a pattern of a third conductive layer of the display substrate provided in FIG. 8, and FIG. 29 is a schematic diagram of the display substrate provided in FIG. 8 after the pattern of the third conductive layer is formed. In an exemplary implementation mode, the third conductive layer may be referred to as a first source-drain metal (SD1) layer.

In an exemplary implementation mode, as shown in FIGS. 28 and 29, the pattern of the third conductive layer of each sub-pixel may at least include two reset signal lines Reset, a first scanning signal line Gate1 and a second scanning signal line Gate2, a first electrode T23 of the second transistor, a first electrode T43 of the fourth transistor, a first electrode T53 of the fifth transistor, a second electrode T64 of the sixth transistor, a second electrode T74 of the seventh transistor, and a second electrode T84 of the eighth transistor. The first electrode T23 of the second transistor may simultaneously serve as the second electrode T84 of the eighth transistor, the second electrode T64 of the sixth transistor may simultaneously serve as the second electrode T74 of the seventh transistor, and the first electrode T43 of the fourth transistor and the first electrode T53 of the fifth transistor may be separately provided.

In an exemplary implementation mode, as shown in FIGS. 28 and 29, the first electrode T43 of the fourth transistor may be between one of the reset signal lines Reset and the first scanning signal line Gate1. The first electrode T23 of the second transistor (also the second electrode T84 of the eighth transistor), the first electrode T53 of the fifth transistor, and the second electrode T64 of the sixth transistor (also the second electrode T74 of the seventh transistor) may be between the second scanning signal line Gate2 and the other reset signal line Reset. Herein, the first electrode T23 of the second transistor (also the second electrode T84 of the eighth transistor) may be on a side of the first electrode T53 of the fifth transistor close to the second scanning signal line Gate2, and the second electrode T64 of the sixth transistor (also the second electrode T74 of the seventh transistor) may be on a side of the first electrode T53 of the fifth transistor away from the second scanning signal line Gate2. The first scanning signal line Gate1 and the second scanning signal line Gate2 are between the two reset signal lines Reset, and the first scanning signal line Gate1 is on a side of the second scanning signal line Gate2 close to the first electrode T43 of the fourth transistor.

In an exemplary implementation mode, as shown in FIGS. 28 and 29, the reset signal line Reset close to the first scanning signal line Gate1 may include a signal main body portion 22 extending in the first direction X and a signal connection block 23 extending in the second direction Y. The signal connection block 23 is on a side of the signal main body portion 22 close to the first scanning signal line Gate1. An orthographic projection of the signal connection block 23 on the base substrate partially overlaps with an orthographic projection of the fifth via on the base substrate. The reset signal line Reset close to the first scanning signal line is connected to the control electrode of the first transistor through the fifth via.

In an exemplary implementation mode, as shown in FIGS. 28 and 29, the reset signal line Reset close to the second scanning signal line Gate2 may be in a shape of a line extending in the first direction X. An orthographic projection of the reset signal line Reset close to the second scanning signal line Gate2 on the base substrate partially overlaps with an orthographic projection of the ninth via on the base substrate. The reset signal line Reset close to the second scanning signal line Gate2 is connected to the control electrode of the seventh transistor through the ninth via.

In an exemplary implementation mode, as shown in FIGS. 28 and 29, a main body portion of the first scanning signal line Gate1 may be in a shape of a line extending in the first direction X. An orthographic projection of the first scanning signal line Gate1 on the base substrate partially overlaps an orthographic projection of the eighth via on the base substrate. The first scanning signal line Gate1 is connected to the control electrode of the fourth transistor (also the control electrode of the eighth transistor) through the eighth via.

In an exemplary implementation mode, as shown in FIGS. 28 and 29, a main body portion of the second scanning signal line Gate2 may be in a shape of a line extending in the first direction X. An orthographic projection of the second scanning signal line Gate2 on the base substrate partially overlaps with an orthographic projection of the sixth via on the base substrate. The second scanning signal line Gate2 is connected to the control electrode of the second transistor through the sixth via.

In an exemplary implementation mode, as shown in FIGS. 28 and 29, the first electrode T23 of the second transistor (also the second electrode T84 of the eighth transistor) may be in a shape of a line extending in the second direction Y. An orthographic projection of the first electrode T23 of the second transistor (also the second electrode T84 of the eighth transistor) on the base substrate at least partially overlaps with orthographic projections of the first via and the seventh via on the base substrate. The first electrode T23 of the second transistor (also the second electrode T84 of the eighth transistor) is connected to the first region of the active layer of the second transistor (also the second region of the active layer of the eighth transistor) through the first via, and is connected to the first plate of the first capacitor (also the control electrode of the third transistor) through the seventh via.

In an exemplary implementation mode, as shown in FIGS. 28 and 29, the first electrode T43 of the fourth transistor may be in a shape of a block. An orthographic projection of the first electrode T43 of the fourth transistor on the base substrate at least partially overlaps with an orthographic projection of the second via on the base substrate. The first electrode of the fourth transistor is connected to the first region of the active layer of the fourth transistor through the second via.

In an exemplary implementation mode, as shown in FIGS. 28 and 29, the first electrode T53 of the fifth transistor may be in a shape of a "T" with an irregular boundary. An orthographic projection of the first electrode T53 of the fifth transistor on the base substrate may partially overlap with orthographic projections of the third via, the light emitting signal line, the second plate of the first capacitor and the third plate of the second capacitor on the base substrate. The first electrode T53 of the fifth transistor is connected to the first region of the active layer of the fifth transistor through the third via.

In an exemplary implementation mode, as shown in FIGS. 28 and 29, first electrodes T53 of fifth transistors of adjacent sub-pixels located in a same row are connected to each other.

In an exemplary implementation mode, as shown in FIGS. 28 and 29, the second electrode T64 of the sixth transistor (the second electrode T74 of the seventh transistor) may have a structure of a block. An orthographic projection of the second electrode T64 of the sixth transistor (the second electrode T74 of the seventh transistor) on the base substrate may partially overlap with orthographic projections of the fourth via and the light emitting signal line on the base substrate. The second electrode T64 of the sixth transistor (the second electrode T74 of the seventh transistor) is connected to the second region of the active layer of the sixth transistor (also the second region of the active layer of the seventh transistor) through the fourth via.

In an exemplary implementation mode, the two reset signal lines Reset, the first scanning signal line Gate1 and the second scanning signal line Gate2 may be in a design of equal width, or may be in a design of non-equal widths, may be straight lines, or may be bend lines, which may not only facilitate the layout of the pixel structure, but also reduce the parasitic capacitance between the signal lines, which is not here limited in the present disclosure.

(7) A pattern of a fifth insulation layer is formed. In an exemplary implementation mode, forming the pattern of the fifth insulation layer may include depositing a fifth insulation thin film on the base substrate on which the above-mentioned patterns are formed, patterning the fifth insulation thin film using a patterning process to form a fifth insulation layer covering the third conductive layer, and a plurality of vias are provided on the fifth insulation layer, as shown in FIG. 30. FIG. 30 is a schematic diagram of the display substrate provided in FIG. 8 after a pattern of a fifth insulation layer is formed.

In an exemplary implementation mode, as shown in FIG. 30, the plurality of vias of the fifth insulation layer of each sub-pixel at least includes a tenth via V10, an eleventh via V11, and a twelfth via V12.

In an exemplary implementation mode, an orthographic projection of the tenth via V10 on the base substrate is within a range of the orthographic projection of the first electrode of the fourth transistor on the base substrate, the tenth via V10 exposes a surface of the first electrode of the fourth transistor, and the tenth via V10 is configured such that a data signal line to be formed subsequently is connected to the first electrode of the fourth transistor through the tenth via V10.

In an exemplary implementation mode, an orthographic projection of the eleventh via V11 on the base substrate is within a range of the orthographic projection of the first electrode of the fifth transistor on the base substrate, the eleventh via V11 exposes a surface of the first electrode of the fifth transistor, and the eleventh via V11 is configured such that a first power supply line to be formed subsequently is connected to the first electrode of the fifth transistor through the via.

In an exemplary implementation mode, an orthographic projection of the twelfth via V12 on the base substrate is within a range of an orthographic projection of the third plate of the second capacitor on the base substrate, and the third and fourth insulation layers in the twelfth via V12 are etched away to expose a surface of the third plate of the second capacitor. The twelfth via V12 is configured such that the first power supply line to be formed subsequently is connected to the third plate of the second capacitor through the via.

(8) Forming a pattern of a fourth conductive layer, in an exemplary implementation mode, forming the pattern of the fourth conductive layer may include depositing a fourth conductive thin film on the base substrate on which the above-mentioned patterns are formed, and patterning the fourth conductive thin film using a patterning process to form the pattern of the fourth conductive layer, as shown in FIGS. 31 and 32. FIG. 31 is a schematic diagram of a pattern of a fourth conductive layer of the display substrate provided in FIG. 8, and FIG. 32 is a schematic diagram of the display substrate provided in FIG. 8 after the pattern of the fourth conductive layer is formed. In an exemplary implementation mode, the fourth conductive layer may be referred to as a second source-drain metal (SD2) layer.

In an exemplary implementation mode, as shown in FIGS. 31 and 32, the pattern of the fourth conductive layer of each sub-pixel may at least include a first power supply line VDD and a data signal line Data.

In an exemplary implementation mode, as shown in FIGS. 31 and 32, a main body portion of the first power supply line VDD may be in a shape of a line extending in the second direction Y, and an orthographic projection of the first power supply line VDD on the base substrate overlaps with orthographic projections of the eleventh and twelfth vias on the base substrate. The first power supply line VDD is connected to the first electrode of the fifth transistor through the eleventh via and is connected to the third plate of the second capacitor through the twelfth via, so that a power supply signal is written to the first electrode of the fifth transistor and the third plate of the second capacitor. Since the second plate of the first capacitor and the third plate of the second capacitor are connected, signals transmitted by the first electrode of the fifth transistor, the second plate of the first capacitor and the third plate of the second capacitor are all high-voltage power supply signals with a same potential.

In an exemplary implementation mode, as shown in FIGS. 31 and 32, the data signal line Data may be in a shape of a line with a main body portion extending in the second direction Y, and an orthographic projection of the data signal line Data on the base substrate at least partially overlaps with orthographic projections of the tenth via and the capacitor main body portion of the third plate of the second capacitor on the base substrate. The data signal line Data is connected to the first electrode of the fourth transistor through the tenth via. The data signal line Data is disposed in the fourth conductive layer, which can reduce parasitic capacitance between the data signal line Data and a conductive film layer underneath it, thereby reducing the load on the data signal line Data, which is beneficial to saving charging time and saving power consumption.

In an exemplary implementation mode, the data signal line Data and the first power supply line VDD may be in a design of equal width, or may be in a design of non-equal widths, may be straight lines, or may be bend lines, which may not only facilitate the layout of the pixel structure, but also reduce the parasitic capacitance between the signal lines, which is not limited here in the present disclosure. Exemplarily, a width of the first power supply line VDD may be greater than a width of the data signal line Data.

(9) A pattern of a planarization layer is formed. In an exemplary implementation mode, forming the pattern of the planarization layer may include coating a planarization thin film on the base substrate on which the above-mentioned patterns are formed, patterning the planarization thin film using a patterning process to form a planarization layer covering the pattern of the fourth conductive layer.

At this point, the drive circuit layer of the display substrate provided in FIG. 8 is prepared on the base substrate. In a plane parallel to the display substrate, the drive circuit layer may include a plurality of pixel circuits, and the drive circuit layer further includes a first scanning signal line, a second scanning signal line, a light emitting signal line, a first initial signal line, a second initial signal line, a data signal line and a first power supply line connected. In a plane perpendicular to the display substrate, the drive circuit layer may be disposed on the base substrate, which may include a first flexible layer, a block layer, a base substrate conductive layer, and a second flexible layer stacked.

The drive circuit layer may include a shield layer, a first insulation layer, a semiconductor layer, a second insulation layer, a first conductive layer, a third insulation layer, a second conductive layer, a fourth insulation layer, a third conductive layer, a fifth insulation layer, a fourth conductive layer, and a planarization layer sequentially arranged on the base substrate. The shield layer may include a first plate of the second capacitor, the semiconductor layer may at least include active layers of the first transistor to the eighth transistor, a second plate of the second capacitor, the first initial signal line and the second initial signal line. The first conductive layer may at least include the light emitting signal line, control electrodes of the first transistor to the seventh transistor and the first plate of the first capacitor. The second conductive layer may at least include the second plate of the first capacitor, the third plate of the second capacitor. The third conductive layer may at least include the first scanning signal line, the second scanning signal line and the reset signal line. The fourth conductive layer may at least include the data signal line and the first power supply line.

In an exemplary implementation mode, the shield layer, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the above-mentioned metals, such as an Aluminum-Neodymium alloy (AlNd) or a Molybdenum-Niobium alloy (MoNb), which may be in a single-layer structure, or a multilayer composite structure such as Mo/Cu/Mo. The first insulation layer, the second insulation layer, the third insulation layer, the fourth insulation layer, and the fifth insulation layer may be made of any one or more of Silicon Oxide ($SiO_x$), Silicon Nitride ($SiN_x$), and Silicon Oxynitride (SiON), and may be a single layer, a multiple layers, or a composite layer. The first insulation layer may be referred to as a buffer layer, the second insulation layer may be referred to as a gate insulation (GI) layer, the fourth insulation layer may be referred to as an interlayer dielectric (ILD) layer, and the fifth insulation layer may be referred to as a passivation (PVX) layer. The planarization layer may be made of an organic material such as resin.

In an exemplary implementation mode, after preparation of the drive circuit layer is completed, a light emitting structure layer is prepared on the drive circuit layer, and a preparation process of the light emitting structure layer may include following operations.

(10) A pattern of an anode conductive layer is formed. In an exemplary embodiment, forming the pattern of the anode conductive layer may include depositing an anode conductive thin film on the base substrate on which the above-mentioned patterns are formed, patterning the anode conductive thin film using a patterning process to form an anode conductive layer disposed on a second planarization layer, the anode conductive layer includes at least a plurality of anode patterns.

In an exemplary implementation mode, the anode conductive layer may be of a single-layer structure, such as Indium Tin Oxide (ITO) or Indium Zinc Oxide (IZO), or may be of a multi-layer composite structure, such as ITO/Ag/ITO.

(11) A pattern of a pixel definition layer is formed. In an exemplary embodiment, forming the pattern of the pixel definition layer may include coating a pixel definition thin film on the base substrate on which the above-mentioned patterns are formed, patterning the pixel definition thin film using a patterning process to form a pixel definition layer, wherein a pixel opening is provided on the pixel definition layer of each sub-pixel, the pixel definition film in the pixel opening is removed to expose an anode of the sub-pixel where the pixel opening is located.

In an exemplary implementation, a subsequent preparation process may include: forming an organic light emitting layer using an evaporation process and inkjet printing process at first, then forming a cathode on the organic light emitting layer, and then forming an encapsulation structure layer, wherein the encapsulation structure layer may include a first encapsulation layer, a second encapsulation layer and a third encapsulation layer which are stacked, the first encapsulation layer and the third encapsulation layer may be made of an inorganic material, the second encapsulation layer may be made of an organic material, and the second encapsulation layer is disposed between the first encapsulation layer and the third encapsulation layer, which may ensure that external moisture cannot enter the light emitting structure layer.

The display substrate according to the embodiment of the present disclosure may be applied to a display product with any resolution.

An embodiment of the present disclosure further provides a method for driving a pixel circuit, which is configured to drive the pixel circuit, and the method for driving the pixel circuit according to the embodiment of the present disclosure may include the following steps.

Step 100, a node control sub-circuit provides a signal of a first initial signal line or the third node to a first node, provides a signal of the second initial signal line to a fourth node, and provides a signal of a data signal line to a second node under control of a reset signal line, a first scanning signal line and a second scanning signal line.

Step 200, a storage sub-circuit charges the second node when a signal of the first scanning signal line is an effective level signal.

Step 300, a driving sub-circuit provides a drive current to a third node under control of the first node and the second node, and a light emitting control sub-circuit provides a signal of a first power supply line to the second node and a signal of a third node to the fourth node under control of the light emitting signal line.

An embodiment of the present disclosure further provides a display apparatus including a display substrate.

The display substrate is the display substrate according to any of the aforementioned embodiments, and has similar implementation principles and implementation effects, which will not be repeated here.

In an exemplary embodiment, the display apparatus may be any product or component with a display function, such as a liquid crystal panel, electronic paper, an OLED panel, an Active-Matrix Organic Light Emitting Diode (AMOLED for short) panel, a mobile phone, a tablet computer, a television, a display, a notebook computer, a digital photo frame, or a navigator.

In an exemplary implementation mode, the display apparatus further includes: a gate driving circuit. The gate driving circuit includes K+2 cascaded shift registers GOA, where K is a total number of rows of the pixel circuits. The gate driving circuit may be in a non-display region of the display apparatus.

In an exemplary implementation mode, FIG. 33 is a schematic connection diagram of a gate driving circuit. As shown in FIG. 33, a first stage shift register GOA (1) is connected to a reset signal line Reset connected to a first row of pixel circuits R (1), a second stage shift register GOA (2) is respectively connected to a first scanning signal line Gate1 connected to the first row of pixel circuits R (1) and a reset signal line Reset connected to a second row of pixel circuits R (2), an i-th stage shift register GOA(i) is respectively connected to a second scanning signal line Gate2 connected to an (i−2)-th row of pixel circuits R(i−2), a first scanning signal line Gate1 connected to an (i−1)-th row of pixel circuits R(i−1) and the reset signal line Reset connected to an i-th row of pixel circuits R(i), a (K+1)-th stage shift register GOA (K+1) is respectively connected to a second scanning signal line Gate2 connected to a (K−1)-th row of pixel circuits R(K−1) and a first scanning signal line Gate1 connected to a K-th row of pixel circuits, and a (K+2) stage shift register GOA (K+2) is respectively connected to a second scanning signal line Gate2 connected to a K-th row of pixel circuits R (K), i=3, 4, . . . , K. FIG. 33 shows only seven cascaded shift registers, which does not mean that the gate driving circuit includes only seven cascaded shift registers.

In the present disclosure, the gate driving circuit is connected to the reset signal line, the first scanning signal line and the second scanning signal line, which can reduce an area occupied by the circuit in the non-display region and realize a narrow bezel. The present disclosure can effectively realize high-frequency or even ultra-high-frequency display by the structures of the pixel circuit, the display substrate and the driving mode of the gate driving circuit, and through the above pixel circuit and the pixel layout design combined with the driving mode of GOA.

Accompanying drawings of the present disclosure only involve the structures involved in the embodiments of the present disclosure, and other structures may refer to conventional designs.

For the sake of clarity, a thickness and size of a layer or a micro structure are enlarged in the accompanying drawings used for describing the embodiments of the present disclosure. It may be understood that when an element such as a layer, film, region, or substrate is described as being "on" or "under" another element, the element may be "directly" located "on" or "under" the another element, or there may be an intermediate element.

Although the implementations of the present disclosure are disclosed above, the contents are only implementations used for ease of understanding of the present disclosure and not intended to limit the present disclosure. Any of those skilled in the art of the present disclosure can make any modifications and variations in the implementation mode and details without departing from the spirit and scope of the present disclosure. However, the protection scope of the present disclosure should be subject to the scope defined by the appended claims.

The invention claimed is:

1. A pixel circuit configured to drive a light emitting device to emit light, comprising: a node control sub-circuit, a storage sub-circuit, a driving sub-circuit, and a light emitting control sub-circuit;

the node control sub-circuit is electrically connected to a first node, a second node, a third node, a fourth node, a first scanning signal line, a second scanning signal line, a first initial signal line, a second initial signal line, a reset signal line, a data signal line and a first power supply line respectively, and is configured to provide a signal of the first initial signal line or the third node to the first node, provide a signal of the second initial signal line to the fourth node and provide a signal of the data signal line to the second node under control of the reset signal line, the first scanning signal line and the second scanning signal line;

the storage sub-circuit is electrically connected to the second node and the first power supply line respectively, and is configured to charge the second node when a signal of the first scanning signal line is an effective level signal;

the driving sub-circuit is connected to the first node, the second node, and the third node respectively, and is configured to provide a drive current to the third node under control of the first node and the second node;

the light emitting control sub-circuit is electrically connected to a light emitting signal line, the first power supply line, the second node, the third node, and the fourth node respectively, and is configured to provide a signal of the first power supply line to the second node and provide the signal of the third node to the fourth node under control of the light emitting signal line; and a first electrode of the light emitting device is connected to the fourth node, and a second electrode of the light emitting device is connected to a second power supply line, wherein the node control sub-circuit comprises: a first transistor and a second transistor, and, wherein the node control sub-circuit further comprises a first capacitor and the storage sub-circuit comprises a second capacitor, a second plate of the second capacitor comprises: a capacitor main body portion and a first connection block;

the first connection block is connected to the capacitor main body portion, an orthographic projection of the capacitor main body portion on the base substrate at least partially overlaps with an orthographic projection of a first plate of the second capacitor on the base substrate, an orthographic projection of the first connection block on the base substrate partially overlaps with an orthographic projection of an active layer of the second transistor between control electrodes of the second transistor on the base substrate.

2. The pixel circuit according to claim 1, wherein a time period in which a signal of the reset signal line is an effective level signal comprises a first time period and a second time period, and the first time period occurs before the second time period;

a time period in which the signal of the first scanning signal line is an effective level signal comprises a third time period and a fourth time period, and the third time period occurs before the fourth time period;

a time period in which a signal of the second scanning signal line is an effective level signal comprises a fifth time period and a sixth time period, the fifth time period occurs before the sixth time period, the second time period and the third time period at least partially overlap, and the fourth time period and the fifth time period at least partially overlap; and when the signals of the reset signal line, the first scanning signal line and the second scanning signal line are effective level signals, a signal of the light emitting signal line is an ineffective level signal, and when the signal of the light emitting signal line is an effective level signals, the signals of the reset signal line, the first scanning signal line and the second scanning signal line are ineffective level signals.

3. The pixel circuit according to claim 1, wherein the node control sub-circuit comprises: a reset sub-circuit, a write sub-circuit, a compensation sub-circuit, and an energy storage sub-circuit;

the reset sub-circuit is electrically connected to the reset signal line, the first initial signal line, the second initial signal line, the first node and the fourth node respectively, and is configured to provide the signal of the first initial signal line to the first node and provide the signal of the second initial signal line to the fourth node under the control of the reset signal line;

the write sub-circuit is electrically connected to the first scanning signal line, the data signal line, and the second node respectively, and is configured to provide the signal of the data signal line to the second node under control of the first scanning signal line;

the compensation sub-circuit is electrically connected to the second scanning signal line, the first node and the third node respectively, and is configured to provide the signal of the third node to the first node under control of the second scanning signal line; and the energy storage sub-circuit is electrically connected to the first node and the first power supply line respectively, and is configured to store a voltage difference of a signal between the first node and the first power supply line.

4. The pixel circuit according to claim 3, wherein the reset sub-circuit is further connected to the first scanning signal line and is configured to provide the signal of the first initial signal line to the first node and provide the signal of the second initial signal line to the fourth node under control of the reset signal line and the first scanning signal line.

5. The pixel circuit according to claim 4, wherein the reset sub-circuit comprises the first transistor, a seventh transistor, and an eighth transistor, the write sub-circuit comprises a fourth transistor, and the compensation sub-circuit comprises: the second transistor, and the energy storage sub-circuit comprises: the first capacitor;

a control electrode of the first transistor is electrically connected to the reset signal line, a first electrode of the first transistor is electrically connected to the first initial signal line, and a second electrode of the first transistor is electrically connected to a first electrode of the eighth transistor;

a control electrode of the second transistor is electrically connected to the second scanning signal line, a first electrode of the second transistor is electrically connected to the first node, and a second electrode of the second transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the seventh transistor is electrically connected to the reset signal line, a first electrode of the seventh transistor is electrically connected to the second initial signal line, and a second electrode of the seventh transistor is electrically connected to the fourth node;

a control electrode of the eighth transistor is electrically connected to the first scanning signal line, and a second electrode of the eighth transistor is electrically connected to the first node; and one end of the first capacitor is electrically connected to the first node, and the other end of the first capacitor is electrically connected to the first power supply line.

6. The pixel circuit according to claim 3, wherein the reset sub-circuit comprises the first transistor and a seventh transistor, the write sub-circuit comprises a fourth transistor, the compensation sub-circuit comprises: the second transistor, and the energy storage sub-circuit comprises: the first capacitor;

a control electrode of the first transistor is electrically connected to the reset signal line, a first electrode of the first transistor is electrically connected to the first initial signal line, and a second electrode of the first transistor is electrically connected to the first node;

a control electrode of the second transistor is electrically connected to the second scanning signal line, a first electrode of the second transistor is electrically connected to the first node, and a second electrode of the second transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the seventh transistor is electrically connected to the reset signal line, a first electrode of the seventh transistor is electrically connected to the second initial signal line, and a second electrode of the seventh transistor is electrically connected to the fourth node; and one end of the first capacitor is electrically connected to the first power supply line, and the other end of the first capacitor is electrically connected to the first node.

7. The pixel circuit according to claim 1, wherein one end of the second capacitor is electrically connected to the first power supply line, and the other end of the second capacitor is electrically connected to the second node.

8. The pixel circuit according to claim 1, wherein the node control sub-circuit further comprises a fourth transistor and a seventh transistor; the driving sub-circuit comprises a third transistor, and the light emitting control sub-circuit comprises a fifth transistor and a sixth transistor;

a control electrode of the first transistor is electrically connected to the reset signal line, a first electrode of the first transistor is electrically connected to the first initial signal line, and a second electrode of the first transistor is electrically connected to the first node;

a control electrode of the second transistor is electrically connected to the second scanning signal line, a first electrode of the second transistor is electrically connected to the first node, and a second electrode of the second transistor is electrically connected to the third node;

a control electrode of the third transistor is electrically connected to the first node, a first electrode of the third transistor is electrically connected to the second node, and a second electrode of the third transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the fifth transistor is electrically connected to the light emitting signal line, a first electrode of the fifth transistor is electrically connected to the first power supply line, and a second electrode of the fifth transistor is electrically connected to the second node;

a control electrode of the sixth transistor is electrically connected to the light emitting signal line, a first electrode of the sixth transistor is electrically connected to the third node, and a second electrode of the sixth transistor is electrically connected to the fourth node;

a control electrode of the seventh transistor is electrically connected to the reset signal line, a first electrode of the seventh transistor is electrically connected to the second initial signal line, and a second electrode of the seventh transistor is electrically connected to the fourth node;

one end of the first capacitor is electrically connected to the first power supply line, and the other end of the first capacitor is electrically connected to the first node; and one end of the second capacitor is electrically connected to the first power supply line, and the other end of the second capacitor is electrically connected to the second node; or wherein the node control sub-circuit further comprises: a fourth transistor, a seventh transistor, and an eighth transistor;

the driving sub-circuit comprises a third transistor, and the light emitting control sub-circuit comprises a fifth transistor and a sixth transistor;

a control electrode of the first transistor is electrically connected to the reset signal line, a first electrode of the first transistor is electrically connected to the first initial signal line, and a second electrode of the first transistor is electrically connected to a first electrode of the eighth transistor;

a control electrode of the second transistor is electrically connected to the second scanning signal line, a first electrode of the second transistor is electrically connected to the first node, and a second electrode of the second transistor is electrically connected to the third node;

a control electrode of the third transistor is electrically connected to the first node, a first electrode of the third transistor is electrically connected to the second node, and a second electrode of the third transistor is electrically connected to the third node;

a control electrode of the fourth transistor is electrically connected to the first scanning signal line, a first electrode of the fourth transistor is electrically connected to the data signal line, and a second electrode of the fourth transistor is electrically connected to the second node;

a control electrode of the fifth transistor is electrically connected to the light emitting signal line, a first electrode of the fifth transistor is electrically connected to the first power supply line, and a second electrode of the fifth transistor is electrically connected to the second node;

a control electrode of the sixth transistor is electrically connected to the light emitting signal line, a first electrode of the sixth transistor is electrically connected to the third node, and a second electrode of the sixth transistor is electrically connected to the fourth node;

a control electrode of the seventh transistor is electrically connected to the reset signal line, a first electrode of the seventh transistor is electrically connected to the second initial signal line, and a second electrode of the seventh transistor is electrically connected to the fourth node;

a control electrode of the eighth transistor is electrically connected to the first scanning signal line, and a second electrode of the eighth transistor is electrically connected to the first node;

one end of the first capacitor is electrically connected to the first power supply line, and the other end of the first capacitor is electrically connected to the first node; and one end of the second capacitor is electrically connected to the first power supply line, and the other end of the second capacitor is electrically connected to the second node.

9. A display substrate comprising: a base substrate and a drive circuit layer and a light emitting structure layer sequentially disposed on the base substrate, the drive circuit layer comprising the pixel circuits according to claim 1, a plurality of first initial signal lines, a plurality of second initial signal lines, a plurality of first scanning signal lines, a plurality of second scanning signal lines, a plurality of reset signal lines, a plurality of first power supply lines, and a plurality of data signal lines, and the light emitting structure layer comprises a light emitting device.

10. The display substrate according to claim 9, wherein the drive circuit layer comprises: a semiconductor layer, a first insulation layer, a first conductive layer, a second insulation layer, a second conductive layer, a third insulation layer, a third conductive layer, a fourth insulation layer, and a fourth conductive layer that are sequentially stacked on the base substrate, each pixel circuit comprises: a plurality of transistors, the first capacitor and the second capacitor, and each of the first capacitor and the second capacitor comprises a first plate and a second plate;

the semiconductor layer at least comprises active layers of the plurality of transistors and the first plate of the second capacitor;

the first conductive layer at least comprises the reset signal lines, a light emitting signal line, control electrodes of the plurality of transistors, and the first plate of the first capacitor;

the second conductive layer at least comprises the second initial signal lines, the second plate of the first capacitor and the second plate of the second capacitor;

the third conductive layer at least comprises the first scanning signal lines and the second scanning signal lines; and the fourth conductive layer at least comprises the first initial signal lines, the first power supply lines and the data signal lines.

11. The display substrate according to claim 10, wherein the pixel circuit comprises the first transistor to a seventh transistor, and the active layer of each transistor may comprise a first region, a second region, and a channel region between the first region and the second region; and a length of a first region of an active layer of the third transistor in a first direction is greater than a length of a second region of the active layer of the third transistor in the first direction, and the first region of the active layer of the third transistor is also used as the first plate of the second capacitor; or wherein for a same pixel circuit, the second plate of the first capacitor is connected to the second plate of the second capacitor, and a second plate of a second capacitor of a pixel circuit of an N-th column is connected to a second plate of a first capacitor of a pixel circuit of an (N+1)-th column located in a same row; and a length of the second plate of the first capacitor in a second direction is smaller than a length of the second plate of the second capacitor in the second direction, and the first direction intersects with the second direction.

12. The display substrate according to claim 11, wherein the capacitor main body portion extends in the second direction, and the first connection block extends in the first direction, and the second plate of the second capacitor further comprises a second connection block extending in the first direction;

the second connection block is connected to the capacitor main body portion, the first connection block and the second connection block are arranged in parallel and are on a side of the capacitor main body portion away from the second plate of the first capacitor;

an orthographic projection of the second connection block on the base substrate partially overlaps with an orthographic projection of an active layer of the third transistor on the base substrate; and for a same pixel circuit, the second plate of the first capacitor is connected to the capacitor main body portion, and a second connection block of the pixel circuit of the N-th column is connected to the second plate of the first capacitor of the pixel circuit of the (N+1)-th column in the same row.

13. The display substrate according to claim 10, wherein a length of the first power supply lines in the first direction is greater than a length of the data signal lines in the first direction and greater than a length of the first initial signal lines in the first direction, and the length of the first initial signal lines in the first direction is greater than the length of the data signal lines in the first direction.

14. The display substrate according to claim 9, wherein the drive circuit layer comprises: a shield layer, a first insulation layer, a semiconductor layer, a second insulation layer, a first conductive layer, a third insulation layer, a second conductive layer, a fourth insulation layer, a third conductive layer, a fifth insulation layer, and a fourth conductive layer, each pixel circuit comprises: a plurality of transistors, the first capacitor comprising a first plate and a second plate, and the second capacitor comprising the first plate, the second plate, and a third plate;

the shield layer at least comprises the first plate of the second capacitor, the shield layer is configured to transmit a high-voltage power supply signal;

the semiconductor layer at least comprises active layers of the plurality of transistors, the second plate of the second capacitor, the first initial signal lines and the second initial signal lines;

the first conductive layer at least comprises a light emitting signal line, control electrodes of the plurality of transistors and the first plate of the first capacitor;

the second conductive layer at least comprises the second plate of the first capacitor and the third plate of the second capacitor;

the third conductive layer at least comprises two reset signal lines, the first scanning signal lines and the second scanning signal lines;

the fourth conductive layer at least comprises the first power supply lines and the data signal lines.

15. The display substrate according to claim 14, wherein the plurality of transistors comprise: the first transistor to an eighth transistor, and the shield layer further comprises: a first shield structure, a second shield structure, a first shield connection structure, a second shield connection structure, a third shield connection structure, and a fourth shield connection structure, and the first plate of the second capacitor is also used as the second shield structure;

the first shield connection structure and the second shield structure are respectively on opposite sides of the first shield structure and are connected to the first shield structure, the second shield connection structure is on a side of the second shield structure away from the first shield structure and is connected to the second shield structure, the third shield connection structure and the fourth shield connection structure are respectively on the other two opposite sides of the first shield structure, and the third shield connection structure is connected to the second shield structure and the fourth shield connection structure is connected to the first shield structure;

an orthographic projection of the first shield structure on the base substrate at least partially overlaps with an orthographic projection of a channel region of an active layer of the third transistor on the base substrate, an orthographic projection of the second shield structure on the base substrate at least partially overlaps with an orthographic projection of the second plate of the second capacitor on the base substrate, an orthographic projection of the third shield connection structure on the base substrate at least partially overlaps with an orthographic projection of an active layer of the first transistor on the base substrate, and an orthographic projection of the fourth shield connection structure on the base substrate at least partially overlaps with an orthographic projection of an active layer of the seventh transistor on the base substrate.

16. The display substrate according to claim 15, wherein a second shield structure of a sub-pixel of an N-th column is on a side of a first shield structure of the sub-pixel of the N-th column close to a first shield structure of a sub-pixel of an (N+1)-th column in a same row, a first shield connection structure of the sub-pixel of the N-th column is on a side of the first shield structure of the sub-pixel of the N-th column close to a first shield structure of a sub-pixel of an (N−1)-th column in the same row and is connected to a fourth shield connection structure of the sub-pixel of the (N−1)-th column, and a second shield connection structure of the sub-pixel of the N-th column is connected to a first shield connection structure of the sub-pixel of the (N+1)-th column in the same row;

a third shield connection structure of a sub-pixel of an M-th row is on a side of the first shield structure of the sub-pixel of the M-th row close to a first shield structure of a sub-pixel of an (M−1)-th row located in a same column and is connected to the fourth shield connection structure of the sub-pixel of the (M−1)-th row, a fourth shield connection structure of the sub-pixel of the M-th row is on a side of the first shield structure of the sub-pixel of the M-th row close to a first shield structure of a sub-pixel of an (M+1)-th row located in the same column and is connected to a fifth shield connection structure of the sub-pixel of the (M+1)-th row.

17. The display substrate according to claim 14, wherein for a same sub-pixel, the second plate of the first capacitor and the third plate of the second capacitor are connected to each other;

for sub-pixels of a same row, a third plate of a second capacitor of a sub-pixel of an N-th column is located at a second plate of a first capacitor of the sub-pixel of the N-th column close to a second plate of a first capacitor of a sub-pixel of an (N+1)-th column, and is connected to the second plate of the first capacitor of the sub-pixel of the (N+1)-th column; and a length of the second plate of the first capacitor in the second direction is smaller than a length of the third plate of the second capacitor in the second direction.

18. A display apparatus, comprising: the display substrate according to claim 9.

19. The display apparatus according to claim 18, further comprising: a gate driving circuit comprising: K+2 cascaded shift registers, K is a total number of rows of the pixel circuits;

a first stage shift register is connected to a reset signal line connected to a first row of pixel circuits, a second stage shift register is respectively connected to a first scanning signal line connected to the first row of pixel circuits and a reset signal line connected to a second row of pixel circuits, an i-th stage shift register is respectively connected to a second scanning signal line connected to an (i−2)-th row of pixel circuits, a first scanning signal line connected to an (i−1)-th row of pixel circuits and a reset signal line connected to an i-th row of pixel circuits, a (K+1)-th stage shift register is respectively connected to a second scanning signal line connected to a (K−1)-th row of pixel circuits and a first scanning signal line connected to a K-th row of pixel circuits, a (K+2)-th stage shift register is respectively connected to a second scanning signal line connected to the K-th row of pixel circuits, i−3, 4, . . . , K.

20. A method for driving a pixel circuit, configured to drive the pixel circuit according to claim 1, the method comprising:

the node control sub-circuit provides the signal of the first initial signal line or the third node to the first node, provides the signal of the second initial signal line to the fourth node, and provides the signal of the data signal line to the second node under control of the reset signal line, the first scanning signal line and the second scanning signal line;

the storage sub-circuit charges the second node when a signal of the first scanning signal line is an effective level signal;

the driving sub-circuit provides the drive current to the third node under control of the first node and the second node; and the light emitting control sub-circuit provides the signal of the first power supply line to the second node and the signal of the third node to the fourth node under control of the light emitting signal line.

* * * * *